United States Patent [19]
Saitoh et al.

[11] Patent Number: 5,527,396
[45] Date of Patent: Jun. 18, 1996

[54] DEPOSITED FILM FORMING APPARATUS

[75] Inventors: Keishi Saitoh; Tatsuyuki Aoike; Masafumi Sano; Mitsuyuki Niwa; Jinsho Matsuyama; Toshimitsu Kariya; Yuzou Kouda; Ryou Hayashi, all of Nagahama; Masahiko Tonogaki, Tokyo, all of Japan

[73] Assignee: Canon Kabushiki Kaisha, Tokyo, Japan

[21] Appl. No.: 398,071

[22] Filed: Mar. 3, 1995

Related U.S. Application Data

[62] Division of Ser. No. 81,222, Jun. 25, 1993, Pat. No. 5,417,770.

[30] Foreign Application Priority Data

Jun. 30, 1992 [JP] Japan ................... 4-196047

[51] Int. Cl.$^6$ .................................. C23C 16/00
[52] U.S. Cl. ................... 118/723 MP; 118/718; 118/723 MW; 118/723 E; 156/345; 204/295.38
[58] Field of Search ................. 118/718, 723 MP, 118/723 ME, 723 M, 723 E, 723 ER; 156/345; 204/298.38, 298.29; 315/111.21; 313/231.31

[56] References Cited

U.S. PATENT DOCUMENTS

| | | | |
|---|---|---|---|
| 4,064,521 | 12/1977 | Carlson | 357/2 |
| 4,400,409 | 8/1983 | Izu et al. | 427/39 |
| 4,438,723 | 3/1984 | Carnella et al. | 118/718 |
| 4,626,449 | 12/1986 | Hirai et al. | 427/53.1 |
| 4,645,684 | 2/1987 | Osada et al. | 427/38 |
| 4,663,829 | 5/1987 | Hartman et al. | 118/723 MW |
| 4,801,474 | 1/1989 | Saitoh et al. | 427/248 |
| 4,812,328 | 3/1989 | Saitoh et al. | 427/69 |
| 4,822,636 | 4/1989 | Saitoh et al. | 427/69 |
| 4,834,023 | 5/1989 | Saitoh et al. | 118/730 |
| 4,844,950 | 7/1989 | Saitoh et al. | 427/250 |
| 4,865,883 | 9/1989 | Saitoh et al. | 427/255.3 |
| 4,873,125 | 10/1989 | Matsuyama et al. | 427/248.1 |
| 4,891,095 | 1/1990 | Ishida et al. | 156/643 |
| 4,897,284 | 1/1990 | Arai et al. | 427/39 |
| 4,921,722 | 5/1990 | Osada et al. | 427/39 |

(List continued on next page.)

FOREIGN PATENT DOCUMENTS

| | | | |
|---|---|---|---|
| 0359264 | 3/1990 | European Pat. Off. | 118/723 MP |
| 59-16328 | 1/1984 | Japan | H01L 21/205 |
| 59-56724 | 4/1984 | Japan | H01L 21/205 |
| 62-131513 | 6/1987 | Japan | 136/258 |
| 3240947 | 2/1990 | Japan | 118/723 MP |
| 403191074 | 8/1991 | Japan | 118/723 MP |

OTHER PUBLICATIONS

Japanese Journal of Applied Physics, vol. 26, No. 8, Aug. 1987, T. Watanabe et al., "Microwave–Excited Plasma CVD of a–Si:H Films Utilizing a Hydrogen Plasma Stream or by Direct Excitation of Silane".

Japanese Journal of Applied Physics, vol. 26, No. 4, Apr. 1987, T. Watanabe et al., "Chemical Vapor Deposition of a–SiGe:H Films Utilizing a Microwave–Excited Plasma".

Applied Physics Letters, vol. 47, No. 10, Nov. 15, 1985, A. Matsuda et al., "Preparation of Highly Photosensitive Hydrogenated Amorphous Si–Ge Alloys Using a Triode Plasma Reactor".

Primary Examiner—R. Bruce Breneman
Assistant Examiner—Joni Y. Chang
Attorney, Agent, or Firm—Fitzpatrick Cella Harper & Scinto

[57] ABSTRACT

A method of quickly depositing a non-single-crystal semiconductor film and forming a silicon-type non-single-crystal photovoltaic device, and a method of continuously manufacturing the photovoltaic devices. By this method the deposited film is formed by decomposing a raw material gas with microwave energy which is lower than the microwave energy required to completely decompose the raw material gas. RF energy is applied at the same time which is higher in energy than the microwave energy. The microwave energy acts on the raw material gas at an internal pressure level of 50 mTorr or lower to form a uniform non-single-crystal semiconductor film with excellent electrical characteristics and reduced light deterioration.

4 Claims, 29 Drawing Sheets

U.S. PATENT DOCUMENTS

| | | | |
|---|---|---|---|
| 4,930,442 | 6/1990 | Iida et al. | 118/723 |
| 4,985,109 | 1/1991 | Otsubo et al. | 156/345 |
| 5,002,617 | 3/1991 | Kanai et al. | 136/258 |
| 5,002,618 | 3/1991 | Kanai et al. | 136/258 |
| 5,006,180 | 4/1991 | Kanai et al. | 136/258 |
| 5,007,971 | 4/1991 | Kanai et al. | 136/258 |
| 5,016,565 | 5/1991 | Saitoh et al. | 118/723 |
| 5,024,706 | 6/1991 | Kanai et al. | 136/258 |
| 5,134,965 | 8/1992 | Tokuda et al. | 118/723 MW |
| 5,173,641 | 12/1992 | Imahashi et al. | 315/111.41 |
| 5,204,273 | 4/1993 | Guha et al. | 437/4 |
| 5,256,576 | 10/1993 | Guha et al. | 437/4 |
| 5,279,681 | 1/1994 | Matsuda et al. | 136/255 |
| 5,292,370 | 3/1994 | Tsai et al. | 118/723 MP |

FIG. 12A
FIG. 12B
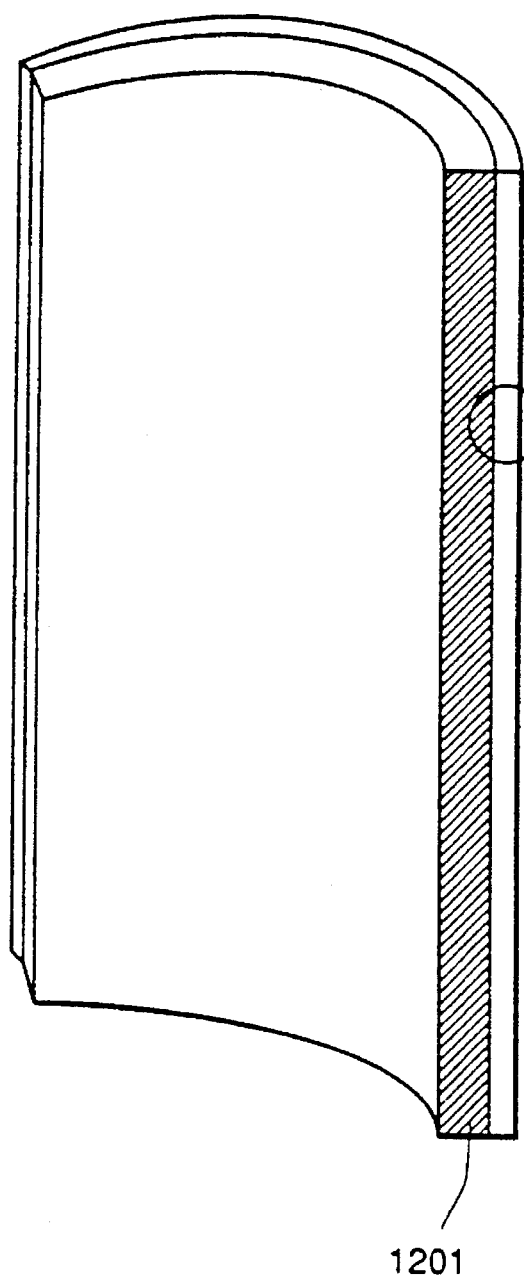
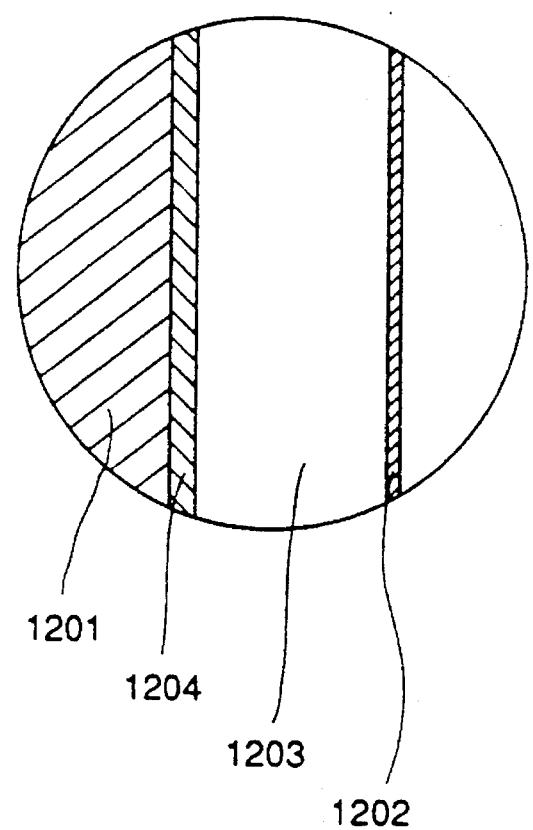

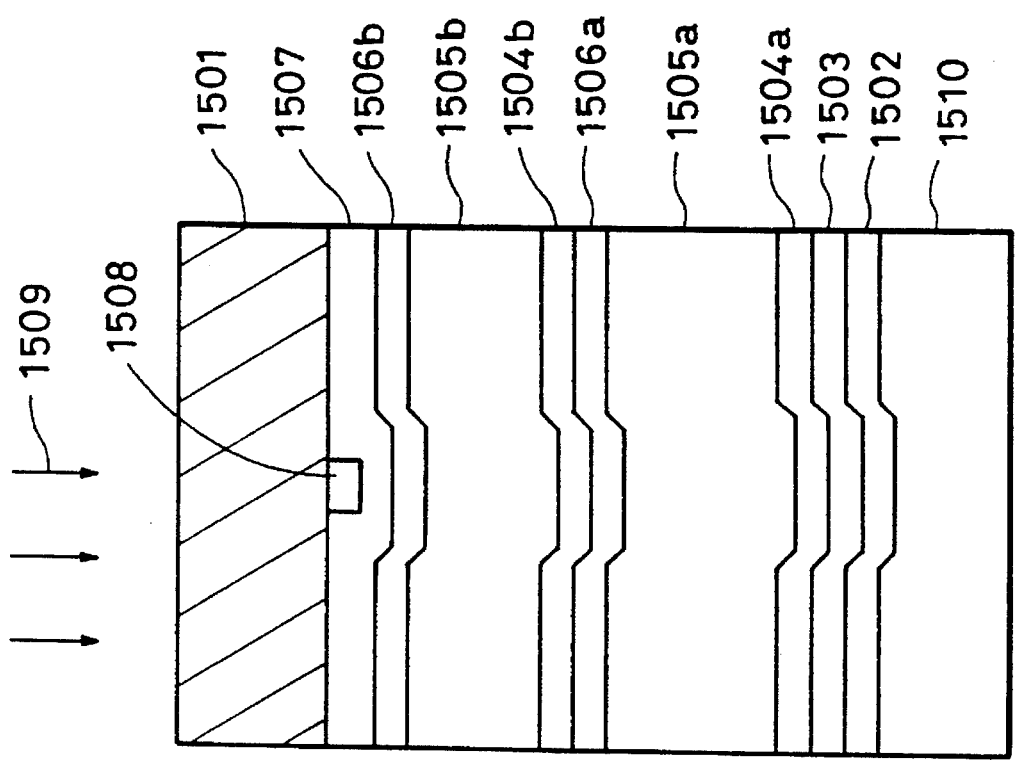
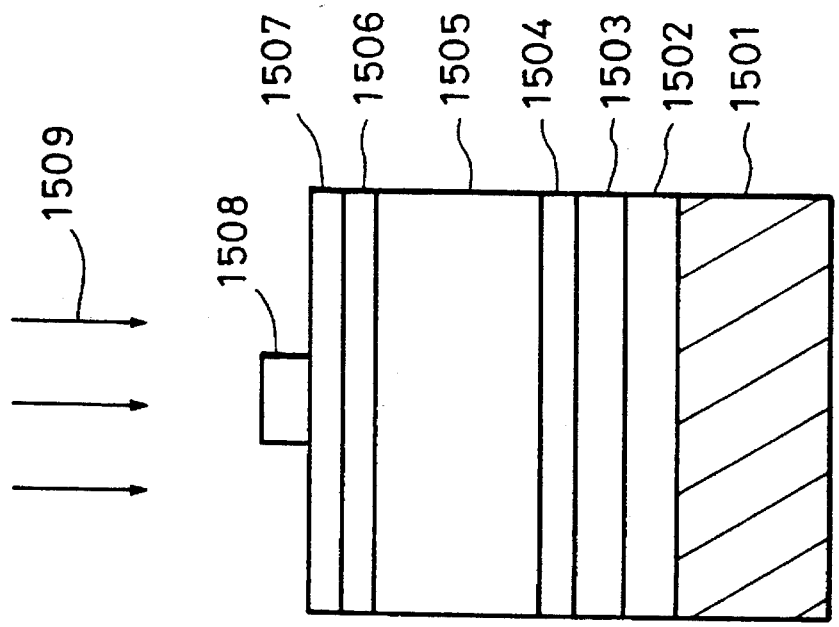

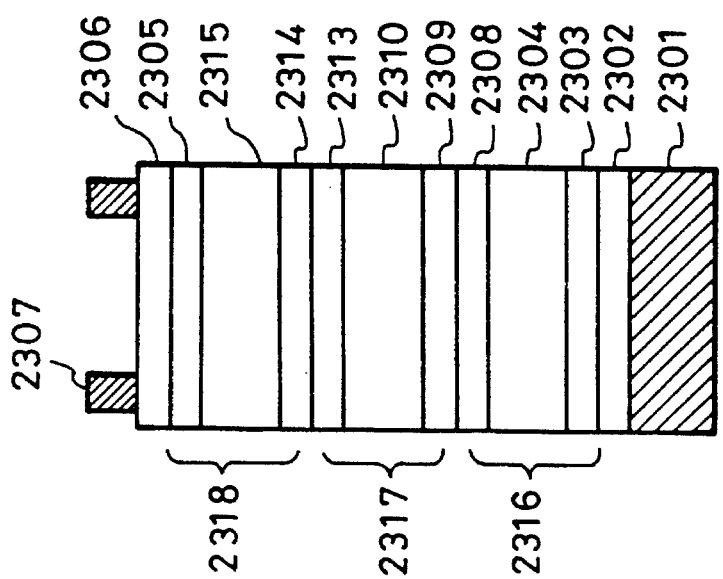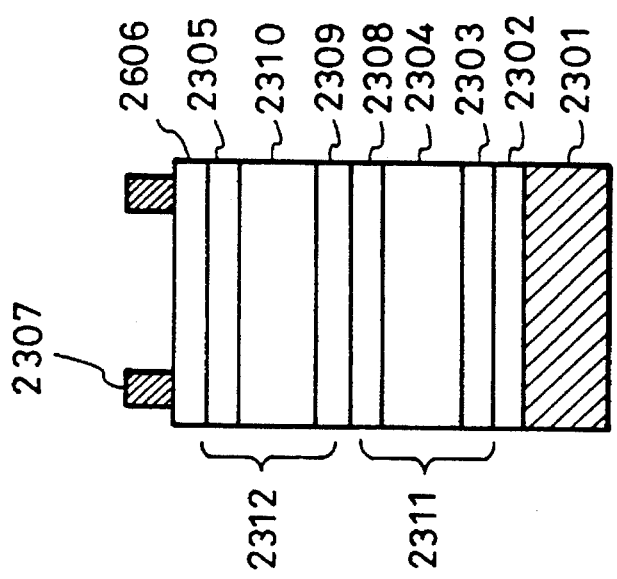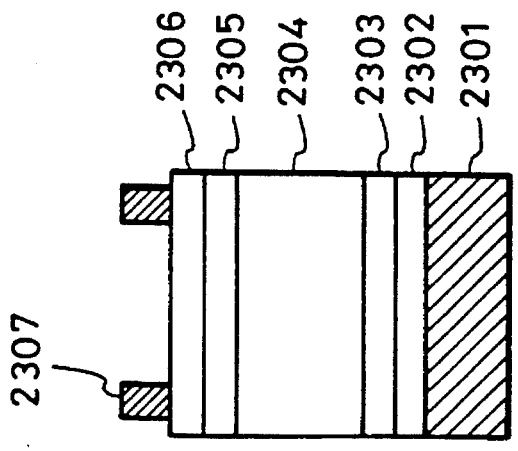

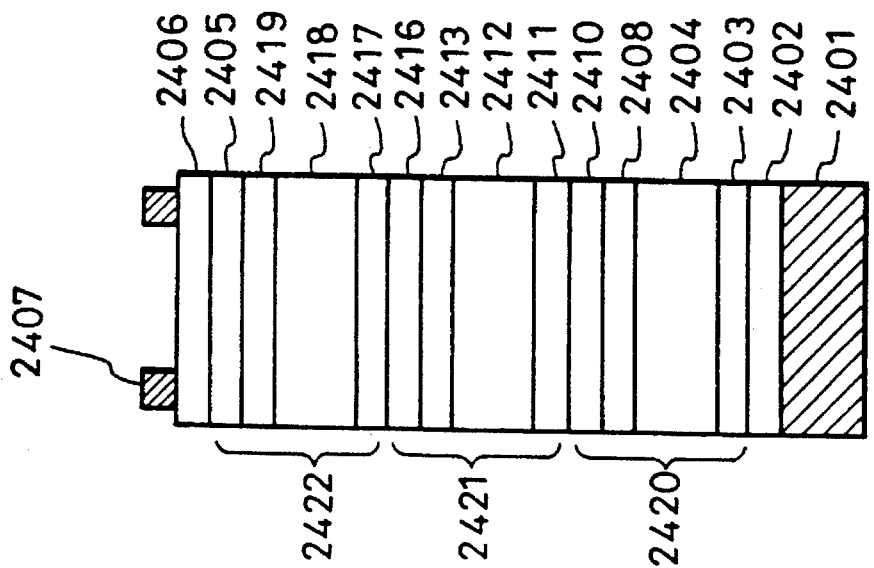
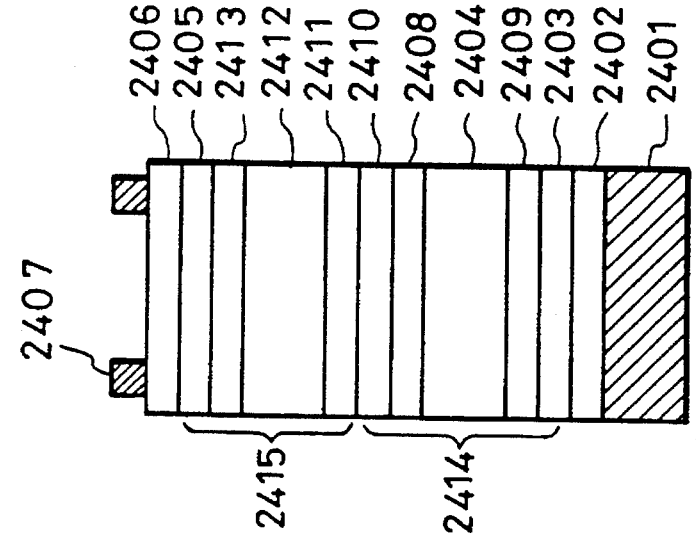
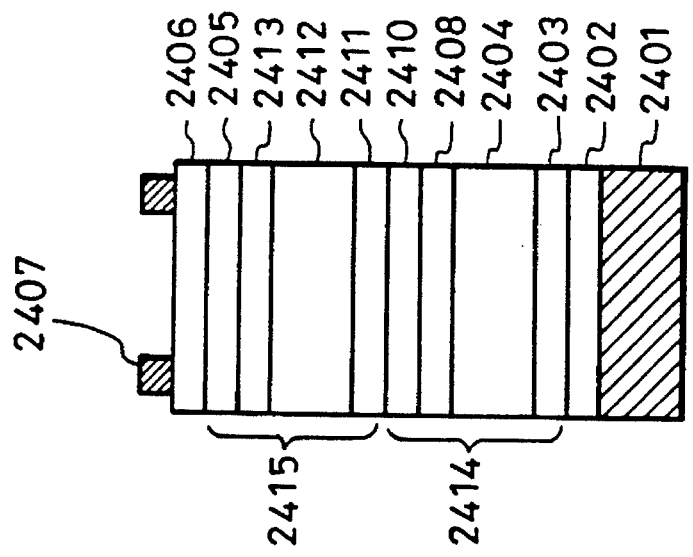

DEPOSITED FILM FORMING APPARATUS

This application is a division of application Ser. No. 08/081,222 filed Jun. 25, 1993, now U.S. Pat. No. 5,417,770.

BACKGROUND OF THE INVENTION

1. Field of the Invention

The present invention relates to a method of forming a deposited film, and more particularly to a method of forming a deposited film by a microwave plasma CVD method in which raw material gas is decomposed by microwave energy to form the deposited film on a substrate. The method for forming the deposited film according to the present invention is preferably employed to form a thin film semiconductor such as a photovoltaic device, a thin film transistor (TFT), a sensor, and a photoreceptor for electrophotography.

The present invention relates to a photovoltaic device, and more particularly to a photovoltaic device that uses non-single-crystal silicon material.

The present invention relates to a method of continuously manufacturing photovoltaic devices such as solar cells, and more particularly to a method of mass-producing photovoltaic devices such as non-single-crystal silicon solar cells.

2. Related Background Art

Development and research of an application of a non-single-crystal silicone semiconductor material, for example, amorphous silicon (a-Si:H), to a photovoltaic device, which is a thin film semiconductor device, have been commenced in view of an invention of the photovoltaic device by D. E. Carlson (U.S. Pat. No. 4,064,521) based on the success in doping of a-Si:H by W. E. Spear and P. G. Le Comber (Solid State Communications, Vol. 17, pp. 1193 to 1196, 1975).

Recently, a photovoltaic device using a-Si:H has been put into practical use as a main power source or a subpower source for devices that use relatively small amounts of electric power such as clocks, small computers, and streetlights.

If a-Si:H deposited at a relative slow deposition speed (2 nm/sec or lower) by an RF plasma CVD method, which is a typical conventional film forming method, is used to form the i-layer of a photovoltaic device, the photovoltaic device has excellent characteristics. However, an increase in the deposition speed (2 nm/sec or higher) will cause excessive deterioration of the characteristics.

Therefore, in the case where a large amount of electric power is consumed, for example, in the case where an a-Si:H photovoltaic device is used for generating electricity, it must have more improved photoelectric conversion efficiency. Further, the light deterioration must be prevented. In order to further reduce the cost, technology is required that raises the deposition speed while maintaining the characteristics of the a-Si:H film and that is able to form a film over a large area with a high output.

A multiplicity of reports have been made about the deposition film forming method adapted to employ the microwave plasma CVD method.

For example, a microwave plasma CVD method making use of an ECR has been disclosed in "Chemical vapor deposition of a-SiGe:H films utilizing a microwave-excited plasma" T. Watanabe, M. Tanaka, K. Azuma, M. Nakatani, T. Sonobe, T. Simada, Japanese J. Appl. Phys., Vol. 26, No. 4, April 1987, pp. L288–L290; and "Microwave-excited plasma CVD of a-Si:H films utilizing a hydrogen plasma stream or by direct excitation of silane" T. Watanabe, M. Tanaka, K. Azuma, M. Nakatani, T. Sonobe, T. Simada, Japanese J. Appl. Phys., Vol. 26, No. 8, August, 1987, pp. 1215–218.

Japanese Patent Laid-Open No. 59-16328 "PLASMA VAPOR-PHASE REACTION APPARATUS" has disclosed a method of depositing a semiconductor film by a microwave plasma CVD method. Japanese Patent Publication No. 59-56724 "METHOD OF FORMING THIN FILM UTILIZING MICROWAVE PLASMA" has also disclosed a method of depositing a semiconductor film by a microwave plasma CVD method.

A method adapted to utilize the RF plasma CVD method and having an arrangement such that a mesh-like third electrode is formed between the anode and the cathode has been disclosed in "Preparation of highly photosensitive hydrogenated amorphous Si—Ge alloys using a triode plasma reactor" A. M. Atsuda, et al., Applied Physics Letters, Vol. 47, No. 10, 15 Nov., 1985, pp. 1061–1063.

In the conventional method of forming a deposited film adapted to the microwave plasma CVD method, insufficient deposition speed, unsatisfactory electric characteristics and excessive deterioration occur if it is used while being irradiated with light for a long time, as for example, when a non-single-crystal semiconductor film (an amorphous silicon a-Si:H, for example) is deposited. In particular, the foregoing problems of the electrical characteristics of the semiconductor film, contact with substrate, and the light deterioration are critical if the deposition speed is raised.

In the conventional method of forming a deposited film adapted to the microwave plasma CVD method, the plasma cannot easily be made uniform. That is, the thickness and the characteristics of the formed deposited film cannot easily be made uniform, and accordingly, the characteristics and the yield of the solar cell, the thin-film transistor, and the light receiving member for electrophotography deteriorate.

In the conventional method of forming a deposited film adapted to the microwave plasma CVD method, the plasma is unstable in a region in which the quantity of the raw material gas for forming the deposited film is insufficient.

In order to produce a photovoltaic device which meets the demand for electricity, the photovoltaic device must basically exhibit satisfactory photoelectric conversion efficiency and excellent stability of the characteristics. Furthermore, mass production of the photovoltaic devices must be enabled. In order to meet this, the manufactured photovoltaic device using the a-Si film or the like must have improved electric, optical, photoconductive, or mechanical characteristics and fatigue resistance or environmental resistance characteristics. Furthermore, the photovoltaic device must be enabled to be formed over a large area and must exhibit uniform film thickness and quality of the film. Furthermore, mass production must be enabled by forming the film at high speed while maintaining reproducibility.

The system for generating electricity using the photovoltaic device usually has an arrangement that unit modules are connected in series or in parallel to form an array so that a desired electric current or voltage level is obtained. Therefore, each module must be free from disconnection and short circuit. Further, the output voltage and output current must be uniform between modules. Therefore, the uniformity of the characteristics of the semiconductor layer, which is the most important factor determining the characteristics, must be maintained at least in the process for manufacturing the unit module. From the viewpoint of easily designing the module and simplifying the module assembling process, a semiconductor deposited film which can be formed over a large area and which exhibits excellent uniformity of the characteristics must be provided in order to improve the mass-production facility of the photovoltaic devices and to significantly reduce the manufacturing cost.

The photovoltaic device comprises the semiconductor layers, which are the important components thereof, the semiconductor layers being connected by a so-called pn junction or pin junction. In a case where the thin film semiconductor is made of a-Si for example, phosphine ($PH_3$) or diborane ($B_2H_6$) gas and serving as a dopant is mixed with silane serving as the main raw material gas to perform glow discharge decomposition.

As a result, semiconductor films having a desired conductivity type can be obtained, the semiconductor films being then sequentially stacked on a desired substrate. Therefore, the semiconductor junction can easily be realized. Accordingly, a method for manufacturing the a-Si type photovoltaic device has been suggested which has an arrangement such that independent film forming chambers are provided for the corresponding semiconductor films and the semiconductor layers are individually formed in the film forming chambers.

U.S. Pat. No. 4,400,409 has disclosed a continuous plasma CVD apparatus adapted to a roll-to-roll method. The apparatus comprises a plurality of glow discharge regions and has an arrangement such that a flexible substrate having a desired width and a sufficient length is disposed in a passage sequentially passing through the glow discharge regions. By continuously conveying the substrate in its longitudinal direction while forming a semiconductor layer having a desired conductivity type in the glow discharge region, the devices having the semiconductor junction can be manufactured continuously. In each of the deposition regions, dispersion and undesirable mixture of the dopant gas for use at the time of manufacturing the semiconductor layers into the other glow discharge regions are prevented by using a gas gate. Specifically, the glow discharge regions are separated from each other by slit-like separation passages. Furthermore, a means for creating a flow of scavenging gas, for example Ar or $H_2$, is employed in the separation passage.

Although the roll-to-roll method is suitable to mass-produce the semiconductor devices as described above, the photovoltaic devices must be further improved in photoelectric conversion efficiency, the stability and uniformity of the characteristics and by reducing the manufacturing cost.

In order to improve the photoelectric conversion efficiency and stability of the characteristics, the photoelectric conversion efficiency and the deterioration ratio of the characteristics of each unit module must, of course, be improved by 0.1% units (corresponding to a ratio of about 1.01 times). Further, the unit module having the minimum current or the voltage characteristics in the unit module constituting the unit serves as a speed determining factor in the case where the unit modules are connected in series or in parallel to constitute an array. Therefore, it is very important to reduce scattering of the characteristics as well as improving the average characteristics of the unit module. Therefore, there is a need to maintain the uniformity of the characteristics of the semiconductor layer which are the most important character determining factors in this stage of manufacturing the unit module. In order to reduce the manufacturing cost, there is a need to improve the manufacturing yield by decreasing the number of defects occurring in the semiconductor layer for the purpose of preventing disconnection and short circuit.

Therefore, to attain this, the semiconductor layer must be deposited on an elongated member which is continuously moving, and by an improved film-forming method by which the uniformity of the characteristics can be realized and the defects can be decreased.

SUMMARY OF THE INVENTION

An object of the present invention is to overcome the foregoing problems.

Another object of the present invention is to provide a method of depositing a non-single-crystal semiconductor film which has excellent electrical characteristics and which is capable of preventing light deterioration even if the deposition speed is raised to several nm/sec or higher.

Another object of the present invention is to provide a film-forming method which is capable of stabilizing the plasma even in a region in which the quantity of the raw material gas for forming a film is not sufficiently large.

Another object of the present invention is to provide a film-forming method which is capable of improving the uniformity and the stability of the plasma to prevent irregularity of the film thickness and characteristics of the deposited film, thereby causing the device characteristics and the yield of photovoltaic devices, thin film transistors, sensors, and light receiving members for electrophotography to be improved and to reduce the manufacturing cost.

Another object of the present invention is to provide a silicon single-crystal semiconductor photovoltaic device having further improved quality and to provide a silicon single-crystal semiconductor photovoltaic device, the cost of which, can be reduced significantly.

Another object of the present invention is to provide a continuous manufacturing method for manufacturing photovoltaic devices which exhibits excellent operational facility and satisfactory reproducibility for the purpose of mass-producing photovoltaic devices on an elongated member, which is continuously moving, over a large area while exhibiting excellent quality and satisfactory uniformity and having a small number of defects.

According to one aspect of the present invention, there is provided a method of forming a deposited film by decomposing a raw material gas for said film with microwave energy, thereby forming a deposited film on a substrate. The method comprises the steps of: selecting the raw material gas; disposing the substrate in a deposition chamber; generating microwave energy which is lower in energy than that required to completely decompose said raw material gas; setting the internal pressure at a level of 50 mTorr or lower; generating RF energy which has a higher energy than said microwave energy, causing said microwave energy, which is lower than that required to completely decompose said raw material gas, to act on said raw material gas at the internal pressure level of 50 mTorr or lower; causing said RF energy, which is higher in energy than said microwave energy, to act on said raw material gas; and, thereby forming said deposited film on the substrate.

According to another aspect of the present invention, there is provided a method of forming a deposited film, wherein a conductive mesh is interposed between a space, in which the raw material gas is mainly decomposed by the microwave energy, and the substrate, and the mesh is caused to have the same potential as that of the substrate.

According to another aspect of the present invention, there is provided a photovoltaic device comprising: a p-type layer, an i-type layer, and an n-type layer made of silicon non-single-crystal semiconductor material, wherein at least the p-type layer or the n-type layer is deposited from a raw material gas at a deposition chamber pressure of 0.5 Torr or higher by a RF plasma CVD method, the i-type layer is deposited from a raw material gas at a deposition chamber pressure of 10 mTorr or lower by a microwave plasma CVD method, and the content of hydrogen sequentially increases in the order of the p-type layer, the n-type layer, and the i-type layer.

According to another aspect of the present invention, there is provided a photovoltaic device comprising: a p-type layer, an i-type layer, and an n-type layer made of silicon non-single-crystal semiconductor material, wherein the i-type layer is deposited from a raw material gas at a deposition chamber pressure of 10 mTorr or lower by a microwave plasma CVD method, an i-type interfacial layer is, by a RF plasma CVD method, formed in the interface between the i-type layer and the p-type layer and/or the interface between the i-type layer and the n-type layer, and the i-type layer deposited by the microwave plasma CVD method contains hydrogen in a quantity larger than that contained in the i-type interface layer deposited by the RF plasma CVD method.

According to another aspect of the present invention, there is provided a method of continuously manufacturing photovoltaic devices, comprising the steps of: forming a first-conductivity type non-single crystal layer containing Si atoms by high frequency glow discharge in one of a plurality of film-forming spaces at a pressure of at least 100 mTorr; forming an i-type non-single-crystal layer containing Si atoms by microwave glow discharge in one of a plurality of film-forming spaces at a pressure of no more than 50 mTorr, while applying a voltage bias; forming a second-conductivity type non-single crystal layer by high frequency glow discharge in one of a plurality of film-forming spaces at a pressure of at least 100 mTorr; causing an elongated member to sequentially pass through the plurality of film-forming spaces; continuously moving said elongated member in a longitudinal direction thereof to sequentially stack on said elongated member, said first-conductivity-type non-single crystal layer, said i-type non-single-crystal layer and said second-conductivity-type non-single crystal layer.

According to another aspect of the present invention, there is provided a method of continuously manufacturing photovoltaic devices, wherein an i-type non-single-crystal interface layer containing Si atoms is formed between the i-type non-single-crystal layer and the first and/or second conductivity type non-single crystal layer at a pressure higher than 100 mTorr by a high frequency glow discharge method.

Further objects, features and advantages of the invention will be more fully apparent from the below described description.

BRIEF DESCRIPTION OF THE DRAWINGS

FIG. 12 is a schematic view which illustrates the structure of an electrophotographic photosensitive member;

FIGS. 15A and 15B are schematic views which illustrate another example of the photovoltaic device according to the present invention;

FIG. 23A to 23C are schematic views which illustrate the structure of layers in a photovoltaic device manufactured by the continuous manufacturing method according to the present invention;

FIGS. 24A to 24F are schematic views which illustrate the structure of layers in a photovoltaic device manufactured by the continuous manufacturing method according to the present invention;

DESCRIPTION OF THE PREFERRED EMBODIMENTS

Figure 1A:
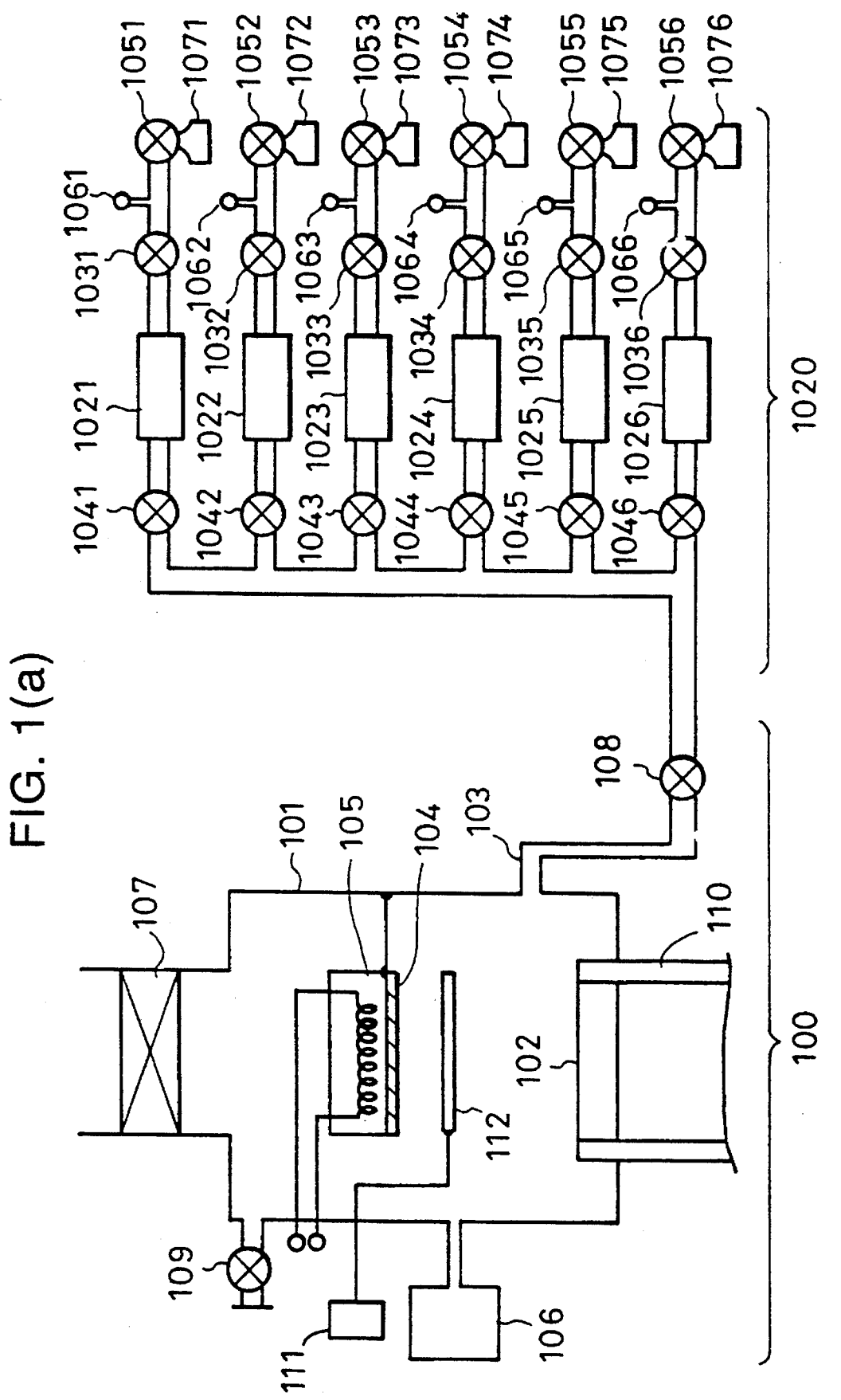
FIGS. 1A and 1B are schematic views which illustrate an example of a deposited film manufacturing apparatus adapted to the film forming method according to the present invention.

According to one aspect of the present invention, there is provided a method of forming a deposited film by decomposing a raw material gas with microwave energy to form said film on a substrate, the method comprising the steps of: causing microwave energy, which is lower in energy than that required to completely decompose the raw material gas, to act on the raw material gas at a chamber pressure level of 50 mTorr or lower; and causing RF energy, which is higher in energy than the microwave energy, to act on the raw material gas.

According to another aspect of the present invention, there is provided a method of forming a deposited film, wherein a conductive mesh is interposed between a space, in which the raw material gas is mainly decomposed by the microwave energy, and the substrate, and the mesh is caused to have the same potential as that of the substrate.

According to another aspect of the present invention, there is provided a photovoltaic device comprising: a p-type layer, an i-type layer, and a p-type layer made of silicon non-single-crystal semiconductor material wherein at least the p-type layer or the n-type layer is deposited from a raw material gas at a deposition chamber pressure of 0.5 Torr or higher by a RF plasma CVD method, the i-type layer is deposited from a raw material gas at a deposition chamber pressure of 10 mTorr or lower by a microwave plasma CVD method, and the content of hydrogen sequentially increases in the order of the p-type layer, the n-type layer, and the i-type layer.

According to another aspect of the present invention, there is provided a photovoltaic device comprising: a p-type layer, an i-type layer, and a p-type layer made of silicon non-single-crystal semiconductor material, wherein the i-type layer is deposited from a raw material gas at a deposition chamber pressure of 10 mTorr or lower by a microwave plasma CVD method, an i-type interfacial layer is, by a RF plasma CVD method, formed in the interface between the i-type layer and the p-type layer and/or the interface between the i-type layer and the n-type layer, and the i-type layer deposited by the microwave plasma CVD method contains hydrogen in a quantity larger than that contained in the i-type interface layer deposited by the RF plasma CVD method.

According to another aspect of the present invention, there is provided a method of continuously manufacturing photovoltaic devices, comprising the steps of: causing an elongated member to sequentially pass through a plurality of spaces for forming a photovoltaic device while continuously moving the elongated member in a longitudinal direction thereof to sequentially stack, on the elongated member, a first-conductivity-type non-single crystal layer containing Si atoms and formed by high frequency glow discharge, an i-type non-single-crystal layer containing Si atoms formed by microwave glow discharge, and a second-conductivity-type non-single crystal layer containing Si atoms and formed by high frequency glow discharge, wherein the first and second-conductivity-type non-single-crystal layers are formed at a pressure of the film forming space higher than 100 mTorr, and the i-type non-single-crystal layer is formed at a pressure of the film forming space lower than 50 mTorr while applying a voltage bias.

According to another aspect of the present invention, there is provided a method of continuously manufacturing photovoltaic devices, wherein an i-type and non-single-crystal interface layer containing Si atoms is formed between the i-type non-single crystal layer and the first and/or second conductivity type non-single crystal layer at a pressure of the film forming space higher than 100 mTorr by a high frequency glow discharge method.

The film deposition mechanism in the method according to the present invention can be considered as follows although its details have not been clarified as yet.

The activating source suitable to form the deposited film must be capable of (1) generating microwave energy, which is of lower energy than that required to completely decompose the raw material, to act upon the raw material gas and (2) generating RF energy, which is of higher energy than the microwave energy, to also act on the raw material gas.

Vaporizing reaction can be prevented significantly because the average time for the activating source to form an excellent deposited film is sufficiently long if the internal pressure of the deposition chamber is 50 mTorr or lower at the time of decomposing the raw material gas. It is noted that if the internal pressure of the deposition chamber is 50 mTorr or lower, the RF energy does not considerably affect the decomposition of the raw material gas, but it controls the potential between the plasma and the substrate in the deposition chamber. Although the microwave plasma CVD method exhibits a slight difference in the potential between the plasma and the substrate, the difference in the potential between the plasma and the substrate (it is negative in the plasma while positive in the substrate) can be enlarged by simultaneously supplying the RF energy and the microwave energy. The fact that the plasma potential is positive and higher than the substrate causes the activating raw material source gas decomposed with the microwave energy to be deposited on the substrate. Simultaneously, positive ions accelerated by the plasma potential collide on the substrate to enhance the redistribution processes on the surface of the substrate, and an excellent deposited film can therefore be obtained. If the deposition speed is several mm/sec or higher, the foregoing effect is enhanced.

By providing a conductive mesh in the upper portion of the substrate and by making the potential of the conductive mesh the same as that of the substrate, the RF energy is caused to control the potential between the plasma and the mesh in the deposition chamber. From the activating raw material source gas decomposed with the microwave energy, positive ions accelerated by the plasma potential mainly pass through the mesh, and thereafter collide with the substrate. As a result, the redistribution processes on the surface of the substrate are enhanced so that an excellent deposited film is obtained. The presence of the mesh at this time effectively prevents unnecessary ions and electrons, that damage the deposited film, from within the substrate. By previously optimizing the distance from the substrate to the mesh, a deposited film having the desired quality can easily be obtained.

Since the RF has a frequency higher than DC, the distributions of ionized ions and electrons determine the difference between the potential of the plasma and that of the substrate. That is, the synergy of the ions and the electrons determines the potential difference between the substrate and the plasma. Therefore, another effect can be obtained so that a spark cannot easily occur in the deposition chamber.

As a result, stable glow discharge can be maintained for more than 10 hours. Even if a spark occurs, the presence of the mesh prevents undesirable direct influence of the spark upon the substrate because the potential of the mesh is made to be the same as that of the substrate.

The method of forming the deposited film according to the present invention will now be described with reference to the drawings.

Figure 1B:
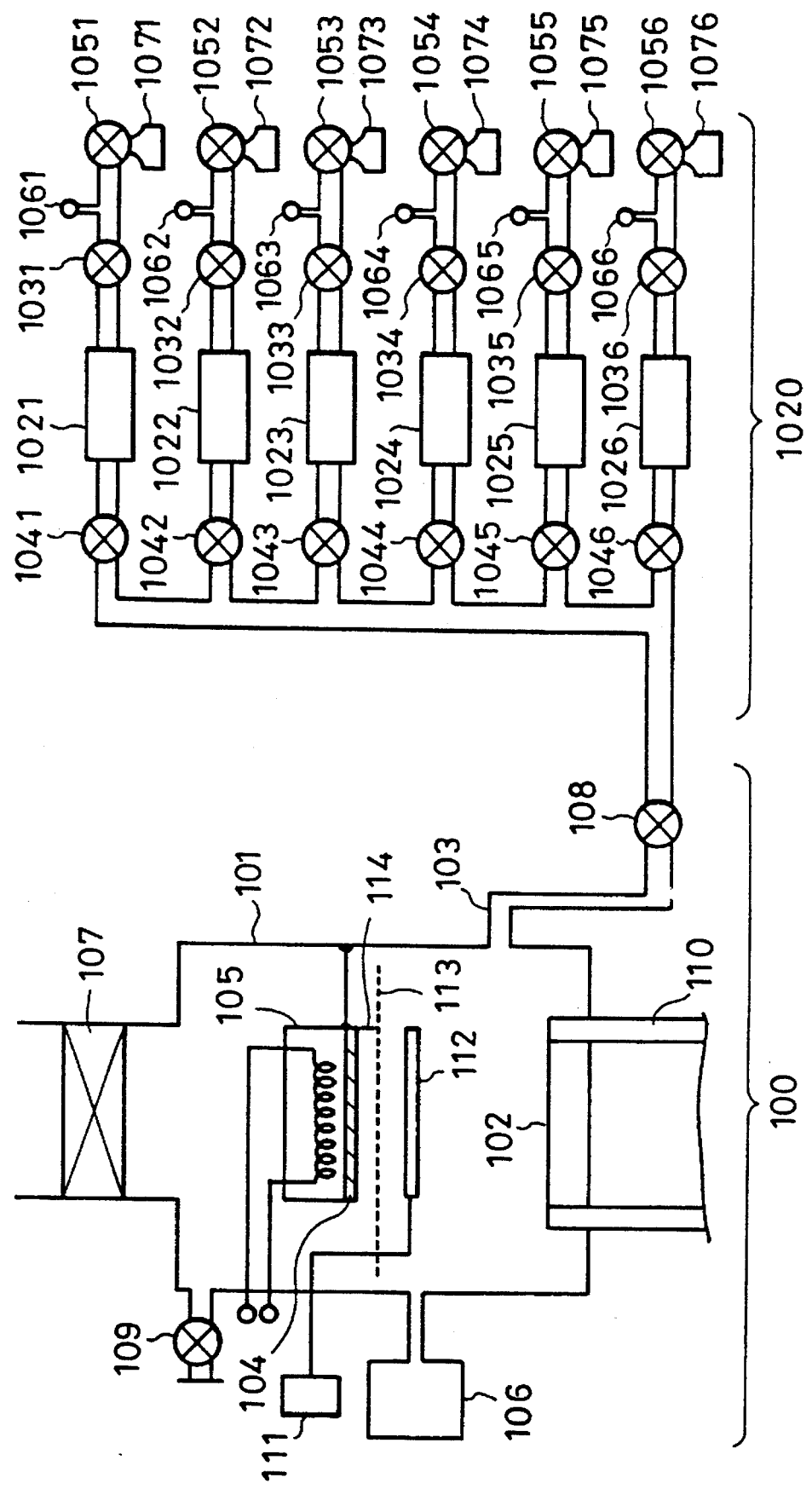
Figure 2:
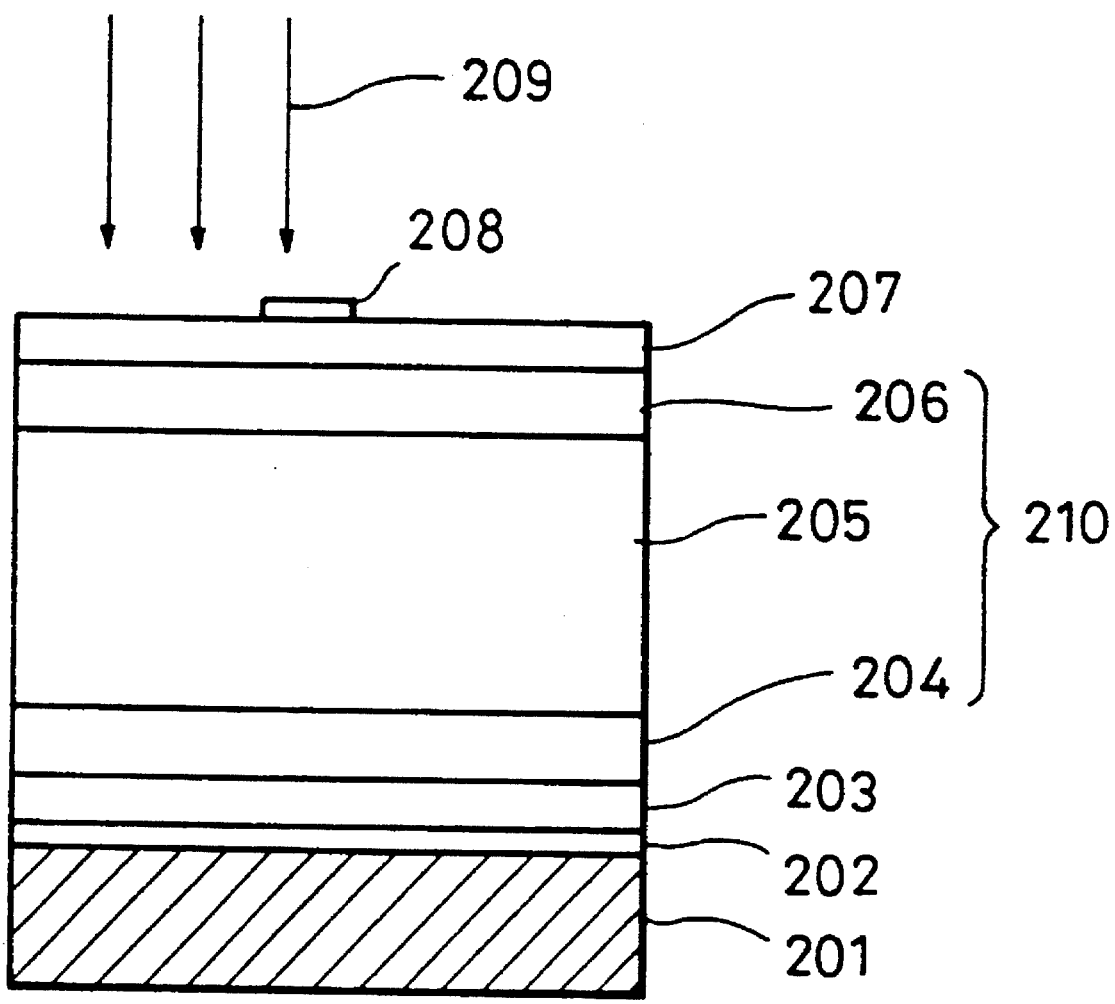
FIG. 2 is a schematic view which illustrates an example of the structure of a solar cell.
Figure 3:
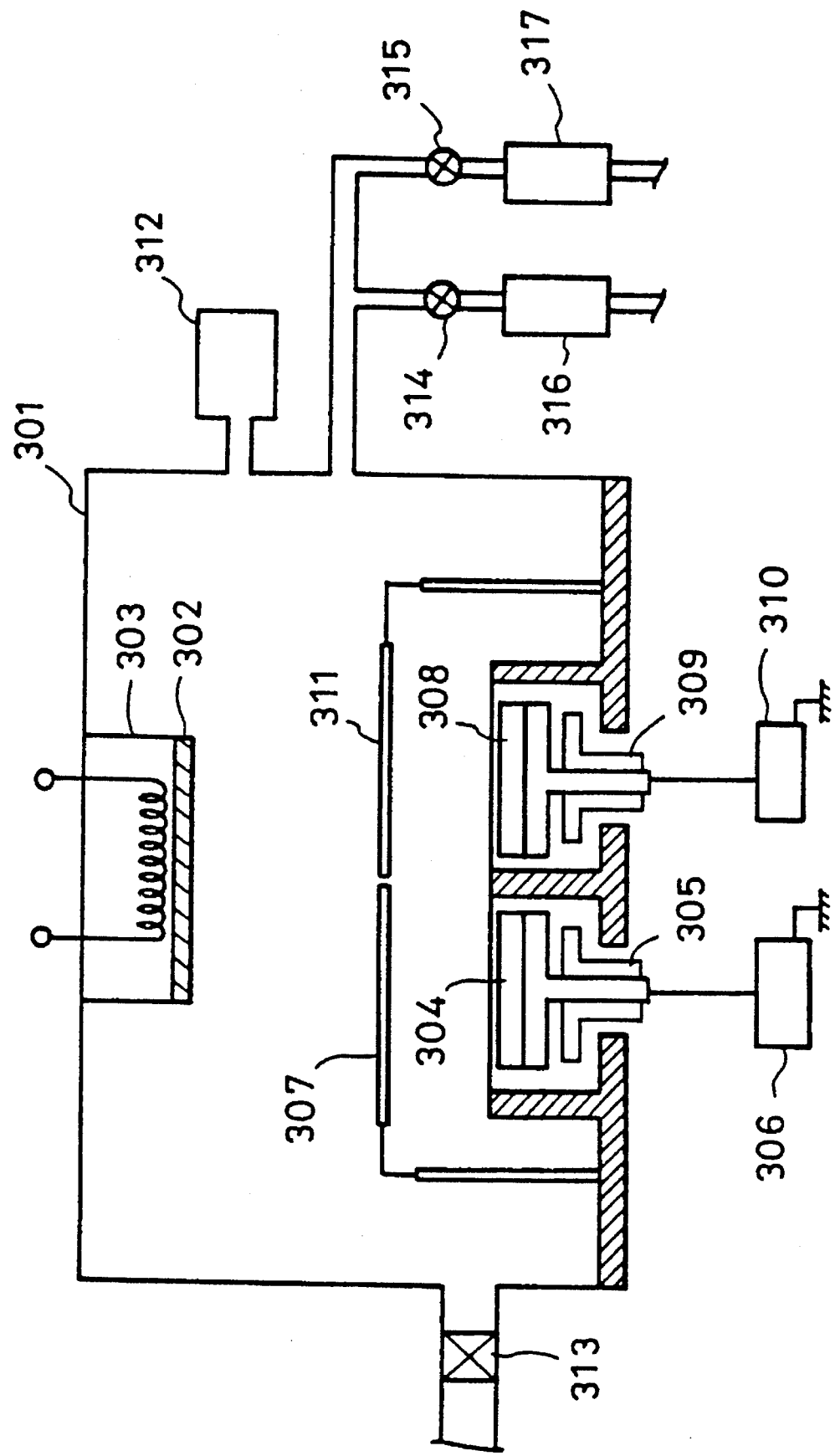
FIG. 3 is a schematic view which illustrates the structure of a DC magnetron sputtering apparatus.
Figure 4:
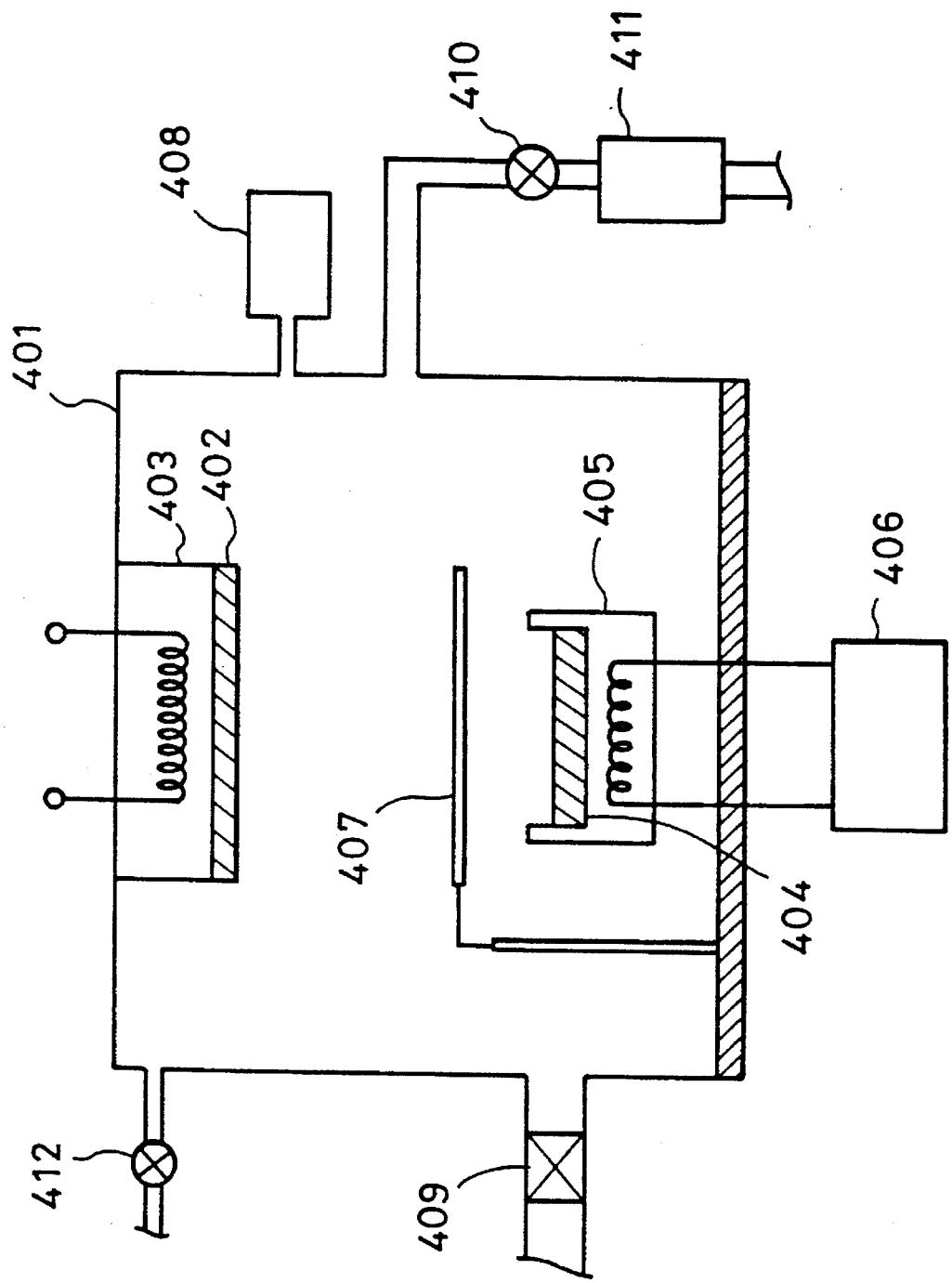
FIG. 4 is a schematic view which illustrates the structure of a resistance heating vacuum evaporation apparatus.

FIGS. 1A and 1B are schematic views which illustrate an example of a film forming apparatus system adaptable to the method of forming the deposited film according to the present invention. FIG. 2 is a schematic view which illustrates an example of a photovoltaic device formed by the method of the present invention. FIG. 3 is a schematic view which illustrates a DC magnetron sputtering apparatus for depositing a light reflecting layer and light reflection enhancing layer on a substrate for use in a case where the photovoltaic device is formed, FIG. 4 is a schematic view which illustrates a resistance-heating vacuum evaporation apparatus for depositing a transparent electrode and a collecting electrode of the photovoltaic device.

With reference to the film forming apparatus system schematically shown in FIG. 1, the method of forming the deposited film according to the present invention will now be described. The film forming apparatus system shown in FIGS. 1A and 1B comprises a film forming apparatus 100 and a raw material gas supply apparatus 1020. The film forming apparatus 100 comprises a deposition chamber 101, a dielectric window 102 for introducing microwaves, a gas introduction pipe 103, a substrate 104, a substrate heater 105, a vacuum gauge 106, a conductance valve 107, a sub-valve 108, a leak valve 109, a waveguide portion 110 for introducing the microwaves, a bias power source 111 for supplying RF energy, a bias rod 112 for supplying RF energy to plasma, and mesh 113 (FIG. 1(b)). The raw material gas supply apparatus 1020 comprises valves 1041 to 1046 for introducing raw material gas, mass flow controllers 1021 to 1026, primary valves 1031 to 1036 for the mass flow controllers 1021 to 1026, pressure regulators 1061 to 1066, cylinder valves 1051 to 1056, and raw material gas cylinders 1071 to 1076.

Material for the mesh 113 (see FIG. 1B) which are adaptable to the method of forming the deposited film according to the present invention are exemplified by Ni, stainless steel, Al, Cr, Mo, Au, Nb, Ta, V, Ti, Pt, Pb and Sn and the like or their alloys. Among the foregoing materials, it is preferable to use Al because it can easily be machined and has excellent electric conductivity. A proper material is selected from the foregoing material group to form the mesh so as to produce a desired deposited film.

The shape of the mesh 113 may be a mesh formed by knitting linear raw material members, or a mesh formed by expanding a plate-like member having thin cuts (expanded metal) or a punched out metal or the like. It is preferable that the maximum diameter of the openings of the mesh is 1 to 10 mm in terms of selectivity of activators and maintaining shielding of the microwaves. It is preferable that the percent area of the openings is 10% or more to improve the utilization ratio of the raw material gas in order to reduce uneven pressure distribution in the film forming chamber. Although the distance from the mesh 113 to the substrate 104 may be arbitrarily determined depending upon various conditions such as the percent opening of the mesh 113, the internal pressure and the DC bias voltage, it is usually determined to be in a range from 2 to 30 mm to obtain the optimum characteristics by preventing the uneven distribution of the thickness of the deposited film and its characteristics.

In order to cause the mesh 113 and the substrate 104 to have the same potential, the mesh 113 and the substrate 104 are electrically connected to each other by a conductivity member 114.

The mesh 113 is disposed to cover at least the surface of the substrate 104 in such a manner that it divides the deposition chamber 101 into two sections as shown in FIG. 1B or it is surrounds the substrate 104 and the heater 105.

Although omitted from the illustration, a shutter plate, which can be operated from outside the deposition chamber 101, may be disposed adjacent to the substrate 104 to control forming of the deposited film on the substrate 104. If the shutter plate is used, it is preferable that the shutter is disposed between the mesh 113 and the substrate 104 because any influence of opening/shutting of the shutter upon the plasma can thus be prevented.

Although the structure shown in FIG. 1B has an arrangement such that the substrate 104 and the mesh 113 are positioned perpendicular to the direction in which the microwaves are introduced, the present invention is not limited to this. They may be disposed in parallel or diagonally with respect to the foregoing direction.

It is preferable that the mesh 113 can be substantially removed by an external operation while maintaining the vacuum state in the deposition chamber in accordance with the conditions for forming a desired deposited film. Similarly, it is preferable that the mesh 113 can be replaced by another mesh of a different type and/or different shape. Moreover, it is preferable that the mesh 113 can be continuously or intermittently moved (for example, an apparatus having delivery rolls and take-up rolls) in terms of preventing adhesion of the deposited film to the mesh.

The method of forming a deposited film according to the present invention is adaptable to deposit a non-single-crystal semiconductor film, and more particularly to deposit an amorphous silicon hydride film (a-Si:H), an amorphous silicon hydride and halide film (a-Si:HZX), an amorphous silicon germanium hydride film (a-SiGe:H), an amorphous silicon germanium hydride halide film (a-SiGe:HX), an amorphous silicon carbide hydride (a-SiC:H) film, and an amorphous silicon carbide hydride halide film (a-SiC:HX) (hydrogen may be heavy hydrogen or both hydrogen and heavy hydrogen may be included).

The method of forming the deposited film according to the present invention is performed as follows:

First, the substrate 104, on which the deposited film will be formed, is placed in the deposition chamber 101, followed by sufficiently exhausting the gas present in the deposition chamber 101 to reach a pressure level of about $10^{-5}$ Torr or lower. Although it is preferable to use a turbo molecular pump to exhaust the foregoing gas, an oil diffusion pump may be used. If the oil diffusion pump is used, it is preferable to introduce $H_2$, He, Ar, Ne, Kr, or Xe gas when the internal pressure in the deposition chamber 101 is lowered to $10^{-4}$ Torr or lower in order to prevent inverse diffusion of oil.

After the gas in the deposition chamber 101 has been sufficiently exhausted, the $H_2$, He, Ar, Ne, Kr, or Xe gas is introduced into the deposition chamber 101 to make the internal pressure the same as when the raw material gas for forming the deposited film is allowed to flow. The optimum pressure level in the deposition chamber 101 ranges from 0.5 to 50 mTorr. After the internal pressure of the deposition chamber 101 has been stabilized, a switch (omitted from illustration) of the substrate heater 105 is switched on to heat the substrate 104 to 100° to 500 ° C. After the temperature of the substrate 104 has been stabilized at a predetermined temperature, the supply of the $H_2$, He, Ar, Ne, Kr, or Xe gas is stopped. Then, the raw material gases for forming the deposited film are introduced from the gas cylinders in predetermined quantities via the mass flow controllers. The quantities of the raw material gases for forming the deposited film to be introduced into the deposition chamber 101 are arbitrarily determined in accordance with the volume of the deposition chamber.

The internal pressure of the deposition chamber 101 realized when the raw material gas for forming the deposited film has been introduced into the deposition chamber 101 is a very important factor for the method of forming the deposited film according to the present invention, the optimum internal pressure of the deposition chamber 101 being from 0.5 to 50 mTorr.

Further, the energy of the microwaves for forming the deposited film to be supplied into the deposition chamber 101 is also an important factor. The microwave energy is arbitrarily determined in accordance with the flow rate of the raw material gas to be introduced into the deposition chamber 101. A preferred energy range is from 0.02 to 1 W/cm$^3$, which is smaller than the microwave energy required to decompose 100% of the raw material gas. A preferred range for the frequency of the microwave energy is from 0.5 to 10 GHz, and in particular, it is preferable that the frequency is about 2.45 GHz. In order to form a deposited film having reproducibility over a period of several to tens of hours, by the method according to the present invention, the stability of the frequency of the microwave energy is a very important factor. It is preferable that the change in the frequency be ±2%. It is also preferable that the ripple of the microwaves is ±2%.

The RF energy, to be supplied together with the microwave energy into the deposition chamber 101 in the method according to the present invention is also a very important factor for use in combination with the microwave energy. It is preferable that the range of the RF energy is from 0.04 to 2 W/cm$^3$. It is preferable that the frequency of the RF energy ranges from 1 to 100 MHz. It is preferable that the change in the RF is within ±2% and the waveform is smooth.

The foregoing microwave energy is introduced from the waveguide portion 110 into the deposition chamber 101 via the dielectric window 102. Simultaneously, the RF energy is introduced from the bias power source 111 into the deposition chamber 101 via the bias rod 112. Under the foregoing state, the raw material gas is decomposed for a predetermined time so that the deposited film having a desired thickness is formed on the substrate. Then, the supply of the microwave energy and that of the RF energy are stopped, followed by exhausting the gas in the deposition chamber 101. Then, the deposition chamber is sufficiently purged with the $H_2$, He, Ar, Ne, Kr, or Xe gas, followed by removing the deposited non-single-crystal semiconductor film from the deposition chamber 101.

DC voltage may be supplied to the bias rod 112 in addition to the RF energy. It is preferable that the polarity of the DC voltage to be supplied makes the bias rod to be of positive polarity. It is preferable that the DC voltage is from 10 to 300 V.

The raw material gas for depositing silicon for use in the method of forming the deposited film according to the present invention is a compound that contains silicon atoms and can be gasified. Specifically, it is exemplified by $SiH_4$, $Si_2H_6$, $SiF_4$, $SiFH_3$, $SiF_2H_2$, $SiF_3H$, $Si_3H_8$, $SiD_4$, $SiHD_3$, $SiH_2D_2$, $SiH_3D$, $SiFD_3$, $SiF_2D_2$, $SiFD_3$, and $Si_2D_3H_3$.

The raw material as for depositing germanium is a compound that contains germanium atoms and can be gasified. Specifically, it is exemplified by $GeH_4$, $GeD_4$, $GeF_4$, $GeFH_3$, $GeF_2H_2$, $GeF_3H$, $GeHD_3$, $GeH_2D_2$, $GeH_3D$, $Ge_2H_6$, and $Ge_2D_6$.

The raw material gas for depositing carbon atoms is a compound that contains carbon atoms and can be gasified. Specifically, it is exemplified by $CH_4$, $CD_4$, $C_nH_{2n+2}$ (n is an integer), $C_nH_{2n+2}$ (n is an integer), $C_2H_2$, and $C_6H_6$.

The material to be introduced into the non-single-crystal semiconductor layer for controlling the valence electrons of the non-single-crystal semiconductor layer in the method of forming the deposited film according to the present invention is exemplified by group III atoms and group V atoms of the periodic table.

In the present invention, effective starting materials for introducing the group III atoms are as follows: for introducing boron atoms boron hydrides such as $B_2H_6$, $B_4H_{10}$, $B_5H_9$, $B_5H_{11}$, $B_6H_{10}$, $B_6H_{12}$, $B_6H_{14}$, and boron halides such as $BF_3$ and $BCl_3$ are exemplified. In addition, $AlCl_3$, $GaCl_3$, $InCl_3$, and $TlCl_3$ may be employed.

In the present invention, effective starting materials for introducing the group V atoms are as follows: for introducing phosphorus atoms phosphorus hydrides such as $PH_3$ and $P_2H_4$, and phosphorus halides such as $PH_4I$, $PF_3$, $PF_5$, $PCl_3$, $PCl_5$, $PBr_3$, $PBr_5$ and $PI_3$ are exemplified. In addition, $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$, and $BiBr_3$ may be employed.

It is preferable that the quantity of the group III atoms and the group V atoms to be introduced into the non-single-crystal semiconductor layer for the purpose of making the conductivity type to be substantially i-type is 1000 ppm or less. In order to make the conductivity type to be substantially i-type, the group III atoms and the group V atoms may be added simultaneously to compensate each other.

It is preferable that the quantity of the group III atoms and the group V atoms to be introduced into the non-single-crystal semiconductor layer for the purpose of making the conductivity type to be p or n-type is from 1000 ppm to 10%.

The foregoing compounds that can be gasified may be diluted with $H_2$, He, Ne, Ar, Xe or Kr gas before being introduced into the deposition chamber. The optimum gas for diluting the compounds that can be gasified is $H_2$ or He.

FIG. 2 is a schematic view which illustrates an example of the photovoltaic devices, such as a solar cell or a sensor, to which the method of forming the deposited film according to the present invention is adapted. Referring to FIG. 2, the photovoltaic device comprises a conductive substrate 201, a light reflecting layer 202, a light reflection enhancing layer 203, an active semiconductor layer 210 comprising a laminate of a first-conductivity-type layer (n or p-type layer) 204, an i-type layer 205, a second-conductivity-type layer (p or n-type layer) 206, a transparent electrode 207, and a collecting electrode 208. Light beams 209 are applied from the side of the transparent electrode 207.

The photovoltaic device may be formed into a tandem cell or a triple cell structure constituted by stacking two or three units 210 each of which is formed by laminating the first-conductivity-type layer, the i-type layer and the second-conductivity type layer.

The method of forming the deposited film according to the present invention may, of course, be adapted to a photovoltaic device having an arrangement wherein the substrate is made of substantially transparent material, the transparent electrode, the semiconductor layers, and the light reflecting metal electrode being sequentially formed on the substrate in the foregoing order, and light is incident from the side of the transparent substrate.

By forming at least one the conductive substrate, light reflecting layer, light reflection enhancing layer, and transparent electrode with a textured form (i.e., a shape having projections and pits), the photoelectric current of the photovoltaic device can be increased.

The method of forming the deposited film according to the present invention is suitable for forming a thin film semiconductor layer, such as a photovoltaic device, a sensor, a thin film transistor, an image forming member for electrophotography, and in particular, suitable for forming the photoconductive layer.

PHOTOVOLTAIC DEVICE

The photovoltaic device to which the method of forming the deposited film according to the present invention is applied will now be described.

Conductive Substrate

The conductive substrate may be made of conductive material or may have an arrangement wherein a substrate member is formed of an insulating material having a conductive treatment applied to the surface thereof.

The conductive supporting member is exemplified by metals such as NiCr, stainless steel, Al, Cr, Mo, Au, Nb, Ta, V, Ti, Pt, Pb, Sn and their alloys.

The electrically insulating supporting member is exemplified by a synthetic resin film or sheet made of, for example, polyester, polyethylene, polycarbonate, cellulose acetate, polypropylene, polyvinyl chloride, polyvinylidene chloride, polystyrene, and polyamide, or glass, ceramics, or paper. It is preferable that the electrically insulating supporting member has at least one side thereof applied with a conductive treatment and a photovoltaic layer is formed on the foregoing surface applied with the conductive treatment.

If glass is employed, its surface is provided with a thin film made of NiCr, Al, Cr, Mo, Ir, Nb, Ta, V, Ti, Pt, Pb, In$_2$O$_3$ or ITO (In$_2$O$_3$+SnO$_2$), so that the surface is made conductive. If a synthetic resin film such as the polyester film is employed, its surface is provided with a thin metal film such as NiCr, Al, Ag, Pb, Zn, Ni, Au, Cr, Mo, Ir, Nb, Ta, V, Tl, or Pt by vacuum evaporation, electrode beam evaporation, or sputtering. As a alternative to this, the surface of the film is applied with a laminate treatment using the foregoing metal so as to be made conductive.

The supporting member may be formed into a sheet-like shape having a flat surface or a surface having projections and pits. The thickness of the supporting member is arbitrarily determined so that a desired photovoltaic device is formed. If the photovoltaic device has flexibility, the thickness may be reduced to a value with which the function required for the supporting member can be exhibited satisfactorily. However, it is usually made to be 10 μm or more in terms of the manufacturing and the handling facilities and the mechanical strength.

Light Reflecting Layer

It is suitable to make the light reflecting layer from a metal, such as Ag, Al, Cu, or AlSi, that exhibits high reflectance with respect to visible rays to near infrared rays. It is suitable for the foregoing metal to be formed by a resistance-heating vacuum evaporation method, an electron beam vacuum evaporation method, a co-evaporation method, or a sputtering method. It is preferable that the thickness of the metal for forming the light reflecting layer is from 10 nm to 5000 nm. In order to texture the metal, the temperature of the substrate must be 200° C. or higher at the time of depositing the metal.

Reflection Enhancing Layer

The optimum materials for forming the reflection enhancing layer are exemplified by ZnO, SnO$_2$, In$_2$O$_3$, ITO, TiO$_2$, CdO, Cd$_2$SnO$_4$, Bi$_2$O$_3$, MoO$_3$, and Na$_2$WO$_3$.

The method of depositing the reflection enhancing layer is exemplified by a vacuum evaporation method, a sputtering method, a CVD method, a spraying method, a spin-on method, and a dipping method.

Although the optimum thickness of the reflection enhancing layer is different depending upon the reflectance of the material for the reflection enhancing layer, the preferred thickness is from 50 nm to 10 μm.

n or p-type layer (first and second-conductivity-type layer)

The p-type layer or the n-type layer is an important layer that determines the characteristics of the photovoltaic device.

The amorphous material (hereinafter called "a-") or microcrystal material (hereinafter called "μc-" and included in the category of amorphous material) for making the p or the n-type layer is exemplified by a material obtained by adding a p-type valence electron controlling agent (group III atoms of the periodic table such as B, Al, Ga, In, or Tl) or an n-type valence electron controlling agent (group V atoms of the periodic table such as P, As, Sb, or Bi) in a high concentration to a-Si:H, a-Si:HX, a-SiC:H, a-SiC:HX, a-SiGe:H, a-SiGeC:H, a-SiO:H, a-SiN:H, a-SiON:HX, a-SiOCN:HX, μc-Si:H, μc-SiC:H, μc-Si:HX, μc-SiC:HX, μc-SiGe:H, μc-SiO:H, μc-SiGeC:H, μc-SiN:H, μc-SiON:HX, or μc-SiOCN:HX. Polycrystal material (hereinafter called "poly-") is exemplified by material obtained by a adding a p-type valence electron controlling agent (group III atoms of the periodic table such as B, Al, Ga, In or Tl) or an n-type valence electron controlling agent (group V atoms of the periodic table such as P, As, Sb or Bi) in a high concentration to poly-Si:H, poly-Si:HX, poly-SiC:H, poly-SiC:HX, poly-SiGe:H, poly-Si, poly-SiC, or poly-SiGe.

In particular, it is preferable that the p or n-type layer is made of a crystalline type semiconductor layer that does not absorb light to a large extent or an amorphous semiconductor layer that has a wide band gap.

The optimum quantity of addition of the group III atoms of the periodic table to the p-type layer and that of the group V atoms of the periodic table to the n-type layer is from 0:1 to 50 atm %.

Hydrogen atoms (H, D) or halogen atoms contained in the p or n-type layer act to compensate the dangling bonds of the p or n-type layer so that the doping efficiency is improved. The optimum quantity of hydrogen atoms or halogen atoms to be added to the p or the n-type layer is from 0.1 to 40 atm %. If the p or the n-type layer is made of crystalline material, the optimum quantity of hydrogen atoms or halogen atoms is from 0.1 to 8 atom %. Further, it is preferable that hydrogen atoms and/or halogen atoms are contained in a larger quantity in the portions adjacent to the interface between the p-type and the i-type layers and the interface between the n-type and the i-type layers. It is preferable that the content of halogen atoms and/or halogen atoms in the foregoing portion adjacent to the interface is 1.1 to 2 times the content in the bulk. By having hydrogen atoms or halogen atoms contained in a larger quantity in the positions adjacent to the interface between the p-type and the i-type and the interface between the n-type and the i-type layers, the defect levels and the mechanical strain occurring adjacent to the interface can be reduced. As a result, the photovoltaic force and the photoelectric current can be increased.

It is preferable that the hydrogen atoms or halogen atoms are contained in a larger quantity in the positions adjacent to the interface between the transparent electrode and the p-type layer and the interface between the transparent electrode and the n-type layer. It is preferable that the content of halogen atoms and/or halogen atoms in the foregoing portion adjacent to the interface is 1.1 to 2 times the content in the bulk. By causing hydrogen atoms or halogen atoms to be contained in a larger quantity in the positions adjacent to the interface between the transparent electrode and the p-type layer and the interface between the transparent electrode and the n-type layer, the defect levels and the mechanical strain occurring adjacent to the interface can be reduced. As a result, the photovoltaic force and the photoelectric current can be increased.

As for the electrical characteristics of the p and the n-type layers of the photovoltaic device, it is preferable that the activation energy is 0.2 eV or less, and most preferably 0.1 eV or less. It is preferable that the specific resistance is 100 $\Omega$cm or less, more preferably 1 $\Omega$cm or less. It is preferable that the thickness of the p and the n-type layers is each 1 to 50 nm, preferably 3 to 10 nm.

The raw material gas for depositing the p or the n-type layer of the photovoltaic device is a compound that contains silicon atoms and can be gasified, a compound that contains germanium atoms and can be gasified, a compound that contains carbon atoms and can be gasified, and a mixture of the gases.

Specifically, the compound that contains silicon atoms and can be gasified is exemplified by $SiH_4$, $Si_2H_6$, $SiF_4$, $SiFH_3$, $SiF_2H_2$, $SiF_3H$, $Si_3H_8$, $SiD_4$. $SiHD_3$, $SiH_2D_2$, $SiH_3D$, $SiFD_3$, $SiF_2D_2$, $SiFD_3H$, and $Si_2D_3H_3$.

The compound that contains germanium atoms and can be gasified is exemplified by $GeH_4$, $GeD_4$, $GeF_4$, $GeFH_3$, $GeF_2H_2$, $GeF_3H$, $GeHD_3$, $GeH_2D_2$, $GeH_3D$, $Ge_2H_6$, and $Ge_2D_6$.

The compound that contains carbon atoms and can be gasified is exemplified by $CH_4$, $CD_4$, $C_2H_{2n+2}$ (n is an integer), $C_nH_{2n}$ (n is an integer), $C_2H_2$, $C_6H_2$, $CO_2$, and CO.

The material to be introduced into the p or the n-type layer for controlling the valence electrons is exemplified by group III atoms and group V atoms of the periodic table.

The effective starting materials for introducing the group III atoms are as follows: for introducing boron atoms boron hydrides such as $B_2H_6$, $B_4H_{10}$, $B_5H_9$, $B_5H_{11}$, $B_6H_{10}$, $B_6H_{10}$, $B_6H_{12}$, $B_6H_{14}$, and boron halides such as $BF_3$ and $BCl_3$ are exemplified. In addition, $AlCl_3$, $GaCl_3$, $InCl_3$ and $TlCl_3$ may be employed. In particular, $B_2H_6$ and $BF_3$ are suitable materials.

The effective starting material for introducing the group V atoms are as follows: for introducing phosphorus atoms phosphorus hydrides such as $PH_3$ and $P_2H_4$, and phosphorus halides such as $PH_4I$, $PF_3$, $PF_5$, $PCl_3$, $PCl_5$, $PBr_3$, $PBr_5$, and $PI_3$ are exemplified. In addition, $ASH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$, and $BiBr_3$ may be employed. In particular, $PH_3$ and $PF_3$ are suitable materials.

The p or the n-type layer of the photovoltaic device is preferably deposited by an RF plasma CVD method or a microwave plasma CVD method.

If the RF plasma CVD method is employed, a charge-coupled type RF plasma CVD method is preferable.

If the p or the n-type layer is deposited by the RF plasma CVD method, the optimum temperature of the substrate in the deposition chamber is from 100° to 350° C., the pressure is from 0.1 to 10 Torr, the RF power is from 0.05 to 1.0 w/cm², and the deposition speed is from 0.01 to 3 nm/sec.

The compound that can be gasified may be properly diluted with $H_2$, He, Ne, Ar, Xe or Kr gas, followed by introducing it into the deposition chamber.

If a microcrystalline semiconductor, or a layer such as an a-SiC:H layer that does not absorb light in a large quantity or a layer having a wide band gap is deposited, it is preferable that the raw material gas is diluted to 2 to 100 times with hydrogen gas, and that a relatively large RF power is supplied. The optimum RF ranges from 1 MHz to 100 MHz, more preferably about 13.56 MHz.

If the p or the n-type layer is deposited by the microwave plasma CVD method, it is preferable to employ a microwave plasma CVD apparatus having an arrangement where the microwaves are introduced into the deposition chamber through a dielectric window (for example, a window made of alumina ceramics or the like) by means of a waveguide pipe.

Although the method of forming the deposited film according to the present invention is a suitable method to form the p or the n-type layer by the microwave plasma CVD method, a deposited film that can be adapted to the photovoltaic device can be formed under wider deposition conditions.

If the p or the n-type layer is deposited by a microwave plasma CVD method except for the method of forming the deposited film according to the present invention, it is preferable that the temperature of the substrate in the deposition chamber is from 100° to 400° C., the pressure is from 0.5 to 30 Torr, the microwave power is from 0.01 to 1.0 W/cm³, and the frequency of the microwaves is from 0.5 to 10 GHz.

The compound that can be gasified may be properly diluted with $H_2$, He, Ne, Ar, Xe or Kr gas, followed by introducing it into the deposition chamber.

If a microcrystal semiconductor, or a layer such as an a-SiC:H layer that does not absorb light by a large quantity or a layer having a wide band gap is deposited, it is preferable that the raw material gas is diluted to 2 to 100 times with hydrogen gas, and that a relative large microwave power is supplied.

i-Type Layer

The i-type layer is an important layer that generates and transports carriers when it is irradiated with light.

The i-type layer may be a slightly p-type layer or a slightly n-type layer.

The i-type layer of the photovoltaic device according to the present invention may be of, for example, a-Si:H, a-Si:HX, a-SiC:H, a-SiC:HX, a-SiGe:H, a-SiGe:HX, a-SiGeC:H or a SiGeC:HX.

In particular, it is preferable that the i-type layer is made of intrinsic material obtained by adding group III atoms and/or group V atoms of the periodic table as the valence electron controlling agent to the foregoing amorphous material.

Hydrogen atoms (H, D) or halogen atoms (X) contained by the i-type layer compensate the dangling bonds of the i-type layer and improve the product of the mobility of the carrier in the i-type layer and its lifetime. Furthermore, they compensate the level of the interfaces between the n-type layer and the i-type layer and between the n-type layer and the i-type layer so that the photovoltaic force, the photoelectric current, and the light response of the photovoltaic device are improved. The optimum content of hydrogen atoms and/or halogen atoms contained in the i-type layer is from 1 to 40 atom %. It is preferred that a large quantity of hydrogen atoms and/or halogen atoms is contained in a portion adjacent to the interfaces between the p-type layer and the i-type layer and between the i-type layer and the n-type layer. It is preferable that the content of halogen atoms and/or halogen atoms contained in the i-type layer in the foregoing portion adjacent to the interface is 1.1 to 2 times the content in the bulk.

The optimum thickness of the i-type layer depends upon the structure (for example, single cell, or tandem cell or triple cell) of the photovoltaic device and the band gap of the i-type layer, and is from 0.1 to 1.0 μm.

As for the basic physical properties of the i-type layer to effectively achieve the objects of the present invention, it is preferable that the electron mobility is 0.01 cm$^2$/V/sec or more, the positive hole mobility is 0.0001 cm$^2$/V/sec or more, the band gap is from 1.1 to 2.2 eV, the density of localized states at the center of the forbidden zone is $10^{18}$/cm$^3$/eV or less, the inclination of the backtail adjacent to the valence electron zone is 65 meV or less. The electric current and voltage characteristics of the photovoltaic device according to the present invention are measured under AM 1.5 and 100 mW/cm$^2$ and curve-fitting is performed by the Hecht method. It is preferable that the product of the mobility and the lifetime obtained from the foregoing curve-fitting is $10^{-10}$ cm$^2$/V or more.

It is preferable that the band gap of the i-type layer is so designed as to be widened adjacent to the interfaces between p-type layer and the i-type layer and between the n-type layer and the i-type layer. As the result of this design, the photovoltaic force and the photoelectric current in the photovoltaic device can be increased and deterioration due to light after long use can be prevented.

It is most suitable to form the i-type layer of the photovoltaic device by the film forming method according to the present invention.

Transparent Electrode

It is preferable that the transparent electrode for use in the present invention has a light transmissivity of 85% or more. Furthermore, it is electrically preferable that the sheet resistance value is 100 Ω or less so as not to act as a resistance component for the output of the photovoltaic device.

The material having the foregoing characteristics is exemplified by a metal oxide such as $SnO_2$, $In_2O_3$, ITO ($SnO_2$+$In_2O_3$), ZnO, CdO, $Cd_2SnO_4$, $TiO_2$ or $Ti_3N_4$, or a thin, semitransparent metal film such as Au, Al or Cu. Among the foregoing materials, it is preferable to employ a transparent electrode made of an indium oxide or an indium-tin oxide.

The foregoing transparent electrode is manufactured by a method selected from a group consisting of a resistance heating evaporation method, an electron beam heating evaporation method, a sputtering method, and a spraying method. The most suitable method is the sputtering method and the vacuum evaporation method.

The transparent electrode is deposited as follows.

It is preferable to deposit the transparent electrode by a DC magnetron sputtering apparatus schematically shown in FIG. 3, which comprises a deposition chamber 301, a substrate 302, a heater 303, heater 303, targets 304 and 308, insulating supporting members 305 and 309, DC power sources 306 and 310, shutters 307 and 311, a vacuum meter 312, a conductance valve 313, gas introduction valves 314 and 315, and mass flow controllers 316 and 317.

When a transparent electrode made of indium oxide is deposited on the substrate by using the DC magnetron sputtering apparatus, a target made of metallic indium (In) or indium oxide ($In_2O_3$) or the like is used. When the transparent electrode made of indium-tin oxide is deposited on the substrate, a target obtained by arbitrarily combining the following materials is employed: tin, indium, an alloy of tin and indium, tin oxide, indium oxide and indium-tin oxide.

When the transparent electrode is deposited by the sputtering method, the temperature of the substrate is an important factor. It is preferable that the temperature is from 25° C. to 600° C. The gas used when the transparent electrode is deposited by the sputtering method is exemplified by inert gases such as argon (Ar) gas, neon (Ne) gas, xenon (Xe) gas, and helium (He) gas. It is most suitable to use Ar gas. It is preferable that oxygen ($O_2$) gas is added to the foregoing inert gas if necessary. In particular, oxygen ($O_2$) gas must be used if the metal target is used.

In the case where the target is sputtered by using the inert gas or the like, it is preferable that the pressure in the discharge space is from 0.1 to 50 mTorr for effectively performing the sputtering.

It is preferable to use a DC power source or an RF power source in the case where the sputtering method is employed. The electric power for use in the sputtering operation is preferably from 10 to 1000 W.

The deposition speed of the transparent electrode depends upon the pressure in the discharge space and the discharging electric power. The most suitable deposition speed is in the range from 0.01 to 10 nm/sec.

It is preferable that the transparent electrode is deposited to have a thickness with which the conditions required for the reflection prevention film can be met. Specifically, the preferred range of the thickness of the transparent electrode is from 50 nm to 300 nm.

A second method suitable to deposit the transparent electrode is a vacuum evaporation method.

As schematically shown in FIG. 4, a vacuum evaporation apparatus comprises a deposition chamber 401, a substrate 402, a heater 403, an evaporation source 404, a heater 405 for heating the evaporation source 404, a power source 406 for the heater 405, a shutter 407, a vacuum meter 408, a conductance valve 409, a gas introduction valve 410, a mass flow controller 411, and a leak valve 412.

As a suitable evaporation source for depositing the transparent electrode by the vacuum evaporation method, tin, indium, or indium-tin alloy may be used.

It is preferable that the temperature of the substrate is 25° C. to 600° C. when the transparent electrode is deposited.

It is necessary to introduce oxygen gas ($O_2$) having pressure in the range from $5\times10^{-5}$ Torr to $9\times10^{-4}$ Torr into the deposition chamber after the pressure in the deposition chamber has been lowered to about $10^{-6}$ Torr or lower.

By introducing oxygen in the foregoing quantity, the metal vaporized from the evaporation source reacts with oxygen in the vapor phase so that an excellent transparent electrode is deposited.

RF electric power may be supplied at the foregoing negative pressure level to generate plasma so that the evaporation is performed in the presence of the plasma.

The deposition speed for the transparent electrode under the foregoing conditions ranges from 0.01 to 10 nm/sec. If the deposition speed is lower than 0.01 nm/sec, the manufacturing yield deteriorates. If it is higher than 10 nm/sec, a course film is undesirably formed, causing the transmissivity, the conductivity and the adhesion to deteriorate.

THIN FILM TRANSISTOR

A thin film transistor (TFT) adapted to the method of forming the deposited film according to the present invention will now be described.

Figure 11:
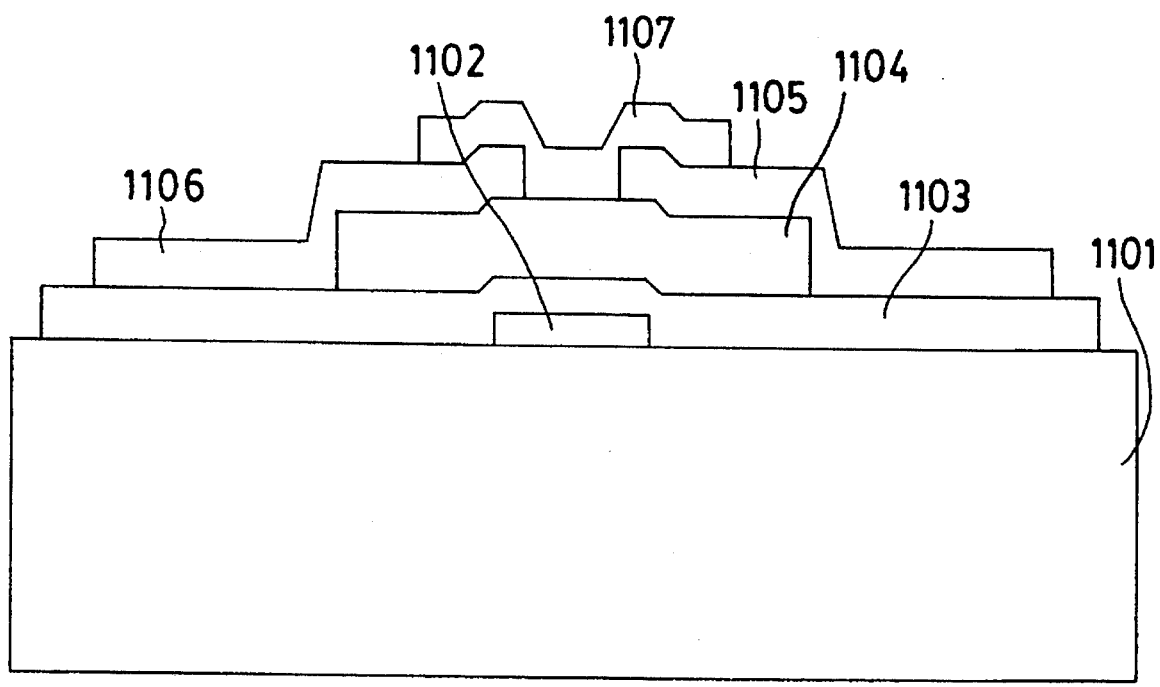
FIG. 11 is a schematic view which illustrates the structure of a TFT.

The schematic structure of the TFT is shown in FIG. 11. As shown in FIG. 11, the TFT comprises substrate 1101, a gate electrode 1102, an insulating layer 1103, a semiconductor layer 1104 formed by the method of forming the deposited film according to the present invention, a source electrode 1105, a drain electrode 1106, and a protection layer 1107.

Substrate

As the substrate suitable for the TFT, any one of the following substrates may be employed: an insulating substrate such as a glass, quartz, or sapphire, a substrate comprising a silicon wafer with an oxide, nitride, or carbon layer formed thereon, or a substrate formed by stacking silicon oxide layer, a silicon nitride layer, or a silicon carbide layer on Al, stainless steel, Cr, or Mo.

Gate Electrode, Source Electrodes and Drain Electrode

As each of the foregoing electrodes, a metal electrode made of Al or Cu or the like, or a metal silicide such as Al silicide is suitable. Also a silicon layer obtained by adding group III atoms or group V atoms of the periodic table is suitable.

Semiconductor Layer

It is preferable that a layer similar to the i-type layer of the previously described photovoltaic cell is employed to form the semiconductor layer. The semiconductor layer is preferably deposited by forming the deposited film according to the present invention. The optimum thickness of the semiconductor layer employed to form the TFT is from 0.1 μm to 5 μm.

Insulating Layer

It is preferable that the insulating layer is made of a silicon oxide layer, a silicon nitride layer, a silicon carbide layer, or a titanium oxide layer, which is substantially stoichiometric.

Protection Layer

The protection layer may be made of the same material as that of the insulating layer. Additionally, organic material such as polyimide, acrylic resin, polycarbonate, or ETFE, or a stacked structure composed of inorganic material and organic material may be used.

IMAGE FORMING MEMBER FOR ELECTROPHOTOGRAPHY

Figure 13:
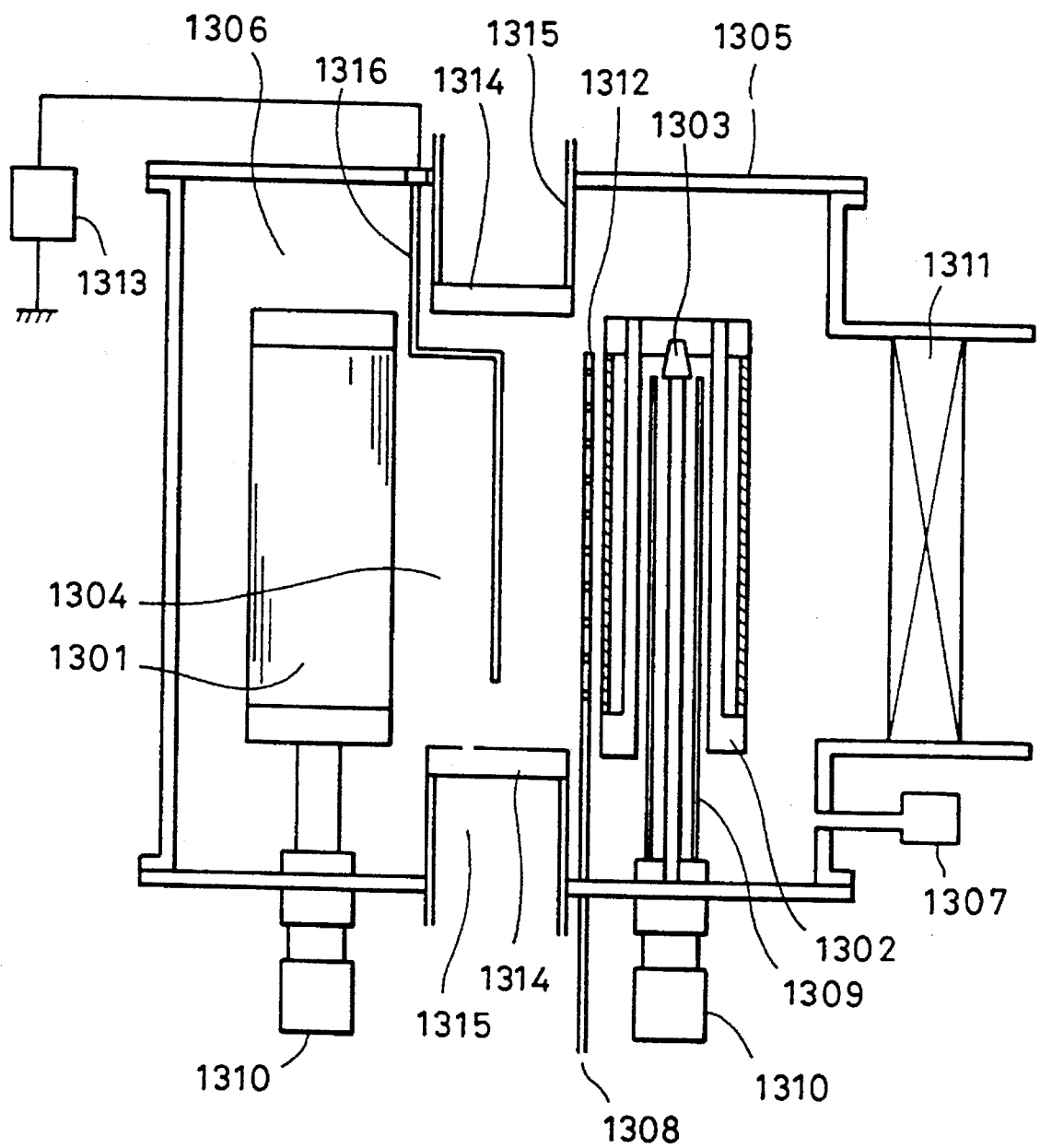
FIG. 13 is a schematic view which illustrates an apparatus for manufacturing a photosensitive member for electrophotography adapted to the film forming method according to the present invention.

An application example of the method of forming a deposited film according to the present invention to a photoconductive layer of an image forming member for electrophotography will now be described. FIG. 13 shows an apparatus for forming a deposited film that applies the method according to the present invention for forming the image forming member for electrophotography.

The apparatus shown in FIG. 13 comprises a deposition chamber 1306, a cylinder-like substrate 1301, a cylindrical holder 1302, a rotational shaft 1303 for rotating the cylindrical holder 1302, a discharge space 1304, a cover 1305 for the deposition chamber 1306, a vacuum gauge 1307 for measuring the pressure in the decomposition chamber 1306, a heater 1309 for heating the cylinder 1302, a motor 1310 for rotating the cylinder 1302, a conductance valve 1311 for adjusting the pressure in the deposition chamber 1306, a gas pipe 1308 having orifices 1312 for introducing raw material gas into the deposition chamber 1306, an RF power source 1313 for supplying RF energy to a bias rod 1316, a dielectric window 1314 for introducing microwaves, a waveguide portion 1315 for introducing the microwaves, and a microwave power source and a raw material gas supply system (omitted from illustration). A similar operational sequence as previously described is performed for forming the image forming member for electrophotography by the method of forming the deposited film according to the present invention.

FIG. 12 illustrates an example of the layer structure of the image forming member for electrophotography deposited by using the apparatus for forming the deposited film shown in FIG. 13 by the method of according to the present invention.

The image forming structural member for electrophotography comprises a substrate 1201, a charge-injection-inhibition layer 1204, a photoconductive layer 1203, and a surface layer 1202.

Substrate

The substrate of the image forming member for electrophotography may be a substrate similar to that of the foregoing photovoltaic device. A cylinder-like substrate is the most suitable substrate in this case.

Charge-Injection-Inhibiting Layer

It is preferable that the charge-injection-inhibiting layer is a p-type semiconductor with respect to positive charge and a n-type semiconductor with respect to negative charge. The semiconductor may be made of the p and the n-type layer of the foregoing photovoltaic device. The optimum thickness of the charge-injection-inhibiting layer is from 0.1 to 10 μm.

Photoconductive Layer

A layer similar to the i-type layer of the photovoltaic device is suitable as the photoconductive layer of the image forming member for electrophotography. The image forming member for electrophotography may be made of a-Si:H, a-Si:HX, a-SiC:H, a-SiC:HX, a-SiO:H, a-SiO:HX, a-SiN:H, a-SiN:HX or a-SiCON:HX or the like. C, O, N, H and X and the like may be distributed in the photoconductive layer. It is preferable that the foregoing elements are distributed in a larger quantity adjacent to the substrate and the surface. The photoconductive layer in which the foregoing elements are distributed can be formed by changing the quantity of the raw material gas to be introduced into the deposition chamber in accordance with a desired form of the distribution by the method according to the present invention. The distribution of the elements in the photoconductive layer can be realized by controlling the microwave energy supplied into the deposition chamber. The contents of C, O, and N can be increased by increasing the microwave energy. They can also be increased by controlling the RF energy supplied into the deposition chamber. By increasing the RF energy, the content of C, O, N, H, and X can be increased.

The optimum thickness of the photoconductive layer of the image forming member for electrophotography is from 5 to 100 μm.

Surface Layer

A layer having a resistance larger than that of the photoconductive layer is suitable to form the surface layer of the image forming member for electrophotography. The large-resistance layer may be made of a-SiC:HX, a-SiN:H, or a-SiO:H or the like. In particular, a-SiC:HX is the most suitable material.

If an a-SiC:HX film deposited by the method of forming the deposited film according to the present invention and containing 50% or more hydrogen is used to form the surface layer of the image forming member for electrophotography, excellent characteristics can be attained because undesirable image running can be prevented and the residual potential can be lowered.

OTHER PHOTOVOLTAIC DEVICES

Other photovoltaic devices according to the present invention will not be described in further detail.

FIGS. 15 and 16 are schematic views which illustrate examples of the structures of other photovoltaic devices according the present invention.

A photovoltaic device according to the present invention and shown in FIG. 15A comprises an opaque conductive substrate 1501 having thereon a light reflecting (conductive) layer 1502, a reflection enhancing layer 1503, a first-conductivity-type non-single crystal silicon semiconductor layer 1504, an i-type (substantially intrinsic) non-single-crystal silicon semiconductor layer 1505 deposited by a microwave plasma CVD method, a second-conductivity-type non-single crystal silicon semiconductor layer 1506, a transparent electrode 1507, and a collecting electrode 1508. Light rays 1509 are irradiated from the side of the transparent electrode 1507.

The photovoltaic device according to the present invention and shown in FIG. 15B is a tandem structure comprising a transparent superstrate 1501 having thereon a collecting electrode 1508, a transparent electrode 1507, a first-conductivity-type non-single crystal silicon semiconductor layer 1506b, an i-type (substantially intrinsic) non-single-crystal silicon semiconductor layer 1505b deposited by a microwave plasma CVD method, a second-conductivity-type non-single-crystal silicon semiconductor layer 1504b, a first-conductivity-type non-single-crystal silicon semiconductor 1506a, an i-type (substantially intrinsic) non-single-crystal silicon semiconductor layer 1505a deposited by a microwave plasma CVD method, a second conductivity-type non-single-crystal silicon semiconductor layer 1504a, a reflection enhancing layer 1503, a light reflecting (conductive) layer 1502, and a conductive (or/and protection) layer 1510.

Furthermore, a triple-type photovoltaic device having three pin-junction layers stacked one upon the other is another photovoltaic device contemplated by the present invention although omitted from illustration.

The photovoltaic device having the structure shown in FIG. 15 and according to the present invention is characterized in that the content of hydrogen increases in the sequential order of the p-type layer, the n-type, and the i-type layer thereof.

The i-type layer of the photovoltaic device according to the present invention deposited by the microwave plasma CVD method can be deposited at a high speed, resulting in the time in which the substrate is heated being substantially shortened. Therefore, the time in which the underlying films such as the light reflecting layer (Ag), the reflection enhancing layer (ZnO), and the n-type layer (or the p-type layer) are simultaneously heated is substantially shortened. This reduces changes in the composition of the underlying films and prevents bonding of same which may occur during heating. Furthermore, mutual diffusion of the elements between layers, and changes in the composition and deterioration in the characteristics of the films can be prevented. Deterioration in the characteristics of the light reflecting layer and the reflection enhancing layer will reduce the short-circuit current in the photovoltaic device and deteriorate the conversion efficiency.

The deterioration in the characteristics of the n-type layer (or the p-type layer) reduces the open circuit voltage of the photovoltaic device, resulting in deterioration in the conversion efficiency. A significant effect is exhibited from the foregoing fact in the case where a photovoltaic device such as a tandem type or a triple type device is manufactured by stacking of layers. The reason for this is that the overall time taken to heat the substrate of a multilayer structure having many interfaces is lengthened, and accordingly, a means for preventing the foregoing problem is required if many interfaces are present.

The i-type layer of the photovoltaic device according to the present invention deposited by the microwave plasma CVD method can be deposited at a high speed. Therefore, the time taken to deposit the foregoing layers can be shortened and the time taken to form the photovoltaic device can be substantially shortened. This fact enables the output in the manufacturing process to be improved, resulting in a reduction of the manufacturing cost.

Since the n-type layer or the p-type layer of the photovoltaic device according to the present invention deposited by the microwave plasma CVD method uses high density and high electrolytic plasma generated by the microwave discharge, a significant efficiency can be realized when the raw material gas is decomposed and, accordingly, the doping efficiency of the dopant can be improved relatively easily. Therefore, excellent n-type and p-type layers can be obtained.

The n-type layer or the p-type layer of the photovoltaic device according to the present invention when deposited by the RF plasma CVD method enables the base films (the light reflection layer, the reflection enhancing layer, and the n-type layer or the p-type layer) to be protected from damage by high energy ions when the foregoing multi-layer photovoltaic device is manufactured because the RF discharge uses plasma that is relatively soft with respect to that used in the microwave discharge. As a result, an excellent device can be obtained while preventing reductions in the open circuit voltage and short-circuit current of the photovoltaic device.

The n-type layer or the p-type layer of the photovoltaic device according to the present invention deposited by the microwave plasma CVD method and the n-type layer or the p-type layer deposited by the RF plasma CVD method are used to manufacture the foregoing multi-layer photovoltaic device. By arbitrarily and selectively using the foregoing films while considering the required characteristics (the doping efficiency and the like) of the films and influence upon the base, a photovoltaic device having excellent characteristics and satisfactory conversion efficiency can be manufactured.

The content of hydrogen in the p-type layer, the i-type layer, and the n-type layer of the photovoltaic device according to the present invention is characterized in that the content increases in the sequential order of the p-type layer, the n-type layer, and the i-type layer.

That is, it is preferable that p-type layer and the n-type layer contain a minimum amount of hydrogen in order to obtain a high conductivity in spite of an extremely thin thickness (tens to hundreds of Å) in terms of the doping efficiency of the dopant. More specifically, it is preferable that the content of hydrogen in the p-type layer is smaller than that in the n-type layer to realize excellent film quality because the p-type layer usually has a lower doping efficiency in comparison to that of the n-type layer.

As for the i-type layer, the i-type layer deposited by the microwave plasma CVD method can be deposited at a speed which is ten times the speed realized in the RF plasma CVD method. Therefore, the dangling bonds in the silicon can be terminated and the network of the silicon-to-silicon bonds can be relaxed during the film deposition if the film contains less hydrogen in comparison to the i-type layer deposited by the RF plasma CVD method.

As described above, the content of hydrogen in the films must increase in the sequential order of the p-type layer, the n-type layer, and the i-type layer to cause the photovoltaic device to have excellent characteristics.

Figure 16A:
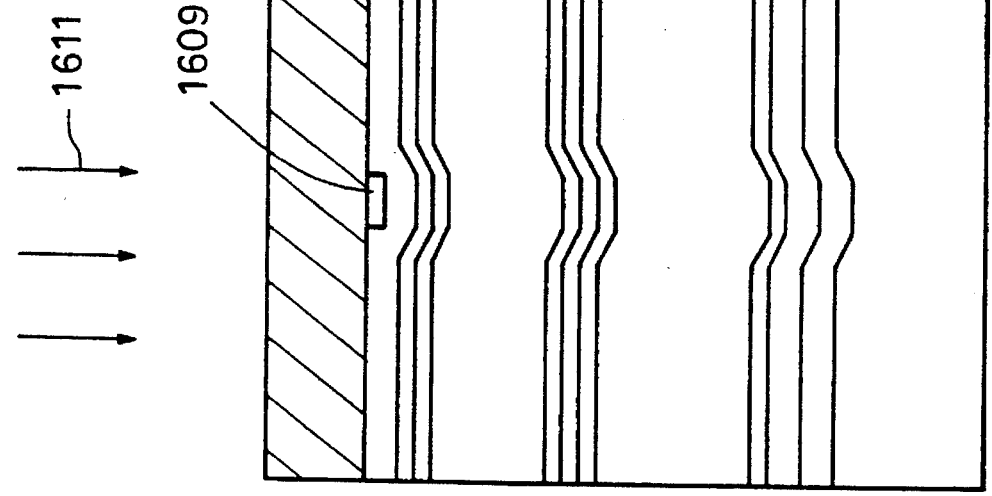
FIGS. 16A and 16B are schematic views which illustrate yet another example of the photovoltaic device according to the present invention.

A photovoltaic device shown in FIG. 16A according to the present invention comprises an opaque conductive substrate 1601 having thereon a light reflecting (conductive) layer 1602, a reflection enhancing layer 1603, a first-conductivity-type non-single-crystal silicon semiconductor layer 1604, an i-type (substantially intrinsic) non-single-crystal silicon semiconductor interface layer 1605 deposited by an RF plasma CVD method, an i-type (substantially intrinsic) non-single-crystal silicon semiconductor layer 1606 deposited by a microwave plasma CVD method, an i-type (substantially intrinsic) non-single-crystal silicon semiconductor interface layer 1607 deposited by an RF plasma CVD method, a second-conductivity-type non-single-crystal silicon semiconductor layer 1608, a transparent electrode 1609, and a collecting electrode 1610. The photovoltaic device is irradiated with light rays 1611 from the side of the transparent electrode 1609.

Figure 16B:
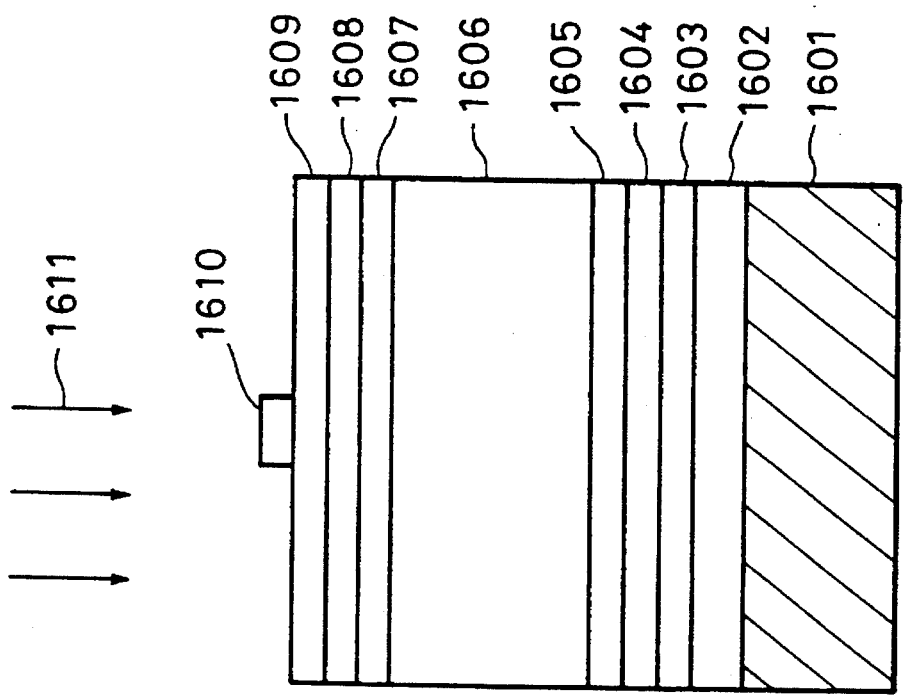

The photovoltaic device shown in FIG. 16B and according to the present invention is an example of a tandem structure comprising a transparent superstrate 1601 having thereon a collecting electrode 1609 a transparent electrode 1608, a first-conductivity-type non-single-crystal silicon semiconductor layer 1607b, an i-type (substantially intrinsic) non-single-crystal silicon semiconductor interface layer 1606b deposited by a RF plasma CVD method, an i-type (substantially intrinsic) non-single-crystal silicon semiconductor layer 1605b deposited by a microwave plasma CVD method, a second-conductivity-type non-single-crystal silicon semiconductor layer 1604b, a first-conductivity-type-non-single-crystal silicon semiconductor layer 1607a, an i-type (substantially intrinsic) non-single-crystal silicon semiconductor interface layer 1606a deposited by an RF plasma CVD method, an i-type (substantially intrinsic) non-single-crystal silicon semiconductor layer 1605a deposited by a microwave plasma CVD method, a second conductivity-type non-single-crystal silicon semiconductor layer 1604a, a reflection enhancing layer 1603, a light reflecting (conductive) layer 1602, and a conductive (or/and protection) layer 1610.

Furthermore, a triple-type photovoltaic device having three pin-junction layers stacked one upon the other is a photovoltaic device contemplated by the present invention although omitted from illustration.

It can be considered that the i-type interface layer formed at least at one of the interfaces between the i-type layer and the p-type layer and between the i-type layer and the n-type layer by the RF plasma CVD method reduces the interface discontinuities that cause recombination of the charge carriers in the interface between the i-type layer and the p-type layer and between the i-type layer and the n-type layer in comparison to the case where the i-type interface is not present. Therefore, the conversion efficiency of the photovoltaic device can be improved.

The thickness of the i-type interface layer of the photovoltaic device according to the present invention determines the characteristics of the photovoltaic device. It is preferable that the thickness ranges from 5 to 25 mn. If the thickness is 5 nm or less, there is a possibility that the film cannot be deposited uniformly on a relatively large (100 $cm^2$ or larger) substrate. Therefore, there is a fear that the effect of the i-type layer cannot be exhibited satisfactorily. If the thickness is 25 nm or more, the time taken to deposit the i-type interface layer increases, causing the time taken to form the photovoltaic device to be lengthened. Therefore, the manufacturing cost rises undesirably. Hence, the thickness of the i-type layer is selected to be a value that is sufficient to improve the characteristics of the photovoltaic device, the thickness being preferably in the range as described above.

It is preferable that the content of hydrogen in the p-type layer, the i-type interface layer, the i-type layer, and the n-type layer of the photovoltaic device according to the present invention increases in the sequential order of the p-type layer, the n-type layer, the i-type interface layer, and the i-type layer. That is, it is preferable that the p-type layer and the n-type layer contain the minimum amount of hydrogen in order to obtain a high conductivity in spite of an extremely thin thickness (in the order of tens to the order of-hundreds of Å) in terms of the doping efficiency of the dopant. In particular, it is preferable that the content of hydrogen in the p-type layer is smaller than that in the n-type layer to realize excellent film quality because the p-type layer usually has a lower doping efficiency in comparison to that of the n-type layer.

The i-type layer adaptable to the present invention is preferably deposited by an RF plasma CVD method. In particular, a charge-coupled type RF plasma CVD method is suitable. If the RF plasma CVD method is employed, the optimum temperature of the substrate in the deposition chamber is from 100° to 350° C., the pressure is from 0.1 to 10 Torr, the RF power is from 0.05 to 1.0 $W/cm^2$, and the deposition speed is from 0.01 to 3 nm/sec.

Materials and their quantities for controlling the characteristics and the conductivity type of the i-type layer and the i-type interface layer and the raw material gases for use at the time of the deposition are determined similarly to those used to form the i-type layer of the photovoltaic device when the method according to the present invention is described. The remaining structural elements of the photovoltaic device according to the present invention are described above.

A method of continuously manufacturing the photovoltaic device according to the present invention will now be described in detail.

By manufacturing the photovoltaic devices by employing the continuous manufacturing method according to the present invention, the foregoing problems can be overcome and the requirements can be satisfied. Furthermore, photovoltaic devices exhibiting high quality, uniformity, and reduced defects can be manufactured on an elongated member that is being continuously moved.

The method of continuously manufacturing the photovoltaic devices according to the present invention will now be described sequentially.

Figure 20:
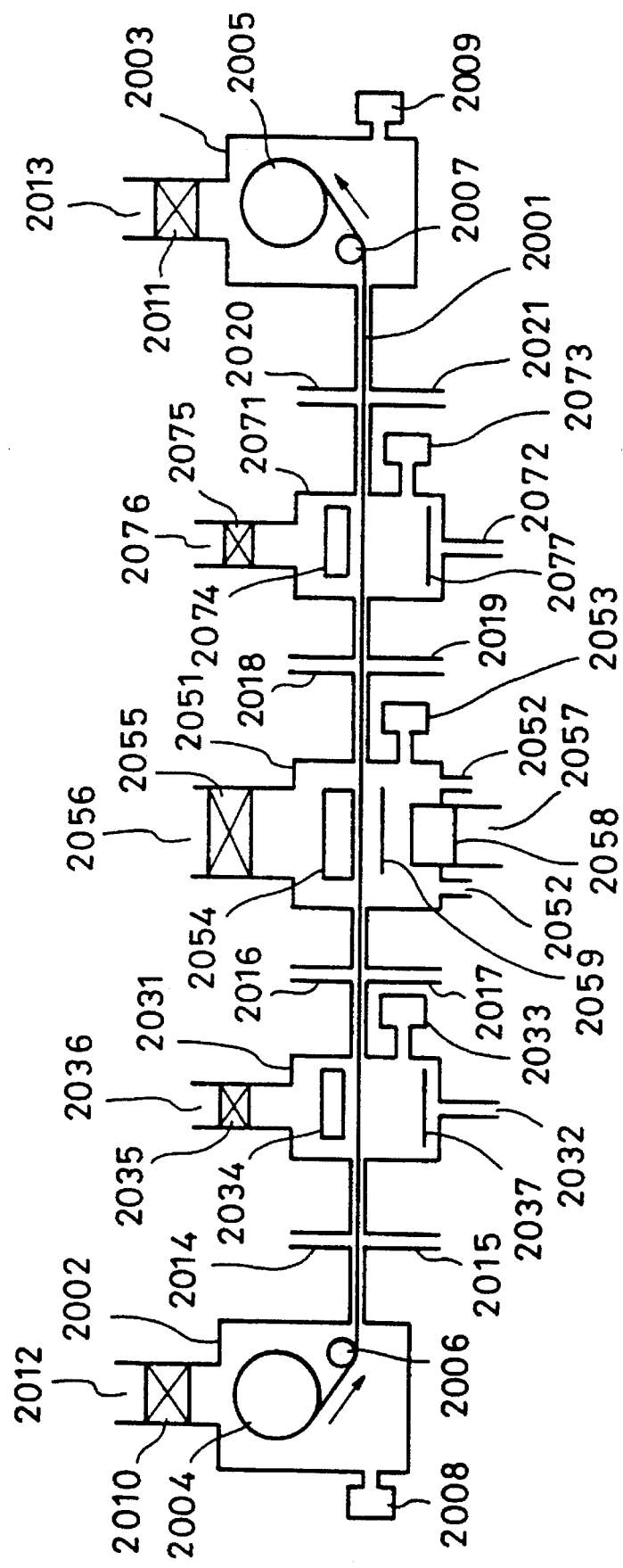
FIG. 20 is a schematic view which illustrates an example of an apparatus for continuously manufacturing photovoltaic devices adapted to a continuous manufacturing method according to the present invention.
Figure 21:
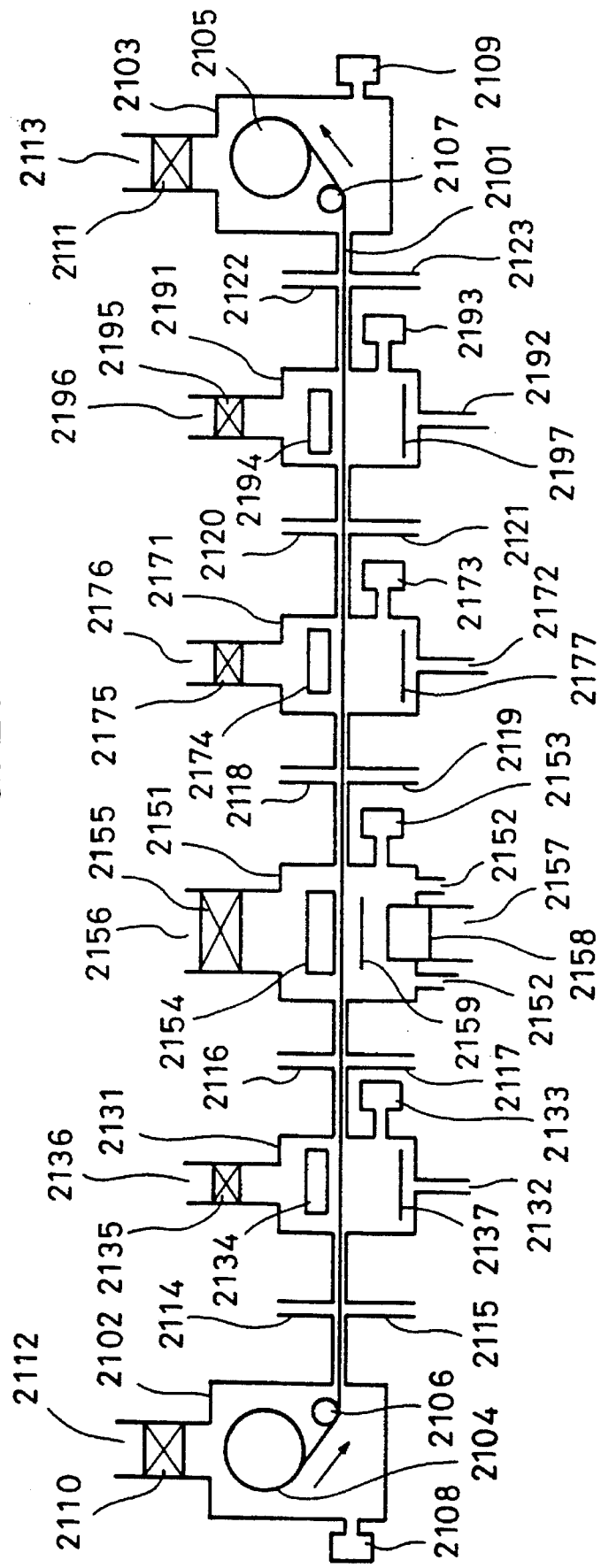
FIG. 21 is a schematic view which illustrates another example of an apparatus for continuously manufacturing photovoltaic devices adapted to a continuous manufacturing method according to the present invention.

FIGS. 20 and 21 are schematic views which illustrate typical examples of a manufacturing apparatus adapted to the method of continuously manufacturing the photovoltaic device according to the present invention.

The manufacturing apparatus adapted to the method of continuously manufacturing the photovoltaic devices according to the present invention is composed of the following chambers connected by gas gates: vacuum chambers 2002 and 2003 for delivering and winding up an elongated member 2001, a vacuum chamber 2031 for depositing a first-conductivity-type layer, a vacuum chamber 2051 for depositing an i-type layer, and a vacuum chamber 2071 for depositing a second conductivity type layer. Reference numeral 2004 represents a bobbin for delivering the elongated member, 2005 represents a bobbin for winding the elongated member so that the elongated member is moved in the direction designated by the arrow. The direction of the movement may, of course, be reversed. The vacuum chambers 2002 and 2003 may include means for winding and delivering synthetic paper for use to protect the surface of the protection member. The synthetic paper ray be made of polyimide or Teflon resin that is a heat-resisting resin or glass wool. Reference numerals 2006 and 2007 represent conveyance rollers for both adjusting the tension and positioning the elongated member. Reference numerals 2008 and 2009 represent pressure gauges, and 2010 and 2011 represent conductance (butterfly type) valves. Reference numerals 2012 and 2013 represent exhaust pipes respectively connected to exhaust pumps (omitted from illustration). Reference numerals 2014 to 2021 represent gate-gas introduction pipes, and 2032, 2052, and 2072 represent gas introduction pipes respectively connected to a gas supply system (omitted from illustration). Reference numerals 2033, 2053, and 2073 represent gauges, and 2034, 2054, and 2074 represent heaters. Reference numerals 2035, 2055, and 2075 represent conductance (butterfly type) valves, and 2036, 2056, and 2076 represent exhaust pipes respectively connected to exhaust pumps (omitted from illustration). Reference numerals 2037 and 2077 represent cathode electrodes respectively connected to an RF power source and a matching box (omitted from illustration). Reference numeral 2057 represents a waveguide portion, and 2058 represents a dielectric window connected to a microwave power source (omitted from illustration) via a waveguide pipe (omitted from illustration). Reference numeral 2059 represents a bias electrode connected to a bias power source (omitted from illustration).

The manufacturing apparatus adapted to the continuous manufacturing method according to the present invention and shown in FIG. 21 is constituted by connecting the following chambers by means of gas gates: vacuum chambers 2102 and 2103 for delivering and winding an elongated member 2101, a vacuum chamber 2131 for depositing a first-conductivity-type layer, a vacuum chamber 2151 for depositing an i-type layer, a vacuum chamber 2171 for depositing an i-type interface layer, and a vacuum chamber 2191 for depositing a second conductivity type layer. Reference numeral 2104 represents a bobbin for delivering the elongated member, and 2105 represents a bobbin for winding the elongated member so that the elongated member can be moved in the direction designated by the arrow. The direction of the movement may, of course, be reversed. The vacuum chambers 2102 and 2103 may include means for winding and delivering synthetic paper for use to protect the surface of the elongated member. Reference numerals 2106 and 2107 represent conveyance rollers for both adjusting the tension and locating the elongated member. Reference numerals 2108 and 2109 represent pressure gauges, 2110 and 2111 represent conductance (butterfly) type valves, and 2112 and 2113 represent exhaust pipes respectively connected to exhaust pumps (omitted from illustration). Reference numerals 2114 to 2123 represent gate-gas introduction pipes, and 2132, 2152, 2172, and 2192 represent gas introduction pipes respectively connected to a gas supply system (omitted from illustration). Reference numerals 2133, 2153, 2173, and 2193 represent pressure gauges, and 2134, 2154, 2174, and 2194 represent heaters. Reference numerals 2135, 2155, 2175, and 2195 represent conductance (butterfly) valves, and 2136, 2156, 2176, and 2196 represent exhaust pipes respectively connected to exhaust pumps (omitted from illustration). Reference numerals 2137, 2177, and 2197 represent cathode electrodes respectively connected to an RF power source and a matching box (omitted from illustration). Reference numeral 2157 represents a waveguide portion, and 2158 represents a dielectric window connected to a microwave power source (omitted from illustration) via a waveguide pipe (omitted from illustration). Reference numeral 2159 represents a bias power source connected to a bias power source (omitted from illustration).

The material of the elongated member adaptable to the method of continuously manufacturing the photovoltaic devices according to the present invention is a material that is not easily deformed or strained at the temperature required at the time of manufacturing the semiconductor film, such as a-Si film, and has desired strength and conductivity. Specifically, it is exemplified by: a thin metal plate made of stainless steel or aluminum or their alloys, iron or its alloys, copper or its alloys, or their combinations, and material, the base of which is any one of the foregoing materials, and which given a surface coating treatment with a different-type metal thin film and/or an insulating thin film made of $SiO_2$, $Si_3N_4$, $Al_2O_3$, or AlN by a sputtering method, an evaporation method of a plating method, a heat-resisting resin sheet made of polyimide, polyamide, polyethylene terephthalate, epoxy resin, or a combined member composed of any one of the foregoing materials and glass fiber, carbon fiber, boron fiber or metal fiber, and a metal or a metal alloy and transparent conductive oxide (TCO) applied by plating, evaporating, sputtering, or other type of coating.

It is preferable that the thickness of the elongated member is minimized in terms of cost, accommodation space reduction, and strength. Specifically, it is from 0.01 mm to 5 mm thick, preferably 0.02 mm to 2 mm, and most preferably 0.05 mm to 1 mm. In the case of a thin plate is made of, for example, metal, the desired strength can easily be obtained even if the thickness is quite thin.

The width of the elongated member is not limited, and it is determined by the means for depositing the semiconductor film, e.g. the size of the chamber for depositing the same. The length of the elongated member is not limited, and it may be of a length such that it can be wound to form a roll, or it may be a long length obtained by welding together a plurality of elongated members.

If the elongated member is made of an electrically conductive member such as metal, it may be formed into an electrode by which the electric current is outputted. If the same is made of an electrically insulating material such as synthetic resin, it is preferable that a current conducting electrode is previously formed on the surface on which the semiconductor film is to be formed, the electrode being made of metal such as Al, Ag, Pt, Au, Ni, Ti, Mo, W, Fe, V, Cr, Cu, stainless steel, brass, nichrome, $SnO_2$, $In_2O_3$, ZnO, $SnO_2+In_2O_3$ (ITO) or the like, their alloys or a transparent conductive oxide (TCO), by a surface coating method such as plating, evaporating or sputtering or the like.

If the elongated member is made of non-light-transmissive material such as metal, it is preferable that a reflective and conductive film is formed on the elongated member in order to improve the reflectance of long-wave light on the substrate. The reflective and conductive film is preferably made of Ag, Al, Cr or the like.

In order to prevent mutual diffusion of component elements between the material of the substrate and that of the semiconductor film or to prevent short circuits, it is preferable to form a buffer layer comprising a reflecting and conductive film made of a metal layer or the like on the surface of the substrate on which the semiconductor film is formed. The buffer layer is preferably made of ZnO.

If the solar cell has an arrangement wherein the elongated member is relatively transparent and light is applied from the side of the elongated member, it is preferable to previously form the foregoing transparent and conductive oxide or the conductive thin film such as the thin metal film by deposition.

In the method of continuously manufacturing the photovoltaic devices according to the present invention, a gas gate means is employed for the purpose of separating the vacuum chamber for delivering and winding the elongated member from the vacuum chamber for depositing the semiconductor film and continuously conveying the elongated member between them. The gas gate means must be capable of preventing diffusion of the ambient atmosphere, such as the raw material gas used for depositing the semiconductor film, by the pressure difference generated between chambers.

Figure 22:
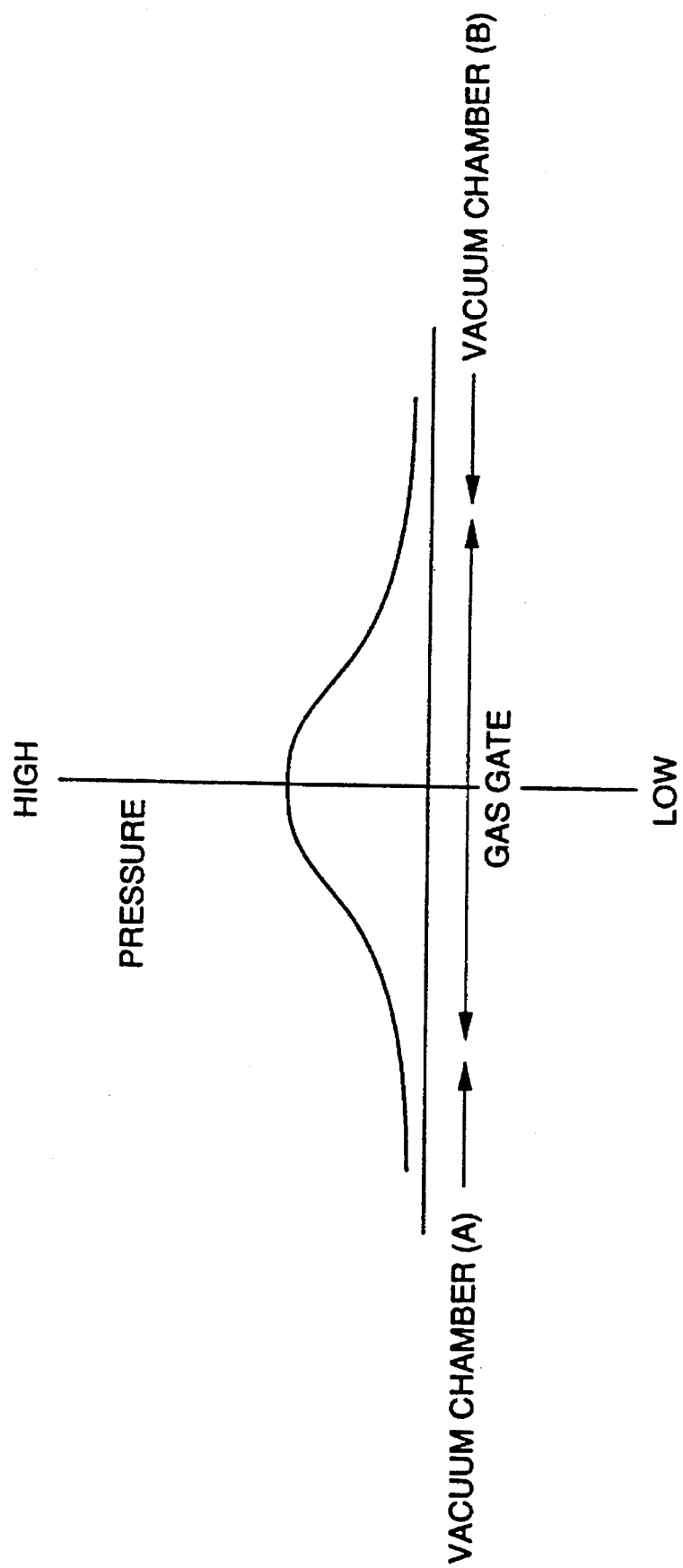
FIG. 22 is a schematic view which illustrates the pressure variation of a gas gate means adaptable to the present invention.

Therefore, the basic idea of a gas gate means disclosed in U.S. Pat. No. 4,438,723 can be employed. However, its performance must be improved. Specifically, the gas gate means must withstand a pressure difference of about $10^6$ times. As the exhaust pump, it is preferable to employ an oil diffusion pump, a turbo molecular pump, a mechanical booster pump, or the like. The gas gate has a slit, or the like, of cross sectional shape and its dimensions are calculated and designed by employing an ordinary conductance expression to correspond to the overall length of the gas gate and the performance of the exhaust pump. Furthermore, it is also preferable that a gate gas is used in order to improve the separation performance. The gate gas is exemplified by a rare gas such as Ar, He, Ne, Kr, Xe or Rn gas or a dilution gas for depositing the semiconductor, such as $H_2$ gas. The flow rate of the gate gas is arbitrarily determined in relation to the overall conductance of the gas gate and the performance of the exhaust pump to substantially realize the pressure inclination shown in FIG. 22. Since the highest pressure point is present at the substantially central portion of the gas gate as shown in FIG. 22, the gate gas flows from the central portion of the gas gate to the two terminal vacuum chambers. Therefore, the mutual gas diffusion between the two terminal chambers can be minimized. Actually, a mass analyzing meter is used to measure the quantity of diffused gas or to analyze the composition of the semiconductor film so that the optimum conditions are determined.

FIGS. 23 and 24 are schematic views which illustrate typical examples of other photovoltaic devices manufactured by the method according to the present invention.

The example shown in FIG. 23A comprises an elongated substrate member 2301, a lower electrode 2302, a first-conductivity-type layer 2303, and i-type layer 2304, a second-conductivity-type layer 2305, an upper electrode 2306, and a collecting electrode 2307.

The example shown in FIG. 23B is so-called tandem-type photovoltaic device having an arrangement wherein two photovoltaic devices 2311 and 2312 are stacked, each using as the i-type layers, two types of semiconductor layers having different band gap and/or thickness. The tandem type photovoltaic device comprises an elongated substrate member 2301, a lower electrode 2302, a first-conductivity-type layer 2303, an i-type layer 2304, a second-conductivity-type layer 2308, a first-conductivity-type layer 2309, an i-type layer 2310, a second-conductivity-type layer 2305, an upper electrode 2306, and a collecting electrode 2307.

The example shown in FIG. 23C is a so-called triple-type photovoltaic device having an arrangement wherein three photovoltaic devices 2316, 2317, and 2318 are stacked, each using as the i-type layers, three types of semiconductor layers having different band gap and/or thickness. The triple-type photovoltaic device comprises an elongated substrate member 2301, a lower electrode 2302, a first-conductivity-type layer 2303, an i-type layer 2304, a second-conductivity-type layer 2308, a first-conductivity-type layer 2309, an i-type layer 2310, a second-conductivity-type layer 2313, a first-conductivity-type layer 2314, an i-type layer 2315, a second-conductivity-type layer 2305, an upper electrode 2306, and a collecting electrode 2307.

Figure 24A:
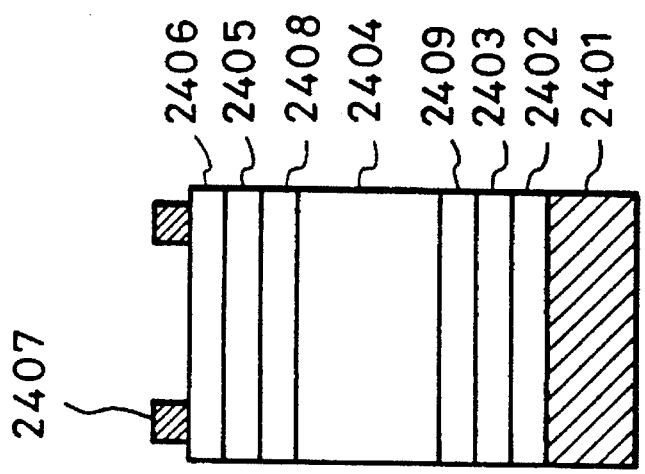

The example shown in FIG. 24A comprises an elongated substrate member 2401, a lower electrode 2402, a first-conductivity-type layer 2403, an i-type layer 2404, an i-type interface layer 2408, a second-conductivity-type layer 2405, an upper electrode 2406, and a collecting electrode 2407.

Figure 24B:
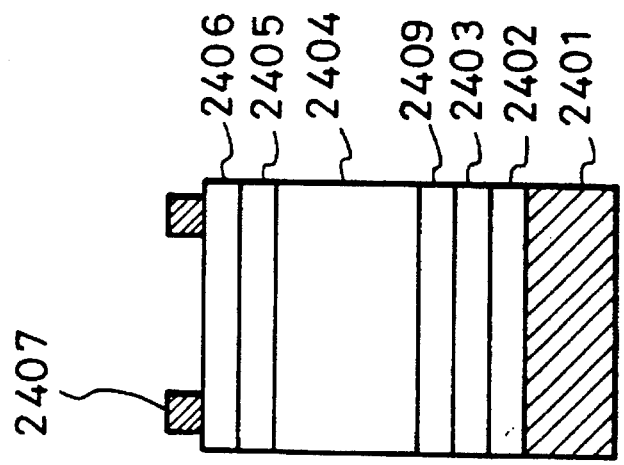

The example shown in FIG. 24B comprises an elongated substrate member 2401, a lower electrode 2402, a first-conductivity-type layer 2403, an i-type interface layer 2409, an i-type layer 2404, a second-conductivity-type layer 2405, an upper electrode 2406, and a collecting electrode 2407.

Figure 24C:
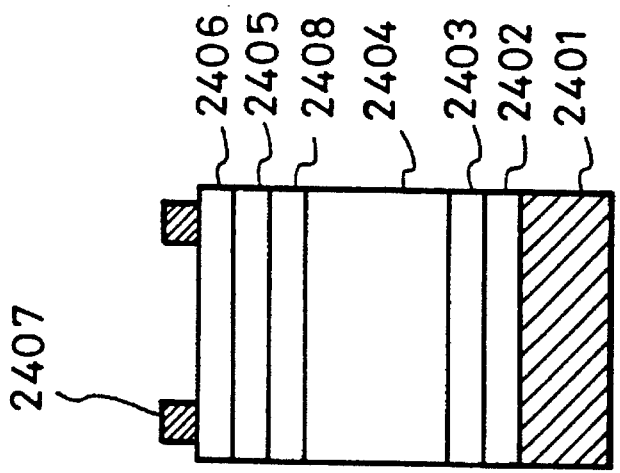

The example shown in FIG. 24C comprises an elongated substrate member 2401, a lower electrode 2402, a first-conductivity-type layer 2403, an i-type interface layer 2409, an i-type layer 2404, an i-type interface layer 2408, a second-conductivity-type layer 2405, an upper electrode 2406, and a collecting electrode 2407.

The example shown in FIG. 24D is a so-called tandem-type photovoltaic device having an arrangement wherein two photovoltaic devices 2414 and 2415 are stacked, each using as the i-type layers, two types of semiconductor layers having different band gap and/or thickness. The tandem type photovoltaic device comprises an elongated substrate member 2401, a lower electrode 2402, a first-conductivity-type layer 2403, an i-type layer 2404, an i-type interface layer 2408, a second-conductivity-type layer 2410, a first-conductivity-type layer 2411, an i-type layer 2412, and i-type interface layer 2413, a second-conductivity-type layer 2405, an upper electrode 2406 and a collecting electrode 2407.

The example shown in FIG. 24E is a so-called tandem-type photovoltaic device having an arrangement wherein two photovoltaic devices 2414 and 2415 are stacked, each using as the i-type layers, two types of semiconductor layers having different band gap and/or thickness. The tandem type photovoltaic device comprises an elongated substrate member 2401, a lower electrode 2402, a first-conductivity-type layer 2403, an i-type interface layer 2409, an i-type layer 2404, an i-type interface layer 2408, a second-conductivity-type layer 2410, a first-conductivity-type layer 2411, an i-type layer 2412, an i-type interface layer 2413, a second-conductivity-type layer 2405, an upper electrode 2406 and a collecting electrode 2407.

The example shown in FIG. 24F is a so-called triple-type photovoltaic device having an arrangement wherein three photovoltaic devices 2420, 2421 and 2422 are stacked, each using as the i-type layers, three types of semiconductor layers having different band gap and/or thickness. The triple-type photovoltaic device comprises an elongated substrate member 2401, a lower electrode 2402, a first-conductivity-type layer 2403, an i-type layer 2404, an i-type interface layer 2408, a second-conductivity-type layer 2410, a first-conductivity-type layer 2411, an i-type layer 2412, an i-type interface layer 2413, a second-conductivity-type layer 2416, a first-conductivity-type layer 2417, an i-type layer 2418, an i-type interface layer 2419, a second-conductivity-type layer 2405, an upper electrode 406, and a collecting electrode 2407.

The structure of the foregoing photovoltaic devices will now be described.

Elongated Member

It is preferable that the elongated substrate member according to the present invention is made of flexible material having conductivity or electrically insulating characteristics. Although it may be light transmissive or non-transmissive, it must, of course, be light-transmissive in a structure in which light is irradiated from the portion adjacent to the elongated member.

Specifically, the foregoing elongated member may be employed so that the weight of the photovoltaic device to be manufactured can be reduced and strength of the same can be improved and space required to transport it can be reduced.

Electrode

The photovoltaic device according to the present invention may arbitrarily use electrodes adapted to the structure of the device. The electrodes are exemplified by the lower electrode, the upper electrode (the transparent electrode), and the collecting electrode. The "upper electrode" is an electrode disposed adjacent to the light incident portion, while the "lower electrode" is an electrode disposed to face the upper electrode while sandwiching the semiconductor layer. These electrodes will now be described.

(1) Lower Electrode

The lower electrode according to the present invention is disposed at different positions depending upon whether or not the foregoing elongated substrate member is light transmissive because it causes a difference in the surface that is irradiated with light for generating the photovoltaic force. If the elongated substrate member is made of material such as metal that is non-light-transmissive for example, light for generating the photovoltaic force is applied from a position facing the transparent electrode 2306 as shown in FIG. 23A.

Specifically, the lower electrode is disposed between the elongated substrate member and the i-type layer in the case of the structures shown in FIGS. 23 and 24. If the elongated substrate member is made of conductive material, the elongated member may serve as the lower electrode. In a case where the elongated substrate member is made of conductive material but has a large sheet resistance, the lower electrode may be disposed to serve as a low-resistance electrode for outputting the electric current or to raise the reflectance of the surface of the substrate for the purpose of effectively using incident light.

The material of the electrode is exemplified by a metal such as Ag, Au, Pt, Ni, Cr, Cu, Al, Ti, Zn, Mo, and W. The electrode is manufactured by forming a thin film of any one of the foregoing metals by vacuum evaporation, electron beam evaporation, sputtering, or the like. The thin metal film should not act as a resistance component to the output from the photovoltaic device.

It is preferable that the sheet resistance is 50 Ω or less, more preferably 10 Ω or less.

A buffer layer made of ZnO or the like for preventing short circuits and diffusion may be formed between the lower electrode and the first-conductivity-type layer. The purpose of the buffer layer is to prevent diffusion of metal elements constituting the lower electrode into the first-conductivity-type layer. It also causes a certain resistance value to be attained so as to prevent occurrence of short circuits between the lower electrode and the transparent electrode which sandwich the semiconductor layer due to defects such as pin holes, and to generate interoptical effects so as to trap incident light in the photovoltaic device.

(2) Upper Electrode (Transparent Electrode)

It is preferable that the transparent electrode has a light transmissivity of 85% or more for the purpose of permitting the semiconductor layer to effectively absorb light from the sun or a white fluorescent lamp. It is preferable in terms of electrical characteristics that the sheet resistance value is 100 Ω or less so as not to serve as a resistance component to the output from the photovoltaic device. The materials that have the foregoing characteristics are exemplified by a thin transparent film obtained by forming a metal oxide such as $SnO_2$, $In_2O_3$, ZnO, CdO, $Cd_2SnO_4$, ITO ($In_2O_3+SnO_2$) or a metal such as Au, Al or Cu into a very thin semitransparent film. Since the transparent electrode is stacked on the second-conductivity-type layer in the cases shown in FIGS. 23 and 24, a material that exhibits excellent adhesion with respect to it must be selected. The transparent electrode may be manufactured by a method selected from a group consisting of resistance heating evaporation, electron beam evaporation, sputtering, and spraying.

(3) Collecting Electrode

The collecting electrode according to the present invention is formed on the transparent electrode for the purpose of reducing the surface resistance value of the transparent electrode. The material of the electrode is exemplified by a metal such as Ag, Cr, Ni, Al, Ag, Au, Ti, Pt, Cu, Mo, W, and their alloys. The foregoing thin films may be stacked. The shape and area of the collecting electrode are determined t c sufficiently maintain the quantity of light incident on the semiconductor layer.

It is preferable that the shape of the collecting electrode is made uniform over the light receiving surface of the photovoltaic device and its area with respect to the light receiving area is 15% or less, preferably 10% or less.

The preferred sheet resistance value is 50 Ω or less, more preferably 10 Ω or less.

First and Second-Conductivity-Type Layer

If the conductivity type of the first or second-conductivity-type layer is n-type, Group VA atoms of the periodic table are suitable as the additives for the first or the second-conductivity-type layer. Among the foregoing atoms, the optimum elements are phosphorus (P), nitrogen (N), arsenic (As), and antimony (Sb).

If the conductivity type of the first or the second-conductivity-type layers is p-type, Group IIIA atoms of the periodic table are suitable as the additives for the first or the second-conductivity-type layer. Among the foregoing atoms, the optimum elements are boron (B), aluminum (Al), and gallium (Ga). It is preferable that the thickness of each of the first and the second-conductivity-type layer is from 1 nm to 50 nm, most preferably from 3 nm to 10 nm.

It is most suitable to use non-single-crystal silicon carbide for further reducing the light absorption in the conductive layer adjacent to the side irradiated with light.

i-type Layer and i-type Interface Layer

The non-single-crystal material that is used in the i-type layer and the i-type interface layer of the photovoltaic device according to the present invention and contains silicon atoms is exemplified by amorphous silicon (microcrystal silicon included). Among various amorphous silicon materials, amorphous silicon hydride and amorphous silicon hydride/halide are suitable materials.

In order to raise the open circuit voltage in the present invention, the non-single-crystal material of the i-type layer and the i-type interface layer is exemplified by amorphous silicon carbide (microcrystal silicon carbide included). In particular, the amorphous silicon carbide of hydride and halide types is suitable material.

In the present invention, in order to improve sensitivity with respect to long wavelengths and to increase the short-circuit current in the i-type layer and the i-type interface layer, a preferred non-single-crystal material is amorphous silicon germanium (microcrystal silicon germanium included). In particular, amorphous silicon germanium hydrides and halides are suitable materials.

The thickness of the i-type layer is an important parameter that determines the characteristics of the photovoltaic device according to the present invention. The preferred thickness of the i-type layer is from 100 nm to 1000 nm. The optimum thickness is from 200 nm to 600 nm. The thickness of the i-type interface layer also is an important parameter that determines the characteristics of the photovoltaic device according to the present invention. The preferred thickness is from 5 nm to 25 nm. Further, it is preferable that the thickness is in the foregoing range while considering the light absorption coefficient of the i-type layer and the spectrum of the light source.

The inventors of the present invention have developed an effective manufacturing method in which a pressure of 100 mTorr or lower is used to perform an RF glow discharge to deposit the first and the second-conductivity-type layers and the i-type interface layer and another method in which a pressure of 50 mTorr or lower is used to perform a microwave glow discharge while applying a bias so that photovoltaic devices having uniform characteristics and having a reduced number of defects are mass-produced. Although the mechanism by which the foregoing effects can be obtained has not been clarified yet, it can be considered as follows: the foregoing relationship in terms of the pressure difference between the vacuum chambers for the first and second conductivity-types and the vacuum chamber for the i-type layer optimizes the balance of the flows of the gate gas among the vacuum chambers and the gas gates; the application of the bias at the time of manufacturing the i-type layer, in addition to the effect of the balanced flows, stabilizes the glow discharge in each of the vacuum chambers for manufacturing the semiconductors over a long time period; and the surface state of each semiconductor layer is satisfactorily achieved at the time of passing through the gas gate; so that the interfaces between the semiconductor layers are uniformly and stably formed, resulting in an improvement in the state of the junction.

The material of the gas for manufacturing the first-conductivity-type layer, the i-type layer, the i-type interface layer and the second-conductivity-type layer that can be adapted to the RF and the microwave glow discharge decomposition method is exemplified by the following materials. The raw material gas for supplying Si in the present invention is exemplified by silicon hydride (silane) that is a gas or can be gasified, such as $SiH_4$, $Si_2H_6$, $Si_3H_8$, and $Si_4H_{10}$. In particular, $SiH_4$ or $Si_2H_6$ are suitable materials for a simple layer manufacturing operation and excellent efficiency in supplying Si.

The raw material gas for supplying halogen atoms for use in the present invention is exemplified by various halogen compounds. For example, halogen gas, halides, interhalogen compounds, and silane derivatives substituted with halogen and either in a gaseous state or which can be gasified may be employed.

Also, a compound composed of silicon atoms and halogen atoms in the gaseous state or a silicon compound that can be gasified and that contains halogen atoms may be used as a raw material in the present invention.

The preferred halogen containing material to be employed in the present invention is exemplified by, for example, fluorine, chlorine, bromine, iodine, and interhalogen compounds such as $BrF$, $ClF$, $ClF_3$, $BrF_5$, $BrF_3$, $IF_3$, $IF_7$, $ICl$, and $IBr$.

The silicon compound contained halogen atoms, that is, a silane derivative substituted with halogen atoms is exemplified by silicon halides such as $SiF_4$, $Si_2F_6$, $SiCl_4$, and $SiBr_4$.

The foregoing halogen compounds or silicon compounds containing halogen atoms can be employed in the present invention as the raw material gas for supplying halogen atoms. Furthermore, halides which are in the gaseous state, or which can be gasified and which contain a hydrogen atom as a component may be employed to prepared the raw material gas, the halides being exemplified by hydrogen halides such as HF, HCl, HBr, and HI; and silicon hydrides substituted with halogen such as $SiH_3F$, $SiH_2F_2$, $SiHF_3$, $SiH_2I_2$, $SiH_2Cl_2$, $SiHCl_3$, $SiH_2Br_2$, and $SiHBr_3$.

The halide containing hydrogen atoms supplies hydrogen atoms that are significantly effective in controlling the electrical or photoelectric characteristics of the layers, the hydrogen atoms being supplied simultaneously with the supply of halogen atoms. Therefore, they can be employed in the present invention as preferred raw material gases for supplying halogen atoms.

In addition to the above materials, the raw material gas for supplying hydrogen atoms is exemplified by silicon hydrides such as $H_2$, $SiH_4$, $Si_2H_6$, $Si_3H_8$, and $Si_4H_{10}$.

The gas for supplying germanium for use in the present invention is exemplified by: germanium hydrides typified by $Ge_4H_4$, $Ge_2H_6$, $Ge_3H_8$, $Ge_4H_{10}$, $Ge_5H_{12}$, $Ge_6H_{14}$, $Ge_7H_{16}$, $Ge_8H_{18}$, and $Ge_9H_{20}$; germanium hydride halides such as $GeHF_3$, $GeH_2F_2$, $Ge_3F$, $GeHCl_3$, $GeH_2C_{12}$, $GeH_3Cl$, $GeHBr_3$, $GeH_2Br_2$, $GeH_3Br$, $GeHI_3$, $GeH_2I_2$, and $GeH_3I$; and germanium halides such as $GeF_4$, $GeCl_4$, $GeGr_4$, $GeI_4$, $GeF_2$, $GeCl_2$, $GeGr_2$, and $GeI_2$.

The compound containing carbon atoms for use as the raw material gas for supplying carbon atoms is exemplified by saturated hydrocarbons having 1 to 4 carbon atoms, ethylenic hydrocarbons having 2 to 4 carbon atoms and acetylenic hydrocarbons having 2 to 3 carbon atoms.

The saturated hydrocarbons are exemplified by methane ($CH_4$), ethane ($C_2H_6$), propane ($C_3H_8$), n-buthane (n-$C_4H_{10}$) and pentane ($C_5H_{12}$). The ethylenic hydrocarbons are exemplified by ethylene ($C_2H_4$), propylene ($C_3H_6$), butene-1 ($C_4H_8$), butene-2 ($C_4H_8$), isobuthylene ($C_4H_8$), and pentene ($C_5H_{10}$). The acetylenic hydrocarbons are exemplified by acetylene ($C_2H_2$), methylacetylene ($C_3H_4$) and butyne ($C_4H_6$).

The raw material gas containing Si, C, and H as the components thereof is exemplified by alkyl silicides such as $Si(CH_3)_4$ and $Si(C_2H_4)_4$.

In the case where glow discharge is employed to manufacture a layer containing group III atoms or group V atoms, the raw material gas for manufacturing the foregoing layer is obtained by adding material for supplying group III atoms or group V atoms to one of the foregoing starting materials selected for supplying silicon atoms. The material for supplying group III atoms or group V atoms may be a material that is obtained by gasifying a material which contains group III atoms or group V atoms as components thereof and which is in a gaseous state or which can be gasified. The materials for supplying group III atoms such as boron atoms are typified by boron hydrides such as $B_2H_6$, $B_4H_{10}$, $B_5H_9$, $B_5H_{11}$, $B_6H_{10}$, $B_6H_{12}$, and $B_6H_{14}$ or boron halides such as $BF_3$, $BCl_3$, and $BBr_3$. Additionally, $AlCl_3$, $GaCl_3$, $INCl_3$, and $TlCl_3$ may be employed.

The material for supplying group V atoms to be employed in the present invention is exemplified by phosphorus hydrides such as $PH_3$ or $P_2H_4$ and the following other materials: $PH_4I$, $PF_3$, $PF_5$, $PCl_3$, $PCl_5$, $PBr_3$, $PBr_5$, $PI_3$, $AsH_3$, $AsF_3$, $AsCl_3$, $AsBr_3$, $AsF_5$, $SbH_3$, $SbF_3$, $SbF_5$, $SbCl_3$, $SbCl_5$, $BIH_3$, $BiCl_3$, $BiBr_3$, $N_2$, $NH_3$, $H_2NNH_2$, $HN_3$, $HN_4N_3$, $F_3N$, and $F_4N_2$.

Gases for supplying oxygen atoms for use in the present invention are exemplified by oxygen ($O_2$), ozone ($O_3$), nitrogen monoxide (NO), nitrogen dioxide ($NO_2$), dinitrogen monoxide ($N_2O$), nitrogen sesquioxide ($N_2O_3$), nitrogen tetroxide ($N_3O_4$), dinitrogen pentoxide ($N_2O_5$), nitrogen trioxide ($NO_3$), and a lower siloxane containing silicon (Si), oxygen (O) and hydrogen atoms (H), exemplified by disiloxane ($H_3SiOSiH_3$) and trisiloxane ($H_3SiOSiH_2OSiH_3$).

The gas for supplying nitrogen atoms for use in the present invention is exemplified by nitrogen, nitrides and nitrogen compounds such as an azide which is in a gaseous state or which can be gasified, for example, nitrogen ($N_2$), ammonia ($NH_3$), hydrazine ($H_2NNH_2$), hydrogen azide ($HN_3$) and ammonium azide ($NH_4N_3$). Furthermore, nitrogen halides such as nitrogen trifluoride ($F_3N$) or nitrogen tetrafluoride ($F_4N_2$) may also be employed for supplying halogen atoms in addition to nitrogen atoms.

The method of forming the deposited film, the photovoltaic device, and the method of continuously forming the photovoltaic devices according to the present invention will now be described in detail. However, it should be noted that the present invention is not limited to the description below.

EXAMPLE 1

First, the DC magnetron sputtering apparatus shown in FIG. 3 was used to form a silver (Ag) light reflecting layer on a substrate.

Referring to FIG. 3, reference numeral 302 represents a stainless-steel (SUS430) substrate formed by subjecting a 50 mm×50 mm plate having a thickness of 1.0 mm to a mirror surface polishing. The substrate 302 was ultrasonic-cleaned with acetone ($CH_3OCH_3$) for ten minutes and with isopropanol ($CH_3CHOHCH_3$) for ten minutes, followed by drying it at 80° for 30 minutes. Reference numeral 304 represents a silver (Ag) target of 99.999% purity, the target 304 being insulated from the deposition chamber 301 by means of an insulating supporting member 305. Reference numerals 314 and 315 represent gas introduction valves respectively connected to an argon (Ar) cylinder (purity 999.9999%) and an oxygen cylinder purity 99.999%) (omitted from illustration).

First, gas in the deposition chamber 301 was exhausted by a vacuum pump (omitted from illustration) until the vacuum gauge 312 indicated a pressure level of about $1 \times 10^{-6}$ Torr, followed by gradually opening the gas introduction valve 314 while using the mass flow controller 316 to set the flow rate of the Ar gas at 10 sccm. Then, the degree of opening of the (butterfly type) conductance valve 313 was adjusted while observing the vacuum meter 312 to set the pressure in the deposition chamber 301 at 8 mTorr. Then, the voltage of a DC power source 306 was set to −400 V, followed by supplying DC power to the target 304, so that DC glow discharge was generated. After 5 minutes, the shutter 307 was opened to start forming a light reflecting layer on the substrate 302 to a thickness of 0.3 μm. At this time, the shutter 307 was closed, and the output from the DC power source was turned off, so that the DC glow discharge was stopped. Then, the gas introduction valve 314 was closed to stop introduction of the Ar gas into the deposition chamber 301.

Then, a light reflection enhancing layer made of zinc oxide (ZnO) was formed on the Ag light reflecting layer. Referring to FIG. 3, reference numeral 308 represents a target made of zinc oxide (ZnO) of 99.99% purity, the target 308 being insulated from the deposition chamber 301 by an insulating supporting member 309. The heater 303 was set to raise the temperature of the substrate to 350° C. When the substrate 302 was sufficiently heated, the gas introduction values 314 and 315 were gradually opened, while adjusting the mass flow controllers 316 and 317 to set the flow rate of the Ar gas at 2 sccm and that of the $O_2$ gas at 1 sccm. In order to set the pressure in the deposition chamber 301, the degree of opening of the conductance value 313 was adjusted. Then, the voltage of a DC power source 310 was set to −400 V, followed by supplying DC power to the ZnO target 308, so that DC glow discharge was generated. After 5 minutes, the shutter 311 was opened to form a ZnO light reflection enhancing layer on the Ag light reflection layer having a thickness of 1.0 μm. Then, the shutter 311 was closed, and the output from the DC power source was turned off, so that the DC glow discharge was stopped. The heater 303 was turned off. Then, the mass flow controller 316 was adjusted, so that the flow rate of the Ar gas was set at 100 sccm, and the conductance valve 313 was closed to gradually leak the gas out from the deposition chamber 301.

Then, the manufacturing apparatus composed of the raw material gas supply apparatus 1020 and the deposition apparatus 100 shown in FIG. 1A, adapted to the glow discharge decomposition method according to the present invention, was used to form the non-single-crystal silicon semiconductor layer on the light reflection enhancing layer.

Referring to FIG. 1A, the gas cylinders 1071 to 106 are filled with raw material gas for manufacturing the non-single-crystal silicon semiconductor layer according to the present invention. Reference numeral 1071 represents a $SiH_4$ gas (purity 99.999%) cylinder, 1072 represents a $H_2$ gas (purity 99.9999%) cylinder, 1073 represents a cylinder of $PH_3$ gas (purity 99.99% and hereinafter abbreviated to "$PH_3/H_2$") diluted with $H_2$ gas to 1%, 1074 represents a cylinder of $B_2H_6$ gas (purity 99.99% and hereinafter abbreviated to "$B_2H_6/H_2$") diluted with $H_2$ gas to 1%, 1075 represents a $CH_4$ gas (purity 99.9999%) cylinder, and 1076 represents a $GeH_4$ gas (purity 99.99%) cylinder. When the gas cylinders 1071 to 1076 were installed, the foregoing gases were previously introduced into the gas pipes arranged between the valves 1051 to 1056 and the introduction valves 1031 and 1036, followed by adjusting the pressure of the gases to about 2 Kg/cm² by the pressure adjusters 1061 to 1066.

First, the back side of the substrate 104, on which the light reflecting layer and the light reflection enhancing layer were formed, was placed in contact with the heater 105. Then, confirmation was made that the introduction valves 1031 to 1036 and the leak valve 109 of the deposition chamber 101 were closed. Another confirmation was made that the discharge valves 1041 to 1046 and the sub-valve 108 were opened. Then, the conductance (butterfly type) valve 107 was fully opened to exhaust the gas in the deposition chamber 101 and the gas pipes by means of a vacuum pump (omitted from illustration). When the vacuum gauge 106 showed a level about $1 \times 10^{-4}$ Torr, the sub-valve 108 and the discharge valves 1041 and 1046 were closed.

Then, the introduction valves 1031 to 1036 were gradually opened to introduce the gases into the mass flow controllers 1021 and 1026.

After the above preparation for forming the films was completed, n, i and p-type non-single-crystal silicon semiconductor layers were formed.

The n-type layer was formed as follows: the heater 105 was set to raise the temperature of the substrate 104 to 380° C. When the substrate was heated sufficiently, the sub-valve 108 and the discharge valves 1041 to 1043 were gradually opened to introduce $SiH_4$ gas, $H_2$ gas and $PH_3/H_2$ gas into the deposition chamber 101 through the gas introduction pipe 103.

At this time, the flow rate of the $SiH_4$ gas was set at 100 sccm, the $H_2$ gas at 100 sccm and the $PH_3/H_2$ gas at 300 sccm by adjusting the corresponding mass flow controllers 1021 to 1023. The pressure in the deposition chamber 101 was set at 30 mTorr by adjusting the degree of opening of the conductance valve 107 while observing the vacuum gauge 106.

Then, the output power of a μW power source (omitted from illustration) was set to 0.10 $W/cm^3$, followed by introducing the μW power into the deposition chamber 101 through the waveguide pipe, the waveguide portion 110 and the dielectric window 102 to generate the glow discharge. As a result, forming of the n-type layer on the light reflection enhancing layer was commenced. When the n-type layer had a thickness of 0.04 μm, the μW glow discharge was stopped. The introduction valves 1041 and 1043 were closed to stop the flows of the $SiH_4$ gas and the $PH_3/H_2$ gas into the deposition chamber 101. Thus, the n-type layer was formed. After $H_2$ gas was introduced into the deposition chamber 101 for 5 minutes, the discharge valve 1042 was closed and the gas in the deposition chamber 101 and the gas pipes was exhausted.

Then, the i-type layer was formed as follows: the heater 105 was set to maintain the temperature of the substrate 104 at 380° C. When the substrate was heated sufficiently, the discharge valves 1041 and 1042 were gradually opened to introduce $SiH_4$ gas and $H_2$ gas into the deposition chamber 101 through the gas introduction pipe 103. At this time, the flow rate of the $SiH_4$ gas was set at 200 sccm, and the $H_2$ gas at 100 sccm by adjusting the corresponding mass flow controllers 1021 and 1022. The pressure in the deposition chamber 101 was set at 5 mTorr by adjusting the degree of opening of the conductance valve 107 while observing the vacuum gauge 106. Then, the output power of a high frequency (RF) power source was set to 0.40 $W/cm^3$, followed by supplying the power to the bias rod 112. Then, the output of a μW power source (omitted from illustration) was set to introduce 0.20 $W/cm^3$ into the deposition chamber 101 through the waveguide pipe (omitted from illustration), the waveguide portion 110, and the dielectric window 102 to generate glow discharge. As a result, forming of the i-type layer on the n-type layer was commenced. When the i-type layer reached a thickness of 0.32 μm, the μW glow discharge was stopped and the output from the bias power source 111 was turned off. Thus, the i-type layer was formed. The discharge valve 1041 was closed to stop the flow of the $SiH_4$ gas into the deposition chamber 101. After $H_2$ gas was introduced into the deposition chamber 101 for 5 minutes, the discharge valve 1042 was closed and the gas in the deposition chamber 101 and the gas pipes was exhausted.

Then, the p-type layer was formed as follows: the heater 105 was set to maintain the temperature of the substrate 104 at 250° C. When the substrate was heated sufficiently, the discharge valves 1041, 1042 and 1044 were gradually opened to introduce $SiH_4$ gas, $H_2$ gas and $B_2H_6/H_2$ into the deposition chamber 101 through the gas introduction pipe 103. At this time, the flow rate of the $SiH_4$ gas was set at 10 sccm, the $H_2$ gas at 500 sccm, and the $B_2H_6/H_2$ gas at 5 sccm by adjusting the corresponding mass flow controllers 1021, 1022, and 1024. The pressure in the deposition chamber 101 was set at 20 mTorr by adjusting the degree of opening of the conductance valve 107 while observing the vacuum gauge 106. Then, the output of a μW power source (omitted from illustration) was set to introduce 0.40 $W/cm^3$ into the deposition chamber 101 through the waveguide pipe (omitted from illustration), the waveguide portion 110, and the dielectric window 102 to generate glow discharge. As a result, forming of the p-type layer on the i-type layer was commenced. When the p-type layer had a thickness of 0.01 μm, the glow discharge was stopped and the discharge valves 1041, 1042, 1044 and the sub-valve 108 were closed to stop gas introduction into the deposition chamber 101. Thus, the p-type layer was formed. The gas in the deposition chamber 101 and the gas pipe was sufficiently exhausted, followed by opening the leak valve 109 of the deposition chamber 101.

Then, ITO ($In_2O_3+SnO_2$) having a thickness of 0.08 μm was evaporated onto the p-type layer as the transparent electrode by using the resistance-heating vacuum evaporation apparatus shown in FIG. 4.

Referring to FIG.. 4, reference numeral 402 represents the foregoing substrate on which there are deposited the Ag reflecting layer, the ZnO reflection enhancing layer and the non-single crystal p-i-n type semiconductor layer. Reference numeral 404 represents a granular evaporation source of indium-tin alloy (In:Sn), the purity of which was 99.99%. Reference numeral 410 represents a gas introduction valve connected to an oxygen (99.999% purity) cylinder. First, gas in the deposition chamber 401 was exhausted by a vacuum pump (omitted from illustration). When the vacuum gauge 408 showed a pressure of about $1\times10^{-5}$ Torr, the heater 403 was set to raise the temperature to 160° C. When the substrate was heated sufficiently, the gas introduction valve 410 was gradually opened while using the mass flow controller 411 to set the flow rate of the oxygen gas at 30 sccm. The pressure in the deposition chamber 401 was set at about $3\times10^{-4}$ Torr by adjusting the opening of the conductance valve (butterfly) 409 while observing the vacuum gauge 408. Then, the AC power source 406 was turned on to heat and evaporate the evaporation source. After 5 minutes, the shutter 407 was opened to start forming of the transparent electrode on the p-type layer formed on the substrate 402, so that a transparent electrode having a thickness of 0.08 μm was formed. At this time, the shutter 407 was closed and the AC power source 406 and the power source for the heater were turned off. Thus, the vacuum evaporation was completed. Then, the gas introduction valve 410 was closed, and the gas in the deposition chamber 401 was exhausted by a vacuum pump (omitted for illustration). When the vacuum gauge 408 showed a pressure of about $1\times10^{-5}$ Torr, the leak valve 412 was opened to leak the deposition chamber 401.

Then, a comb-type collecting electrode made of chrome (Cr) and having a thickness of 10 μm was evaporated on the transparent electrode by the resistance heating vacuum evaporation apparatus.

Figure 5:
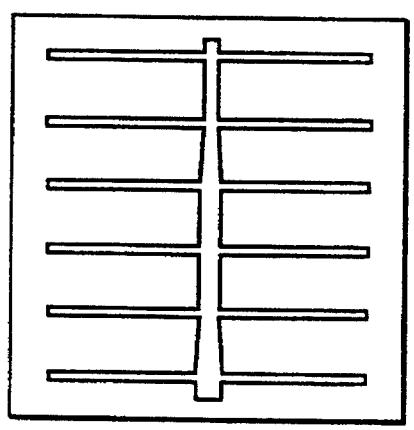
FIG. 5 is a schematic view which illustrates a mask for forming a comb-type collecting electrode.

First, a nickel mask as shown in FIG. 5 was placed on the surface on which the transparent electrode was formed, followed by bringing the reverse side of the laminate into contact with the heater as shown in FIG. 4. The source 404 was changed to a granular chrome (Cr) evaporation source 404 having a purity of 99.99% The gas in the deposition chamber 401 was exhausted by a vacuum pump (omitted from illustration). When the vacuum gauge 408 showed a pressure of about 1×10⁻⁵ Torr, the AC power source was turned on to heat and evaporate the evaporation source. After 5 minutes, the shutter 407 was opened to start forming of the comb-type collecting electrode on the transparent electrode. When the layer had a thickness of 10 μm, the shutter 407 was closed, followed by turning off the AC power source 406. Thus, the vacuum evaporation was completed. Then, a vacuum pump (omitted from illustration) was used to exhaust the gas. When the vacuum meter showed a level of about 1×10⁻⁵ Torr, the leak valve was opened to leak the decomposition chamber 401 and the substrate 402 was removed therefrom.

Thus, a non-single-crystal silicon semiconductor solar cell was manufactured, the solar cell being designated "Example 1".

Comparative Example 1-1

Figure 6:
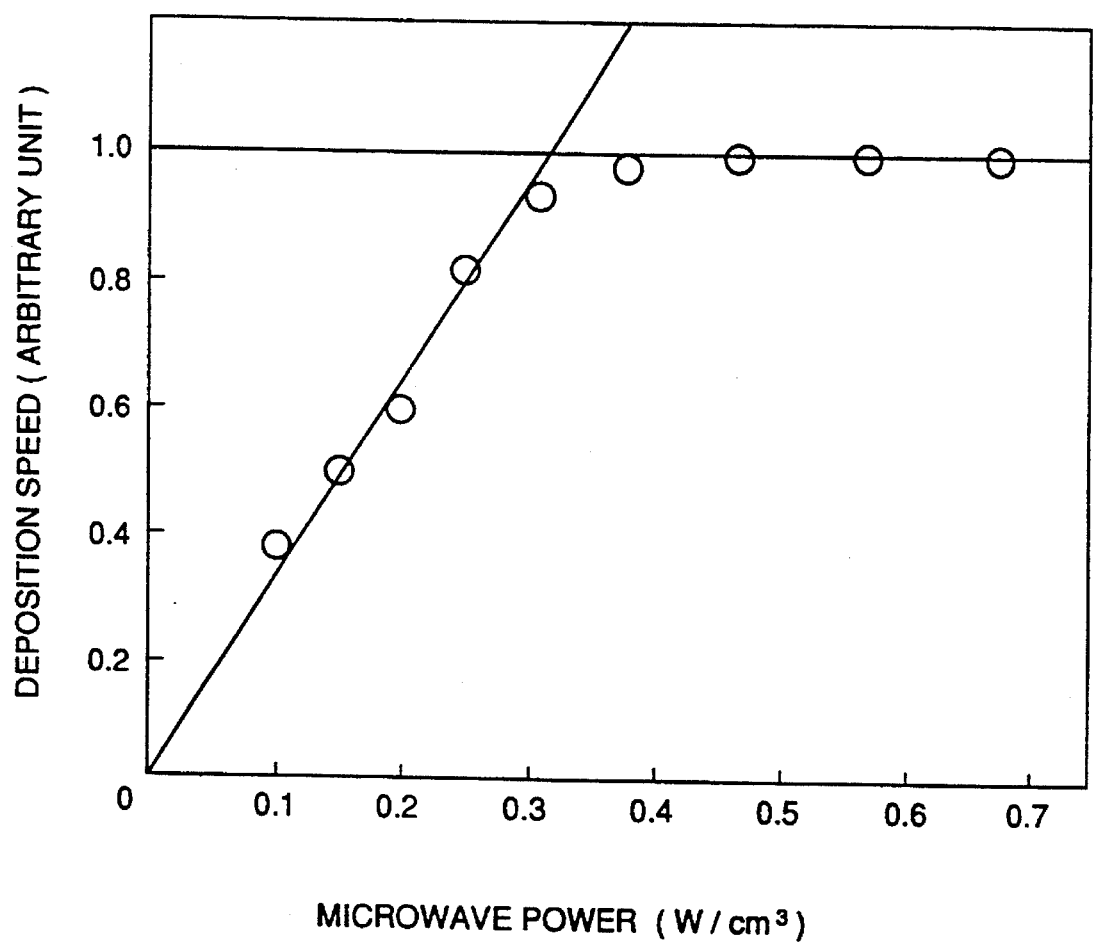
FIG. 6 is a graph which illustrates the relationship between microwave power and deposition speed.
Figure 7:
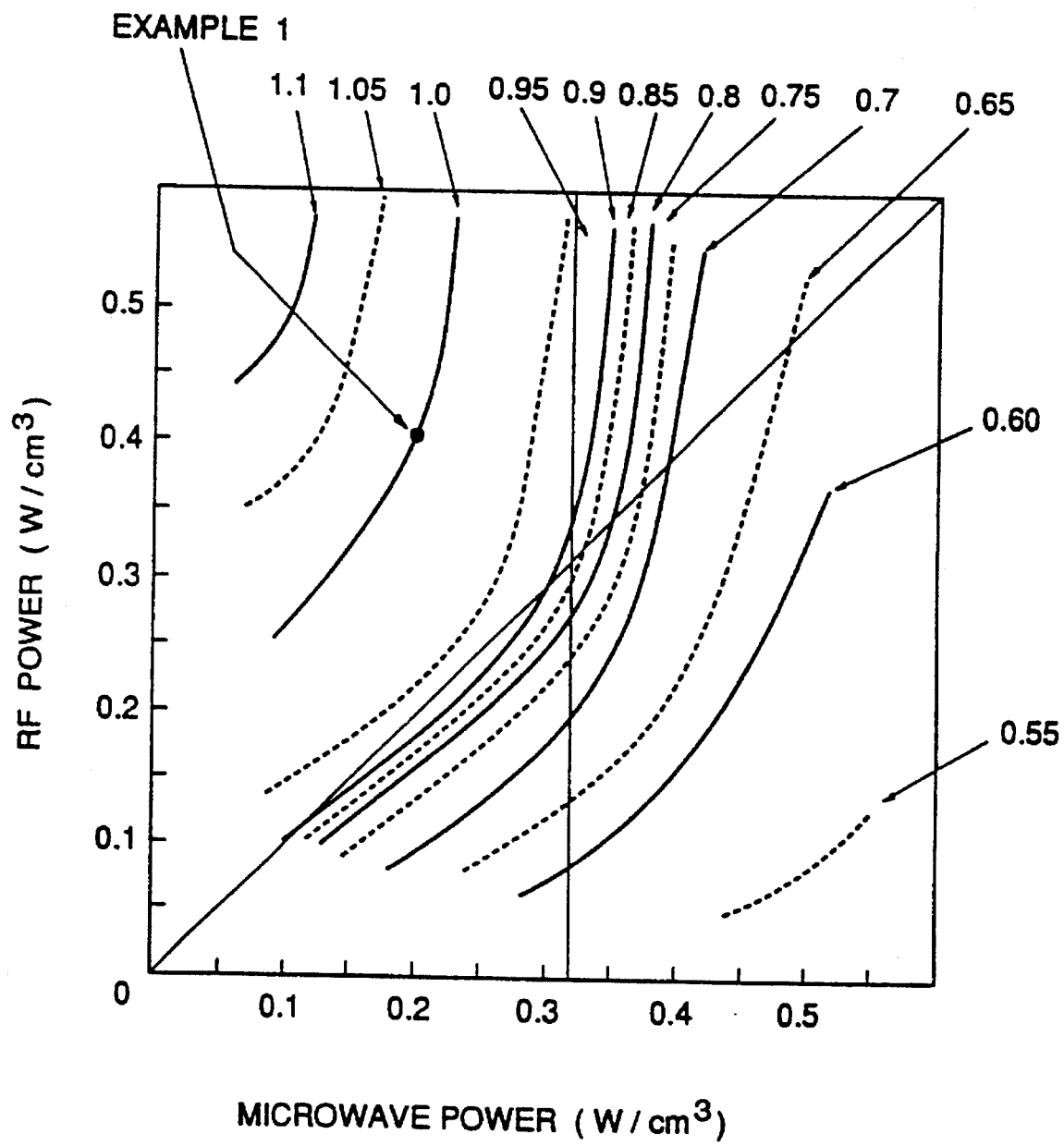
FIG. 7 is a graph which illustrates the dependency of the photoelectric conversion efficiency upon the microwave power and RF power.

The μW power and the RF power supplied during formation of the i-type layer were varied while the other conditions were the same as those according to Example 1, so that a non-single-crystal silicon semiconductor solar cell was manufactured. FIG. 6 illustrates the relationship between the μW power and the deposition speed, from which it was discovered that the deposition speed was not increased when the μW power was less than 0.32 W/cm³, and the $SiH_4$ raw material gas was completely decomposed. The photoelectric conversion efficiency η (the photovoltaic power of the solar cell/energy of incident light per unit period) of the solar cell realized by applying light of AM 1.5 (100 mW/cm²) was measured, resulting in the values shown in FIG. 7. The curve of FIG. 7 is an envelope showing the photoelectric conversion efficiency of each solar cell assuming that the photoelectric conversion efficiency according to Example 1 was 1. As can be seen from FIG. 7, the conditions where the μW power is less than the μW power (0.32 W/cm³ that completely decomposes $SiH_4$ gas and the RF power is larger than the μW power, significantly improve the photoelectric conversion efficiency η.

Comparative Example 1-2

The flow rate of the gas introduced into the deposition chamber 101 during forming of the i-type layer according to Example 1 was changed as follows: the flow rate of the $SiH_4$ gas was changed to 100 sccm; and the $H_2$ gas was not introduced. The other conditions were the same as those according to Example 1 and the Comparative Example 1-1, while varying the μW power and the RF power during forming of the non-single-crystal silicon semiconductor solar cell shown in FIG. 2.

The relationship between the μW power and the deposition speed was examined similarly to Example 1, resulting in that the deposition speed was not raised when the μW power was larger than 0.18 W/cm³, indicating that the $SiH_4$ raw material gas was completely decomposed with the foregoing power.

The photoelectric conversion efficiency η (the photovoltaic power of the solar cell/energy of incident light per unit period) of the solar cell realized by applying light of AM1.5 (100 mW/cm²) was measured, resulting in the same trends shown in FIG. 7. That is, the conditions, when the μW power is smaller than the μW power (0.18 W/cm²) that completely decomposes $SiH_4$ gas, and the RF power is larger than the μW power, the photoelectric conversion efficiency η is significantly improved.

Comparative Example 1-3

The flow rate of the gas introduced into the deposition chamber 101 during forming of the i-type layer according to Example 1 was changed as follows: the flow rate of the $SiH_4$ gas was changed to 300 sccm; and the $H_2$ gas to 500 sccm. The setting of the heater was changed to raise the temperature of the substrate to 300° C. The other conditions were the same as those according to Example 1 and the Comparative Example 1-1, while varying the μW power and the RF power during forming of the non-single-crystal silicon semiconductor solar cell shown in FIG. 2.

The relationship between the μW power and the deposition speed was examined similarly to Example 1, resulting in that the deposition speed was not raised when the μW power was greater than 0.1 W/cm³, indicating that the $SiH_4$ raw material gas was completely decomposed with the foregoing power.

The photoelectric conversion efficiency η (the photovoltaic power of the solar cell/energy of incident light per unit period) of the solar cell realized by applying light of AM1.5 (100 mW/cm²) was measured, resulting in the same tendency shown in FIG. 7. That is, the conditions where the μW power is smaller than the μW power (0.51 W/cm³), that completely decomposes the $SiH_4$ gas, and the RF power is larger than the μW power, significantly improve the photoelectric conversion efficiency η.

Comparative Example 1-4

The flow rate of the gas introduced into the deposition chamber 101 during forming of the i-type layer according to Example 1 was changed as follows: the flow rate of the $SiH_4$ gas was changed to 100 sccm; and the $H_2$ gas was not introduced. The pressure was changed to 10 mTorr. The other conditions were the same as those according to Example 1 and the Comparative Example 1-1, while varying the μW power and the RF power during forming of the non-single-crystal silicon semiconductor solar cell shown in FIG. 2.

The relationship between the μW power and the deposition speed was examined similarly to Example 1, resulting in that the deposition speed was not raised when the μW power was greater than 0.31 W/cm³, indicating that the $SiH_4$ raw material gas was completely decomposed with the foregoing power.

The photoelectric conversion efficiency η (the photovoltaic power of the solar cell/energy of incident light per unit period) of the solar cell realized by applying light of AM1.5 (100 mW/cm²) was measured, resulting in the same tendency shown in FIG. 7. That is, the conditions, where the μW power is smaller than μW power (0.31 W/cm³), that completely decomposes the $SiH_4$ gas, and the RF power is larger than the μW power, significantly improve the photoelectric conversion efficiency η.

Comparative Example 1-5

The pressure during forming of the i-type layer according to Example 1 was changed from 3 mTorr to 200 mTorr. The residual conditions were the same as those according to Example 1 at the time of forming the non-single-crystal silicon semiconductor solar cell shown in FIG. 2.

Figure 14:
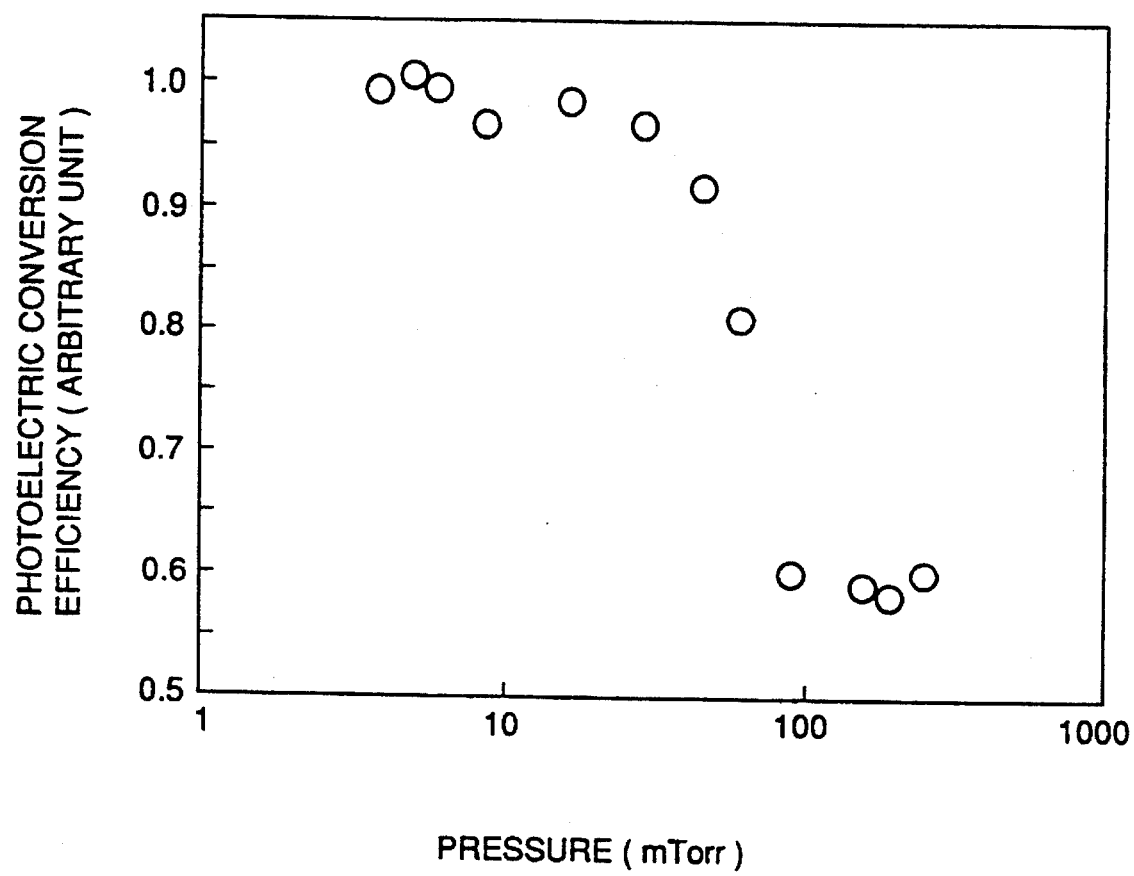
FIG. 14 is a graph which illustrates the relationship between pressure and the photoelectric conversion efficiency.

The photoelectric conversion efficiency η (the photovoltaic power of the solar cell/energy of incident light per unit period) of the solar cell realized by applying light of AM1.5 (100 mW/cm²) was measured, resulting in the trend shown in FIG. 14. It was found that the photoelectric conversion efficiency η was excessively deteriorated when the pressure was higher than 50 mTorr.

The conditions for manufacturing the non-single-crystal semiconductor layer according to Example 1 and Comparative Examples 1-1 to 1-5 are collectively shown in Table 1.

As can be understood from Example 1 and Comparative Examples 1-1 to 1-5, the effect of the present invention can be exhibited when the pressure is lower than 50 mTorr regardless of the flow rate of the raw material gas, the temperature of the substrate, and the pressure.

EXAMPLE 2

The deposited film forming method according to the present invention was employed so that a non-single-crystal silicon semiconductor solar cell using non-single-crystal silicon-germanium alloy as the i-type layer and shown in FIG. 2 was manufactured.

The conditions according to Example 1 to form the i-type layer were changed as follows: the flow rate into the deposition chamber 101 of the $SiH_4$ gas to 100 sccm, the $H_2$ gas to 300 sccm and the $GeH_4$ gas to 50 sccm. The temperature of the substrate was changed to 360° C., the pressure was changed to 8 mTorr, the μW power was changed to 0.16 W/cm$^3$, the RF power was changed to 0.32 W/cm$^3$, and the thickness of the layer was changed to 0.22 μm. The other conditions were the same as those according to Example 1 used to manufacture the non-single-crystal silicon semiconductor solar cell shown in FIG. 2, the solar cell thus manufactured being called "Example 2".

Comparative Example 2-1

A comparative non-single-crystal silicon semiconductor solar cell using non-single-crystal silicon-germanium alloy as the i-type layer was manufactured.

The μW power was 0.16 W/cm$^3$ and the RF power to 0.10 W/cm$^3$ to form the i-type layer. The other conditions were the same as those according to Example 2. The solar cell is called "Comparative Example 2-1".

The photoelectric conversion efficiency of the solar cells thus manufactured was obtained by the method similar to Comparative Example 1-1. As a result, the method (Example 2) according to the present invention resulted in an efficiency about 1.3 times superior to that of Comparative Example 2-1.

Further, the light deterioration characteristics of the foregoing solar cells were examined.

First, samples according to Example 2 and Comparative Example 2-1 were manufactured to obtain their initial photoelectric conversion efficiencies (η0) by a similar method to Comparative Example 1-1. A load causing the maximum electric power to be generated was connected, followed by applying light of AM1.5 (100 mW/cm$^2$) for 500 hours to obtain the photoelectric conversion efficiency (ηd). Then, the light deterioration rate (ηd/ηO) was obtained. Example 2 according to the present invention exhibited a result superior to Comparative Example 2-1 by about 1.2 times.

Further, the environmental resistance characteristics of the foregoing solar cells were examined. First, samples according to Example 2 and Comparative Example 2-1 were manufactured, followed by measurement of their initial photoelectric conversion efficiencies (η0) Then, the samples were allowed to stand in the dark, at a temperature of 85° C. and humidity of 85% for four hours, followed by rapidly lowering the temperature to −40° C. for 30 minutes. The samples were allowed to stand at the lower temperature for one hour, followed by rapidly raising the temperature to 85° C. to yield a humidity of 85%. The aforesaid cycle was repeated 30 times, followed by measuring the photoelectric conversion efficiencies (ηk) to obtain the environmental deterioration ratio (ηk/η0). As a result, the method (Example 2) according to the present invention resulted in about 1.3 times superior performance to that of Comparative Example 2-1.

Further, the film adhesion characteristics of the foregoing solar cells were examined.

First, substrates having a thickness of 0.2 mm were used to manufacture samples according to Example 2 and Comparative Example 2-1 by a method similar to that according to Comparative Example 1-1. Their initial photoelectric conversion efficiency (η0) was obtained. Then, one end of the substrate was fixed, while force was applied to the other end to bend the substrate for one second so as to have a curvature radius of 50 mm. The foregoing state was maintained for one second, followed by restoring the original state for 1 second. Then, force was applied in the opposite direction to bend it for one second to have a curvature radius of 50 mm. The foregoing state was maintained for one second, followed by restoring the original state for one second. The foregoing cycle was repeated 10,000 times. An optical microscope was used to examine regions in which layers were separated. The sample according to Example 2 showed results about 1/300 of that according to Comparative Example 2-1. Further, the photoelectric conversion efficiency (ηm) was measured to obtain the deterioration ratio (ηm/η0) due to the adhesion test. As a result, the method (Example 2) according to their present invention resulted in about 1.4 times superior performance to that of Comparative Example 2-1.

Comparative Example 2-2

A comparative non-single-crystal silicon semiconductor solar cell using non-single-crystal silicon-germanium alloy as the i-type layer was manufactured.

The μW power was changed to 0.40 W/cm$^3$ and the RF power was changed to 0.10 W/cm$^3$ to form the i-type layer. The other conditions were the same as those according to Example 2. The solar cell is called "Comparative Example 2-2".

The photoelectric conversion efficiencies of the foregoing solar cells were obtained by a method similar to that according to Comparative Example 1-1, demonstrating that the method (Example 2) according to the present invention was superior to that of Comparative Example 2-2 by about 1.7 times.

The light deterioration characteristics of the foregoing solar cells were examined, demonstrating that the method (Example 2) according to the present invention was superior to that of Comparative Example 22 by about 1.5 times.

The environmental resistance characteristics of the foregoing solar cells were examined, resulting in that the method (Example 2) according to the present invention was superior to that of Comparative Example 22 by about 1.5 times.

The adhesion test characteristics of the foregoing solar cells were examined, resulting in that the method (Example 2) according to the present invention was superior to that of Comparative Example 2-2 by about 1.6 times.

Comparative Example 2-3

A comparative non-single-crystal semiconductor solar cell using non-single-crystal silicon-germanium alloy as the i-type layer was manufactured.

The μW power was changed to 0.40 W/cm³ and the RF power was changed to 0.50 W/cm³ to form the i-type layer. The other conditions were the same as those according to Example 2. The solar cell is called "Comparative Example 2-3".

The photoelectric conversion efficiencies of the foregoing solar cells were obtained by a method similar to that according to Comparative Example 1-1, resulting in that the method (Example 2) according to the present invention was superior to that of Comparative Example 2-3 by about 1.3 times.

The light deterioration characteristics of the foregoing solar cells were examined, resulting in that the method (Example 2) according to the present invention was superior to that of Comparative Example 2-3 by about 1.2 times.

The environmental resistance characteristics of the foregoing solar cells were examined, resulting in that the method (Example 2) according to the present invention was superior to that of Comparative Example 2-3 by about 1.2 times.

The adhesion test characteristics of the foregoing solar cells were examined, resulting in that the method (Example 2) according to the present invention was superior to that of Comparative Example 2-3 by about 1.3 times.

The conditions for manufacturing the non-single-crystal silicon semiconductor layers according to Example 2 and Comparative Examples 2-1 to 2-3 and their photoelectric conversion efficiencies are collectively shown in Table 2.

As a result of the measurements thus performed, the solar cell manufactured by the method according to the present invention exhibits superior characteristics to the comparative solar cells, resulting in a confirmation of the superiority of the present invention.

EXAMPLE 3

The deposited film forming method according to the present invention was employed whereby the non-single-crystal silicon semiconductor solar cell using non-single-crystal silicon-carbon as the n-type layer and shown in FIG. 2 was manufactured.

The conditions according to Example 1 to form the n-type layer were changed as follows: the flow rate into the deposition chamber 101 of the SiH₄ gas was changed to 100 sccm, the H₂ gas to 300 sccm, the PH₃/H₂ gas to 100 sccm, and the CH₄ gas to 20 sccm. The temperature of the substrate was changed to 360° C., the pressure was changed to 10 mTorr, the μW power was changed to 0.25 W/cm³, the RF power was changed to 0.32 W/cm³, and the thickness of the layer was changed to 0.02 μm. The other conditions were the same as those according to Example 1 to manufacture the non-single-crystal silicon semiconductor solar cell shown in FIG. 2, the solar cell thus manufactured being called "Example 3".

Comparative Example 3-1

A comparative non-single-crystal silicon semiconductor solar cell using non-single-crystal silicon-carbon as the n-type layer was manufactured.

The μW power was changed to 0.25 W/cm³ and the RF power was changed to 0.10 W/cm³ to form the n-type layer. The other conditions were the same as those according to Example 3. The solar cell is called "Comparative Example 3-1".

The photoelectric conversion efficiency of the solar cells thus manufactured was obtained by the method similar to Comparative Example 1-1. As a result, the method (Example 3) according to the present invention showed results about 1.2 times superior to those of Comparative Example 3-1.

Comparative Example 3-2

A comparative non-single-crystal silicon semiconductor solar cell using non-single-crystal silicon-carbon as the n-type layer was manufactured.

The μW power was changed to 0.40 W/cm³ and the RF power was changed to 0.10 W/cm³ to form the n-type layer. The other conditions were the same as those according to Example 3. The solar cell is called "Comparative Example 3-2".

The photoelectric conversion efficiency of the solar cells thus manufactured was obtained by the method similar to Comparative Example 1-1. As a result, the method (Example 3) according to the present invention showed results about 1.2 times superior to those of Comparative Example 3-2.

Comparative Example 3-3

A comparative non-single-crystal silicon semiconductor solar cell using non-single-crystal silicon-carbon as the n-type layer was manufactured.

The μW power was changed to 0.40 W/cm³ and the RF power was changed to 0.50 W/cm³ to form the n-type layer. The other conditions were the same as those according to Example 3. The solar cell is called "Comparative Example 3-3".

The photoelectric conversion efficiency of the solar cells thus manufactured was obtained by the method similar to Comparative Example 1-1. As a result, the method (Example 3) according to the present invention resulted in about 1.2 times superior results as compared to Comparative Example 3-2.

The conditions for manufacturing the non-single-crystal silicon semiconductor layers according to Example 3 and Comparative Examples 3-1 to 3-3 and their photoelectric conversion efficiencies are collectively shown in Table 3.

As a result of the measurements thus performed, the solar cell manufactured by the method according to the present invention exhibits superior characteristics to the comparative solar cells, resulting in a confirmation of the superiority of the present invention.

EXAMPLE 4

Figure 8:
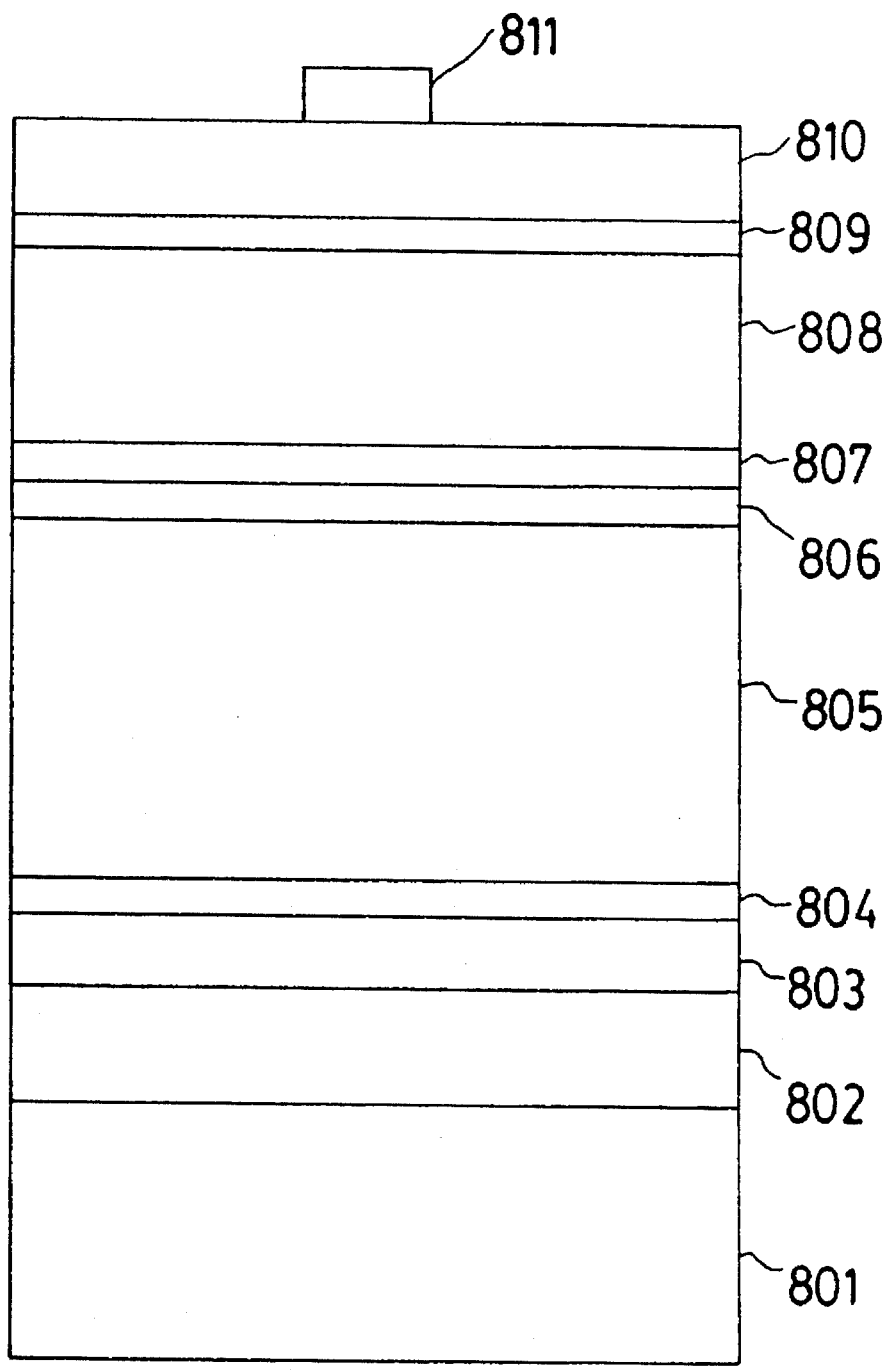
FIG. 8 is a schematic view which illustrates the structure of a tandem-type solar cell.

The method of forming a deposited film according to the present invention was used to form a tandem-type non-single-crystal silicon semiconductor solar cell shown in FIG. 8.

First, the DC magnetron sputtering apparatus similar to Example 1 and shown in FIG. 3 was used so that a silver (Ag) light reflecting layer 802 having a thickness of 0.3 μm was formed on the substrate 801. Then, a light reflection enhancing layer 803 made of zinc oxide (ZnO) was formed on the Ag light reflecting layer 802 similarly to Example 1.

Then, the manufacturing apparatus composed of the raw material gas supply apparatus 1020 and the deposition apparatus 100 shown in FIG. 1A and adapted to the glow discharge decomposition method according to the present invention was used similarly to Example 1 to form the non-single-crystal silicon semiconductor p-i-n layer on the light reflection enhancing layer. First, a first n-type conductivity layer 804 was formed on the light reflection enhancing layer 803, followed by sequentially forming a first i-type layer 805, a first p-type conductivity layer 806, a second n-type conductivity layer 807, a second i-type layer 808, and a second p-type layer 809. The conditions for manufacturing the foregoing non-single-crystal silicon semiconductor layers are shown in Table 4.

Then, ITO ($In_2O_3+SnO_2$) having a thickness of 0.08 μm was evaporated on the second p-type layer as a transparent electrode 810 by using the resistance-heating vacuum evaporation apparatus shown in FIG. 4 similarly to Example 1.

Then, a comb-type collecting electrode 811 made of chrome (Cr) and having a thickness of 10 μm was evaporated on the transparent electrode by the resistance heating vacuum evaporation apparatus shown in FIG. 4 similarly to Example 1.

Thus, the tandem-type non-single-crystal silicon semiconductor solar cell was manufactured, the solar cell thus manufactured being called "Example 4".

Comparative Example 4

Conventional i-type layers were used to form the first i-type layer and the second i-type layer, so that non-single-crystal silicon semiconductor solar cells were manufactured. The solar cells thus manufactured are collectively called Comparative Example 4. The photoelectric conversion efficiency of each of the solar cells was measured similarly to Example 1, exhibiting the superiority of Example 4 compared to Comparative Example 4.

As a result of the measurements thus performed, the solar cell manufactured by the method according to the present invention exhibits superior characteristics compared to the conventional solar cells, resulting in a confirmation of the superiority of the present invention.

EXAMPLE 5

Figure 9:
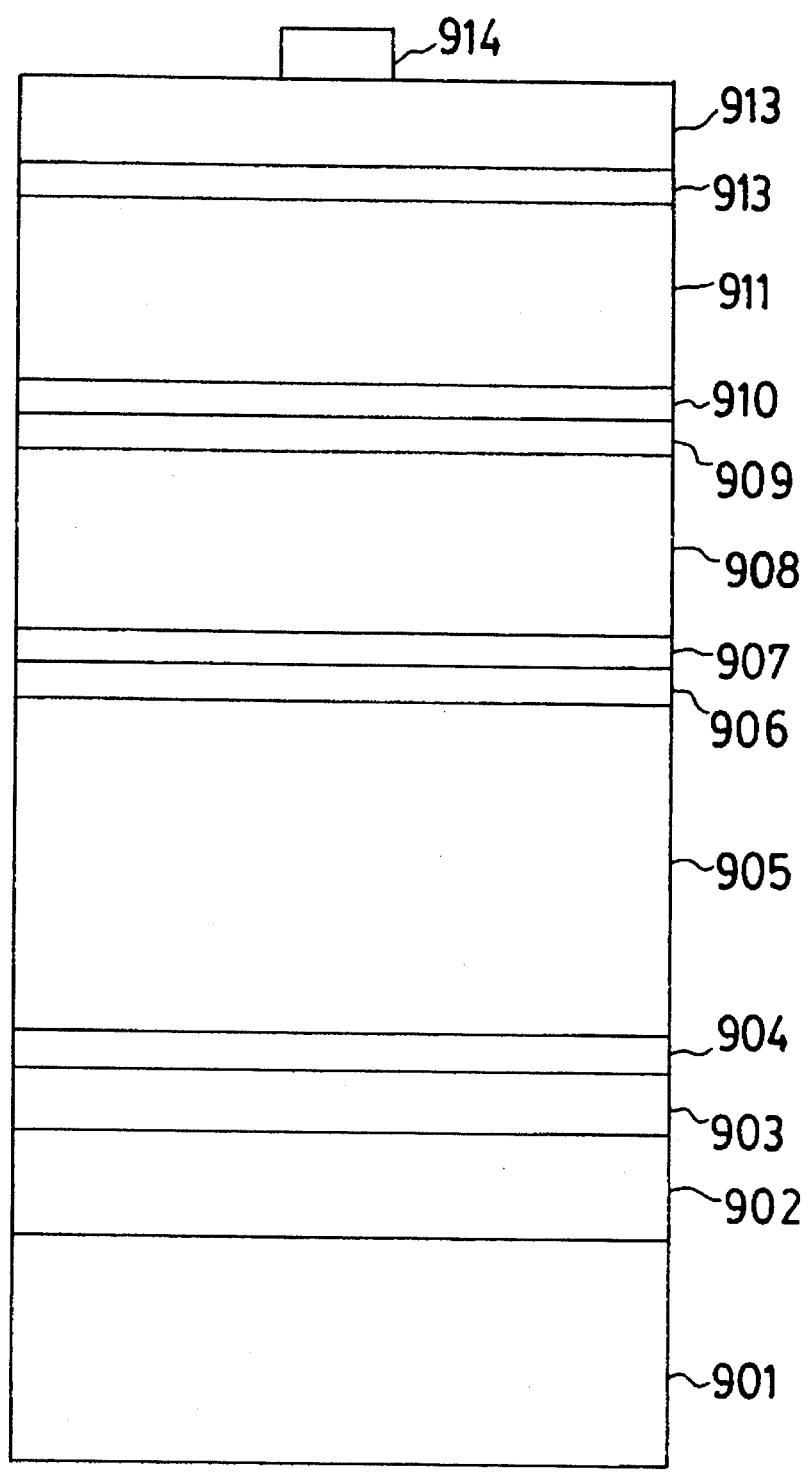
FIG. 9 is a schematic view which illustrates the structure of a triple cell tandem-type solar cell.

The method of forming a deposited film according to the present invention was used to form a triple-type non-single-crystal silicon semiconductor solar cell shown in FIG. 9.

First, the DC magnetron sputtering apparatus similar to Example 1 and shown in FIG. 3 was used to form a silver (Ag) light reflecting layer 902 having a thickness of 0.3 μm on the substrate 901.

Then, a light reflection enhancing layer 903 made of zinc oxide (ZnO) was formed on the Ag light reflecting layer 902 similarly to Example 1.

Then, the manufacturing apparatus composed of the raw material gas supply apparatus 1020 and the deposition apparatus 100 shown in FIG. 1A and adapted to the glow discharge decomposition method according to the present invention was used similarly to Example 1 to form the non-single-crystal silicon semiconductor p-i-n type layer on the light reflection enhancing layer. First, a first n-type conductivity layer 904 was formed on the light reflection enhancing layer 903, followed by sequentially forming a first i-type layer 905, a first p-type conductivity layer 906, a second n-type conductivity type layer 907, a second i-type layer 908, a second p-type conductivity layer 909, a third n-type conductivity layer 910, a third i-type layer 911 and third p-type conductivity layer 912. The conditions for manufacturing the foregoing non-single-crystal silicon semiconductor layers are shown in Table -5.

Then, ITO ($In_2O_3+SnO_2$) having a thickness of 0.08 μm was evaporated on the third p-type layer 912 as the transparent electrode 913 by using the resistance-heating vacuum evaporation apparatus shown in FIG. 4 similarly to Example 1.

Then, a comb-type collecting electrode 914 made of chrome (Cr) and having a thickness of 10 μm was evaporated on the transparent electrode 913 by the resistance heating vacuum evaporation apparatus shown in FIG. 4 similarly to Example 1.

Thus, the triple-type non-single-crystal silicon semiconductor solar cell was manufactured, the solar cell thus manufactured being called "Example 5".

Comparative Example 5

Conventional i-type layers were used to form the first i-type layer, the second i-type layer, and the third i-type layer, whereby non-single-crystal silicon semiconductor solar cells were manufactured. The solar cells thus manufactured are collectively called Comparative Example 5. The photoelectric conversion efficiency of each of the solar cells was measured similarly to Example 1, showing superiority of Example 5 compared to Comparative Example 5.

As a result of the measurements thus performed, the solar cell manufactured by the method according to the present invention exhibits superior characteristics to the conventional solar cells, resulting in a confirmation of the superiority of the present invention.

EXAMPLE 6

Figure 10:
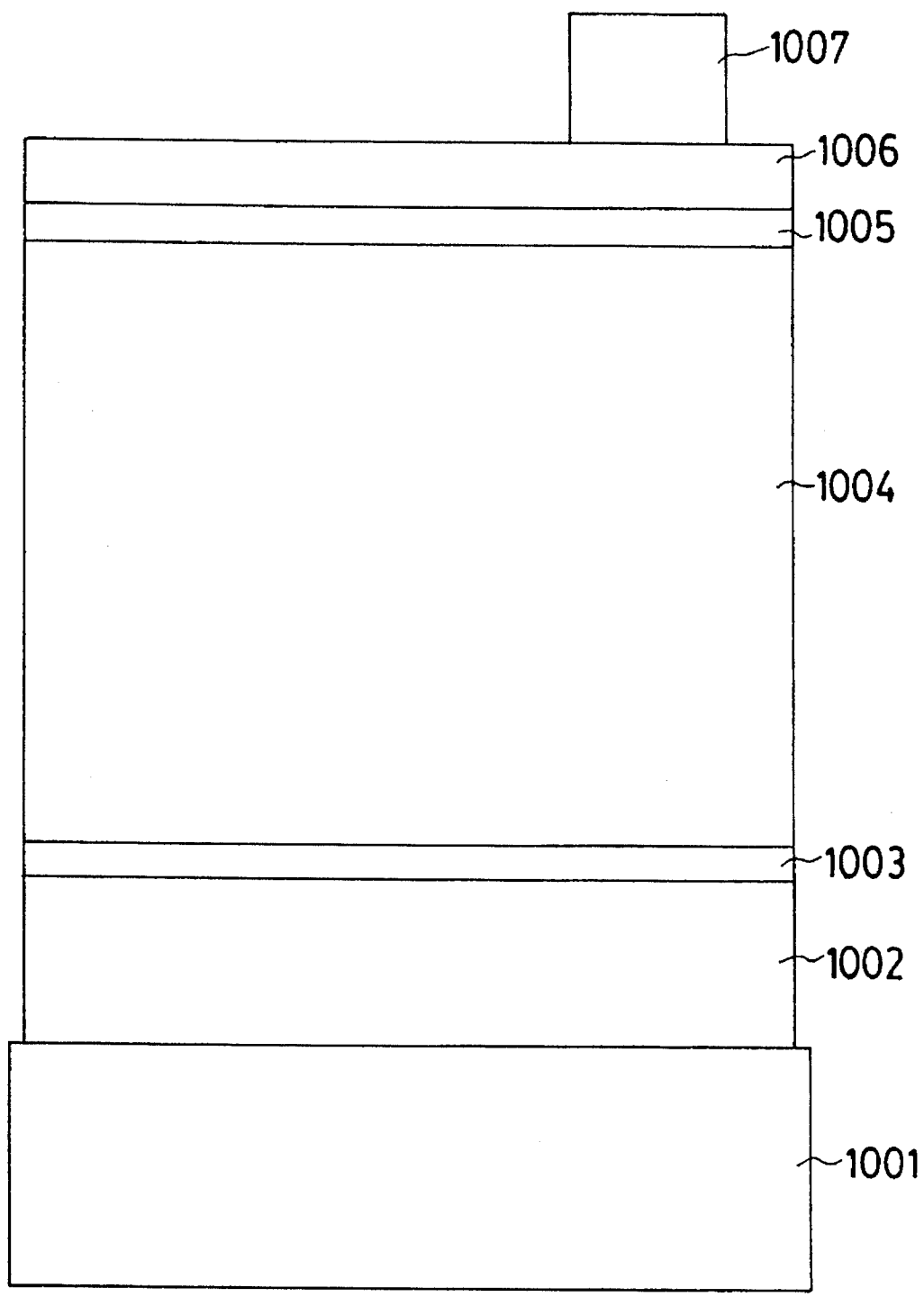
FIG. 10 is a schematic view which illustrates the structure of a pin-type photosensor.

The method of the present invention was used to form a non-single crystal silicon semiconductor solar cell as shown in FIG. 10. The resistance heating vacuum evaporation apparatus shown in FIG. 4 was used similarly to Example 1 to form a light reflecting layer 1002 on a glass substrate 1001 as follows: a 5 mm×5 mm glass substrate plate having a thickness of 1.0 mm was subjected to a mirror surface polishing, followed by ultrasonic-cleaning with acetone ($CH_3OCH_3$) for ten minutes and with isopropanol ($CH_3CHOHCH_3$) for ten minutes, followed by drying it at 80° C. for 30 minutes. The evaporation source 404 was changed to a granular evaporation source made of chrome (Cr), the purity of which was 99.99% to form a light reflecting layer 1002 having a thickness of 0.3 μm by a method similar to that employed when the comb-type collecting electrode according to Example 1 was formed.

Then, the manufacturing apparatus composed of the raw material gas supply apparatus 1020 and the deposition apparatus 100 shown in FIG. 1A and adapted to the glow discharge decomposition method according to the present invention was used similarly to Example 1 to form the n-type non-single-crystal silicon semiconductor layer 1003, i-type non-single-crystal silicon semiconductor layer 1004, and a p-type non-single-crystal silicon semiconductor layer 1005 on the light reflecting layer. The conditions for manufacturing the foregoing non-single-crystal silicon semiconductor layers are shown in Table 6.

Then, ITO ($In_2O_3+SnO_2$) having a thickness of 0.08 μm was evaporated on the p-type layer as the transparent electrode 1006 by using the resistance-heating vacuum evaporation apparatus shown in FIG. 4 similarly to Example 1.

Then, a collecting electrode 1007 made of chrome (Cr) and having a thickness of 10 μm was evaporated on the transparent electrode by the resistance heating vacuum evaporation apparatus shown in FIG. 4 similarly to Example 1.

Thus, the pin-type non-single-crystal photosensor was manufactured, the photosensor being called "Example 6".

Comparative Example 6

Some pin-type non-single-crystal silicon semiconductor photosensors were manufactured using a conventional i-type layer. The foregoing photosensors are collectively called "Comparative Example 6". Samples according to Example 6 and Comparative Example 6 were placed into a dark room to measure the electric current and voltage characteristics, in order to obtain diode characteristics. The dark current with the reverse bias was measured, resulting in that the dark current in the sample according to Comparative Example 6 was 13 times that of the sample according to Example 6. Therefore, it was found that the sample according to Example 6 had excellent photosensor characteristics.

As a result of the measurements thus performed, the photosensor manufactured by the method according to the present invention exhibits superior characteristics to the conventional photosensor, resulting in a confirmation of the effect of the present invention.

EXAMPLE 7

The method of forming a deposited film according to the present invention was employed to form an inverse-stagger-type non-single-crystal silicon semiconductor thin film transistor (TFT) as shown in FIG. 11.

A 10 mm×10 mm glass substrate 1101 plate having a thickness of 1.0 mm subjected to a mirror surface polishing was ultrasonic-cleaned with acetone ($CH_3OCH_3$) for ten minutes and with isopropanol ($CH_3CHOHCH_3$) for ten minutes, followed by drying it at 80° C. for 30 minutes. The evaporation source 404 shown in FIG. 4 was changed to a granular evaporation source made of 99.99% pure chrome (Cr) to form a gate electrode having a thickness of 0.1 μm by vacuum evaporation. A usual photo-process was employed to form a gate electrode 1102 structured as shown in FIG. 11 and made of chrome.

Then, the manufacturing apparatus composed of the raw material gas supply apparatus 1020 and the deposition apparatus 100 shown in FIG. 1A and adapted to the glow discharge decomposition method according to the present invention was used similarly to Example 1, followed by changing the $GeH_4$ gas cylinder to a $NH_3$ gas (purity 99.99%) cylinder to form, on the gate electrode 1102, an insulating layer 1103 having a thickness of 0.3 μm and made of non-single-crystal silicon nitride.

Then, the manufacturing apparatus composed of the raw material gas supply apparatus 1020 and the deposition apparatus 100 shown in FIG. 1A and adapted to the glow discharge decomposition method according to the present invention was used similarly to Example 1 to form a semiconductor layer 1104 made of non-single-crystal silicon and having a thickness of 0.5 μm on the foregoing insulating layer 1103, followed by a photolithographic process to form a structure as shown in FIG. 11.

The evaporation source 404 shown in FIG. 4 was changed to an aluminum (Al) granular evaporation source, the purity of which was 99.99%, to form an electrode layer having a thickness of 0.2 μm. Then, a photolithographic process was employed to divide the electrode layer into a source electrode 1105 and a drain electrode 1106 structured as shown in FIG. 11.

Then, the manufacturing apparatus composed of the raw material gas supply apparatus 1020 and the deposition apparatus 100 shown in FIG. 1A and adapted to the glow discharge decomposition method according to the present invention was used similarly to Example 1 to form a protection layer 1107 made of non-single-crystal silicon nitride having a thickness of 0.3 mm on the source and drain electrodes.

Thus, the non-single-crystal silicon semiconductor thin film transistor was manufactured, which is called "Example 7". Table 7 shows the conditions for forming the insulating layer, the semiconductor layer, and the protection layer.

Comparative Example 7

Some non-single-crystal silicon semiconductor thin film transistors were manufactured by using the conventional method of forming silicon thin films. The foregoing conventional TFTs are called Comparative Example 7. Samples according to Example 7 and Comparative Example 7 were placed in a dark room to measure the S/N ratio, resulting in that the sample according to Example 7 had a S/N ratio which was about 30 times that of the Comparative Example 7. Therefore, excellent on/off characteristics were confirmed.

As a result of the measurements thus performed, the TFT manufactured by the method according to the present invention exhibits superior characteristics to the conventional TFT, resulting in a confirmation of the superiority of the present invention.

EXAMPLE 8

An electrophotographic photosensitive member shown in FIG. 12 was manufactured by using the method of manufacturing a deposited film according to the present invention.

First, the surface of a cylinder-like substrate 1201 was subjected to mirror forming polishing, the substrate 1201 being made of aluminum containing 4% magnesium (Mg) and having an outer diameter of 108 mm and a thickness of 8.0 mm. Then, it was ultrasonic-cleaned with 1,1,1-trichloroethane ($CH_3CCl_3$) for 10 minutes, followed by drying at 80° C. for 30 minutes.

FIG. 13 illustrates an apparatus capable of manufacturing the electrophotographic photosensitive member by the method according to the present invention, and having six cylinder-like substrates 1301 surrounding a discharging space 1304. The raw material gas supply apparatus 1020 shown in FIG. 1A is connected to a gas introduction pipe 1308. $GeH_4$ gas cylinder 1076 was previously changed to a silane tetrafluoride (the purity of which was 99.99%) cylinder. The six cylinder-like substrates 1301 were cleaned, followed by fastening to substrate holders 1302. The substrate holders 1302 were each placed on a rotational shaft shown in FIG. 13, followed by closing of cover 1305. Three gas pipes 1312 were placed in the deposition chamber, each gas pipe 1312 having a plurality of gas outlet holes, so that the gas was uniformly supplied to the surface of the cylinders. Thus, vertical irregularity in the film thickness is prevented. A vacuum pump (omitted from illustration) was used to exhaust the gas in deposition chamber 1306. Then the pressure in the deposition chamber 1306 was lowered to $1\times10^4$, the motors 1310 was turned on to rotate the substrates 1301. Then, $H_2$ gas was introduced into the deposition chamber at 200 sccm, followed by setting the heaters

1309 so that the temperature of the substrates was raised to 350° C.

First, a charge injection inhibition layer 1204 was formed on the cylinder-like substrate 1301.

When the substrate was heated sufficiently, the mass flow controllers were adjusted to set the flow rate of the $SiH_4$ gas at 100 sccm, the $H_2$ gas at 500 sccm, the $B_2H_6/H_2$ gas at 20 sccm, and the $SiF_4$ gas at 10 sccm. The pressure was set at 10 mTorr by adjustment of the conductance valve 1311. Then, the output power of a high frequency (RF) power source was set to 0.40 W/cm$^3$, followed by supplying the power to the bias rod 1316. Then, the output power of the µW power source (omitted from illustration) was set to 0.20 W/cm$^3$ and introduced into the deposition chamber 1306 through the waveguide pipe (omitted from illustration), the waveguide portion 1315, and the dielectric window 1314 to generate the glow discharge. As a result, forming of the charge-injection inhibition layer was commenced on the substrate. When the charge injection inhibition layer reached a thickness of 3.0 µm, the introduction of the $Si_4$ gas was stopped while maintaining the generation of the discharge. The flow rate of the $Si_4$ gas was set at 250 sccm, the $H_2$ gas at 250 sccm, and the $B_2H_6/H_2$ gas at 1 sccm by setting the mass flow controllers. The pressure was set at 6 mTorr by adjustment of the conductance valve 1311. As a result, forming of the photoconductive layer 1203 was commenced. When the photoconductive layer reached a thickness of 20 µm, the introduction of the $H_2$ gas and the $B_2H_6/H_2$ gas were stopped. Then, the $SiH_4$ gas and the $CH_4$ gas were newly introduced at a flow rate of 50 sccm, followed by setting the mass flow controllers at a flow rate of 500 sccm. The conductance valve 1311 was used to adjust the pressure to 20 mTorr, so that forming of the surface layer 1202 shown in FIG. 12 was commenced. When the surface layer having a thickness of 0.5 µm was formed, the µW power source, the RF power source, and the heater were turned off, and all gas introductions were stopped. When the cylinder-like substrate 1301 was cooled to the room temperature, air was leaked into the deposition chamber 1306, followed by removal of the six cylinder-like substrates.

Thus, the electrophotographic photosensitive members shown in FIG. 12, each of which was made of the non-single-crystal silicon semiconductor, were manufactured. The foregoing electrophotographic photosensitive members are called Example 8. Table 8 shows the conditions for forming the charge-injection inhibition layer, the photoconductive layer, and the surface layer.

Comparative Example 8

The conventional method was employed to manufacture a plurality of electrophotographic photosensitive members, each of which was made of non-single-crystal silicon semiconductor. The electrophotographic photosensitive members thus manufactured are collectively called Comparative Example 8. The samples according to Example 8 and Comparative Example 8 were loaded into an electrophotographic apparatus NP-7550 manufactured by Canon to measure the electrophotographic characteristics under various conditions. As a result, the sample according to Example 8 exhibited charging performance that was 1.1 times that of the sample according to Comparative Example 8.

As a result of the measurements thus performed, the electrophotographic photosensitive members manufactured by the deposited film forming method according to the present invention exhibit superior characteristics to the conventional electrophotographic photosensitive members, resulting in a confirmation of the superiority of the present invention.

EXAMPLE 9

As a-Si:H photovoltaic device structured as shown in FIG. 2 was manufactured by using the deposited film forming apparatus shown in FIG. 1B.

In this embodiment, the substrate 201 comprised a 10 cm×10 cm stainless steel (SUS304) having a mirror surface formed by polishing and a thickness of 0.1 mm.

Then, silver having a thickness of 0.3 µm was formed to serve as a light reflecting layer 202 on the stainless steel plate.

Then, a reflection enhancing layer 203 made of zinc oxide was formed by using the DC sputtering apparatus shown in FIG. 3 in the following manner.

The substrate 302, to which silver had been previously evaporated, was fastened to a heater 303, followed by the gas in the deposition chamber 301 being exhausted by a pump (omitted from illustration). When confirmation of a vacuum of 10$^{-5}$ Torr in the deposition chamber 301 had been made with the vacuum gauge 312, the heater 303 was turned on to raise the temperature of the substrate 302 to 400° C., this level being maintained.

In this embodiment, the target was formed by sintering zinc oxide powder. Argon gas was, as the sputtering gas, supplied through a gas introduction valve 314 while performing adjustment by a mass flow controller 316 so that the flow rate was set at 25 sccm. After the flow rate had been stabilized, DC voltage was supplied from a sputtering power source 306 to the target 304 to set the sputtering electric current at 0.3 A. The internal pressure was maintained at 7 mTorr during the sputtering operation.

The operation of forming the zinc oxide was commenced as described. When the thickness of the zinc oxide layer had been increased to 1.0 µm, supply of electric power from the sputtering power source, the sputtering gas, and electric power to the heater were stopped. The substrate was cooled, followed by leaking of the gas in the deposition chamber 301. Then, the substrate having zinc oxide layer formed thereon was removed.

Then, the n-type semiconductor layer 204, the i-type semiconductor layer 205, and the p-type semiconductor layer 206, each of which was made of a-Si:H, were formed on the substrate by using the microwave plasma CVD apparatus.

The gas cylinders 1071 to 1076 of the gas supply apparatus 1020 contained the following gases: Reference numeral 1071 represents a $SiH_4$ gas (purity 99.999%) cylinder, 1072 represents a $GeH_4$ gas (purity 99.999%) cylinder, 1073 represents $H_2$ gas (purity 99.999%) cylinder, 1074 represents a cylinder of $PH_3$ gas ($PH_3/H_2$ gas) diluted with $H_2$ gas to 10%, 1075 represents a cylinder of $BF_3$ gas ($BF_3/H_2$ gas) diluted with $H_2$ gas to 10%, and 1076 represents an Ar gas cylinder. When the gas cylinders 1071 to 1076 were installed, the foregoing gases were previously introduced into the gas pipes arranged between the valves 1051 to 1056 and the introduction valves 1031 to 1036 in such a manner that the $SiH_{-4}$ gas was introduced from the gas cylinder 1071, the $GeH_{-4}$ gas was introduced from the gas cylinder 1072, the $H_2$ gas was introduced from the gas cylinder 1073, the $PH_3/H_2$ gas was introduced from the gas cylinder 1074, the $BF_3/H_2$ gas was introduced from the gas cylinder 1075 and the Ar gas was introduced from the gas cylinder 1076. The gas pressure in each of the pipes was adjusted to 2 Kg/cm$^2$ by the pressure adjusters 1061 to 1066.

Then, confirmation was made that the valves 1031 to 1036 and the leak value 109 of the deposition chamber 101 were closed. Another confirmation was made that the valves 1041 to 1046 were opened. Then, the conductance (butterfly type) valve 107 was fully opened to exhaust the gas in the deposition chamber 101 and the gas pipes by a vacuum pump (omitted from illustration). When the vacuum gauge 106 showed a level about 1×10$^{-5}$ Torr, the valves 1041 to 1046 were closed.

Then, the valves 1031 to 1036 were gradually opened to introduce the gases into the mass flow controllers 1021 to 1026.

After preparation for forming the semiconductor layers was completed, the heater 105 was actuated to raise the temperature of the substrate 104 to 380° C., followed by maintaining of the temperature. Then, the introduction valves 1041, 1043, and 1044 were gradually opened to introduce the SiH$_4$ gas, H$_2$ gas, and the PH$_3$/H$_2$ into the deposition chamber 101 through the sub-valve 108 and the gas introduction pipe 103. At this time, the flow rate of the SiH$_4$ gas was set at 10 sccm, the H$_2$ gas at 100 sccm, and the PH$_3$/H$_2$ gas at 1.0 sccm by adjusting the corresponding mass flow controllers 1021, 1023, and 1024. When the gas flow rates had stabilized, the pressure in the deposition chamber 101 was set at 5 mTorr by adjusting the degree of opening of the conductance valve 107 while observing the vacuum gauge 106. Then, RF bias of 600 W and +100 V DC bias from the bias power source 111 were applied to the bias rod 112. Then, the output power of a μW power source (omitted from illustration) was set to 400 W, followed by introducing the μW power into the deposition chamber 101 through the waveguide pipe (omitted from illustration), the waveguide portion 110, and the dielectric window 102 to generate a microwave glow discharge. As a result, forming of the n-type layer was commenced on the substrate 104.

When the thickness of the n-type semiconductor layer had increased to about 20 nm, the supply of the microwave power was stopped, the output from the RF and DC power source 111 was turned off, and the introduction valves 1041, 1043, and 1044 were closed to stop the gas introduction into the deposition chamber 101. Thus, forming of the n-type semiconductor layer 204 was completed.

Then, the i-type semiconductor layer 205 was formed as follows: the gas in the deposition chamber 101 and the pipes were temporarily exhausted to a negative pressure level of 10$^{-6}$ Torr, the substrate 104 was heated to 350° C. by the heater 105, followed by maintaining the foregoing temperature. The introduction valve 1041 was opened to introduce SiH$_4$ gas into the deposition chamber 101 via the sub-valve 108 and the gas introduction pipe 103. The pressure in the deposition chamber 101 was set at 5 mTorr by adjusting the degree of opening of the conductance valve 107 while observing the vacuum gauge 106. Then, RF bias of 800 W from the bias power source 111 was applied to the bias rod 112. Then, the output power of a μW power source (omitted from illustration) was set to 500 W, followed by introducing the μW power into the deposition chamber 101 through the waveguide pipe (omitted from illustration), the waveguide portion 110, and the dielectric window 102 to generate the microwave glow discharge. As a result, forming of the i-type layer was commenced on the n-type semiconductor layer. The fact that the microwave energy was smaller than the energy that completely decomposed the raw material gas had been confirmed previously.

When the thickness of the i-type semiconductor layer had increased to about 300 nm, the supply of the microwave power was stopped, the output from bias power source 111 was turned off, and the gas introduction into the deposition chamber 101 was stopped. Thus, forming of the i-type semiconductor layer 205 was completed. The deposition speed of the i-type layer was about 10 nm/sec.

Then, the p-type semiconductor layer 206 was formed as follows: the substrate 104 was heated to 300° C. by the heater 105, followed by maintaining the foregoing temperature. The SiH$_4$ gas, the H$_2$ gas, and the BF$_3$/H$_2$ were introduced into the deposition chamber 101 via the sub-valve 108 and the gas introduction pipe 103. The flow rate of the SiH$_4$ gas was set at 10 sccm, the H$_2$ gas at 100 sccm, and the BF$_3$/H$_2$ gas at 1 sccm by adjustment of the corresponding mass flow controllers. The pressure in the deposition chamber 101 was set at 5 mTorr by adjusting the degree of opening of the conductance valve 107 while observing the vacuum gauge 106. Then, a+00 V DC bias was supplied from the bias power source 111 to the bias rod 112. Then, the output power of a μW power source (omitted from illustration) was set to 400 W, followed by introducing the μW power into the deposition chamber 101 through the waveguide pipe (omitted from illustration), the waveguide portion 110, and the dielectric window 102 to generate the microwave glow discharge. As a result, forming of the p-type layer was commenced on the i-type semiconductor layer.

When the thickness of the p-type semiconductor layer increased to about 10 nm, the supply of the microwave power was stopped, the output from bias power source 111 was turned off, and the gas introduction into the deposition chamber 101 was stopped. Thus, forming of the p-type semiconductor layer 205 was completed.

Argon gas in the deposition chamber 101 and the gas introduction pipes was purged three times, followed by closing the gas introduction valves and by opening the leak valve 109 to leak the gas in the deposition chamber 101. Then, the substrate 103 having the n-type semiconductor layer, i-type semiconductor layer, and p-type semiconductor layer formed thereon was removed from the deposition chamber 101.

Then, ITO (In$_2$O$_3$+SnO$_2$) was formed on the p-type semiconductor layer 206 of the a-Si:H photovoltaic device thus formed by using the reactive vacuum evaporation apparatus shown in FIG. 4.

The substrate 402 having the p-type semiconductor layer formed thereon was fastened to the heater 403, followed by supplying a mixture of tin and indium (each exhibiting a purity of 99.999%) at a mixture ratio 50%:50%, as the evaporation source 404. Then, a vacuum pump (omitted from illustration) was operated, and the conductance valve was completely opened to exhaust the gas in the deposition chamber 401.

When the vacuum in the deposition chamber had been lowered to 10$^{-6}$ Torr, the heater 403 was actuated to maintain the temperature of the substrate 402 at 150° C. Then, the flow rate of the oxygen (O$_2$) gas was set at 8 sccm by the mass flow controller 411, followed by introducing it into the deposition chamber 401 via the gas introduction valve 410. After the flow rate had stabilized, the vacuum in the deposition chamber 401 was set to 3×10$^{-4}$ Torr by adjusting the conductance valve 409 while observing the vacuum gauge 408.

After the internal pressure had been made constant, the heater 405 for heating the evaporation source was actuated so that heating of the evaporation source 404 was commenced. When vaporization of tin and indium is commenced due to the increase of the temperature of the evaporation source, the vaporized metal atoms react with the oxygen gas in the deposition chamber, causing the pressure in the deposition chamber to be somewhat lowered. When the change in the pressure is $3 \times 10^{-5}$ Torr, the shutter 407 is opened to commence forming of the ITO film on the substrate 402.

While observing the deposition speed with a film-thickness monitor, the output from the AC power source 406 is adjusted to set the deposition speed at about 0.07 nm/sec at the time for forming the ITO film.

When the thickness reached 75 nm, the shutter 407 was closed, the heaters 403 and 405 turned off, and the gas introduction valve 410 closed. Thus, forming of the transparent electrode 207 was completed. After the temperature of the substrate was lowered, the leak valve 412 was opened to leak the gas in the deposition chamber 401, followed by removal of the substrate 402 having the transparent electrode 207 formed thereon.

Then, the collecting electrode 208 was formed by evaporating Al to a thickness of 2 µm by the resistance heating vacuum evaporation method, so that an a-Si:H photovoltaic device (Example 9) was manufactured.

As a comparative example, an a-Si:H photovoltaic device (Comparative Example 9) was manufactured under the same conditions as those employed to manufacture the photovoltaic device (Example 9) except that the semiconductor layer was deposition while removing the mesh 113 during the process of forming the i-type layer. The change in the deposition speed taking place due to the removal of the mesh 113 was compensated for by changing the deposition period in order to make the film thickness to be the same.

The photovoltaic devices according to Example 9 and Comparative Example 9 thus manufactured were supplied with pseudo sunlight (AM-1.5, 100 mW/cm$^2$) by using a solar simulator (YSS-150 manufactured by Yamashita Denso) to measure the current-voltage characteristics, so that the photoelectric conversion efficiency was determined. As a result, the photovoltaic device Example 9) manufactured by the deposited film forming method according to this embodiment exhibited a significantly improved photoelectric conversion efficiency of 1.23 while assuming that the value of the photovoltaic device (Comparative Example 9) was 1. That is, the i-type layer which determines the characteristics of the photovoltaic device formed by the method of forming a deposited film according to this embodiment provided uniform deposition and improved characteristics because the ion sources contributing to the improvement in the characteristics of the film were effectively selected, and the uniformity and stability of the plasma were improved. As a result, the photoelectric conversion efficiency of the photovoltaic device was significantly improved.

Similar experiments were repeated 10 times to examine the scattering of the photoelectric conversion efficiency of the photovoltaic device. As a result, the range of scattering of the photovoltaic device manufactured by the method of forming the deposited film was 0.57, in contrast with the range of scattering of the photovoltaic device according to the comparative example which was assumed to be 1. That is, the i-type layer which determines the characteristics of the photovoltaic device formed by the method according to this embodiment improved the reproducibility of the deposited film because the plasma stabilized. As a result, the reproducibility of the photovoltaic device was significantly improved.

The reliability of the foregoing photovoltaic devices under practical usage conditions was examined by performing the following durability test. The photovoltaic devices respectively according to Example 9 and Comparative Example 9 were vacuum sealed by protection films each of which was made of polyvinylidene fluoride (VDF), followed by allowing them to stand for one year under practical usage conditions (placed outdoors while connecting 50 Ω fixed resistances to the two output terminals thereof). Then, the photoelectric conversion efficiency was again evaluated to examine the deterioration ratio (obtained by dividing the deteriorated value of the photoelectric conversion efficiency by the initial photoelectric conversion efficiency) occurring due to light irradiation, temperature differences, wind, and rain. As a result, the deterioration ratio of the photovoltaic device according to Example 9 was significantly improved to 0.69 assuming that the deterioration ratio of the photovoltaic device according to Comparative Example 9 was 1. That is, the i-type layer which determines the characteristics of the photovoltaic device formed by the method according to this embodiment experience reduced network disorders during film deposition because the plasma was stabilized and the influence of unnecessary ions which damage the deposited film were effectively eliminated. As a result, the reproducibility of the photovoltaic device was significantly improved.

EXAMPLE 10

An a-SiGe:H photovoltaic device structured as shown in FIG. 2 was manufactured by using the deposited film forming apparatus shown in FIG. 1B.

In this embodiment, the substrate 201 comprised a 10 cm×10 cm stainless steel (SUS304) plate having a mirror surface formed by polishing and a thickness of 0.1 mm. A silver film having a thickness of 0.5 µm was formed thereon by the vacuum evaporation method to serve as a light reflecting layer 202 on the stainless steel plate. The silver layer was deposited by setting the temperature of the substrate to 350° C., so that a projection and pit structure having a period of about 1 µm was formed on the surface of the silver layer. Then, a zinc oxide layer was formed similarly to Example 9 to serve as the light reflection enhancing layer 203.

Then, the n-type layer 204 was formed similarly to that according to Example 9, and an a-SiGe:H film serving as the i-type layer 205 was formed as follows: the gas in the deposition chamber 101 and the pipes was temporarily exhausted to a negative pressure level of 10$^{-6}$ Torr or lower, and the substrate 104 was heated to 350° C. by the heater 105, followed by maintaining the foregoing temperature. The introduction valves 1041 and 1042 were opened to introduce 100 sccm of SiH$_4$ gas and 50 sccm of GeH$_4$ into the deposition chamber 101 via the sub-valve 108 and the gas introduction pipe 103. The pressure in the deposition chamber 101 was set at 5 mTorr by adjusting the degree of opening of the conductance valve 107 while observing the vacuum gauge 106. Then, RF energy of 600 W from the bias power source 111 was applied to the bias rod 112. Then, the output power of a µW power source (omitted from illustration) was set to 400 W, followed by introducing the µW power into the deposition chamber 101 through the waveguide pipe (omitted from illustration), the waveguide portion 110, and the dielectric window 102 to generate the microwave glow discharge. As a result, formation of the i-type semiconductor layer was commenced on the n-type semiconductor layer. The fact that the microwave energy was smaller than the energy that completely decomposed the raw material gas had been confirmed previously.

When the thickness of the i-type semiconductor layer 205 had increased to about 200 nm, the supply of the microwave power was stopped, the output from bias power source 111 was turned off, and the gas introduction into the deposition chamber 101 was stopped. Thus, forming of the i-type semiconductor layer 205 was completed. The deposition speed of the i-type layer was about 11 nm/sec.

Then, the p-type layer 206, the transparent electrode 207, and the collecting electrode 208 were formed similarly to Example 9, so that a photovoltaic device (Example 10) was manufactured.

As comparative examples with respect to the foregoing sample, two types of samples were manufactured. One of the samples was an a-SiGe:H photovoltaic device (Comparative Example 10-1) manufactured under the same conditions as those employed to manufacture the photovoltaic device according to Example 10 except for the i-type layer forming process in which the semiconductor layer was deposited by setting the RF energy to 300 W, which is smaller than the microwave energy. The other one was an a-SiGe:H photovoltaic device (Comparative Example 10-2) manufactured under the same conditions as those employed to manufacture the photovoltaic device according to Example 10 except for the i-type layer forming process in which the semiconductor layer was deposited by setting the microwave energy to 500 W, which is smaller than the microwave energy required to completely decompose the raw material gas.

The current-voltage characteristics of the photovoltaic devices according to example 10 and Comparative Examples 10-1 and 10-2 thus manufactured were measured, so that the photoelectric conversion efficiency was determined. As a result, the photovoltaic device (Example 10) manufactured by the deposited film forming method according to this embodiment exhibited a significantly improved photoelectric conversion efficiency of 1.18 while assuming that the value of the photovoltaic device (Comparative Example 10-1) was 1. The photovoltaic device according to Comparative Example 10-2 was evaluated similarly, resulting in a photoelectric conversion efficiency of 0.94 which was inferior to the photovoltaic device according to Comparative Example 10-1.

As a result, the i-type layer which determines the characteristics of the photovoltaic device formed by the method of forming a deposited film according to this embodiment was given a uniform deposition and improved characteristics because the ion source contributing to the improvement in the characteristics of the film was effectively selected, and the uniformity and the stability of the plasma were improved. As a result, the photoelectric conversion efficiency of the photovoltaic device was significantly improved.

EXAMPLE 11

In this embodiment, an a-Si:H/a-SiGe:H tandem-type photovoltaic device structured as shown in FIG. 8 was manufactured as follows by using the deposited film forming apparatus shown in FIG. 1B.

The photovoltaic device comprises a first i-type layer made of a-SiGe:H and a second i-type layer made of a-Si:H.

In this embodiment, the substrate 801 comprised a 10 cm×10 cm stainless steel (SUS304) plate with a mirror surface produced by polishing and a thickness of 0.1 mm. A silver film having a thickness of 0.5 μm was formed on the stainless steel plate by the vacuum evaporation method to serve as a light reflecting layer 802. The silver layer was deposited by setting the temperature of the substrate to 400° C., so that a projection and pit structure having a period of about 1 μm and a vertical level difference of about 0.4 μm was formed on the surface of the silver layer. Then, a zinc oxide layer was formed similarly to Example 9 to serve as the light reflection enhancing layer 803.

Then, the first n-type layer 804, the a-SiGe:H film serving as the first i-type layer 805, and the first p-type layer 806 were formed similarly to Example 10. Further, the second n-type layer 807, the a-Si:H film serving as the second i-type layer 808, and the second p-type layer 809 were formed similarly to Example 9.

After the foregoing process had been completed, the transparent electrode 810 and the collecting electrode 811 were formed similarly to Example 9, so that a photovoltaic device (Example 11) was manufactured.

As a comparative example, an a-Si:H/a-SiGe:H tandem-type photovoltaic device (Comparative Example 11) was manufactured under the same conditions for forming the photovoltaic device according to Example 11 except that the conductive member 114 was not used in the process for forming the first and second i-type layers, that is, the potential of the mesh 113 was not made to be the same as the substrate 104 but rather it was in a floating state at the time of depositing the semiconductor layer.

The current-voltage characteristics of the photovoltaic devices according to Example 11 and Comparative Example 11 thus manufactured were measured, so that the photoelectric conversion efficiencies were determined. As a result, the photovoltaic device (Example 11) manufactured by the deposited film forming method according to this embodiment exhibited a significantly improved photoelectric conversion efficiency of 1.24 while assuming that the value of the photovoltaic device (Comparative Example 11) was 1. That is, the i-type layer which determines the characteristics of the photovoltaic device formed by the method of forming a deposited film according to this embodiment was given a uniform deposition and improved characteristics because the ion source contributing to the improvement in the characteristics of the film was effectively selected, the uniformity and the stability of the plasma were improved. As a result, the photoelectric conversion efficiency of the photovoltaic device was significantly improved.

Similar experiments were repeated 10 times to examine the scattering of the photoelectric conversion efficiencies of the photovoltaic devices. As a result, the range of scattering of the photovoltaic devices manufactured by the method of forming the deposited film according to the invention was 0.44 in contrast with the range of scattering of the photovoltaic device according to the comparative example which was assumed to be 1. That is, the i-type layer which determines the characteristics of the photovoltaic device formed by the method of forming a deposited film according to this embodiment had improved reproducibility of the deposited film because the plasma was stabilized. As a result, the reproducibility of the photovoltaic device was significantly improved.

EXAMPLE 12

A photovoltaic device shown in FIG. 15A comprising n and p-type layers formed by an RF plasma CVD method and an i-type layer formed by a CVD method was formed.

Figure 17:
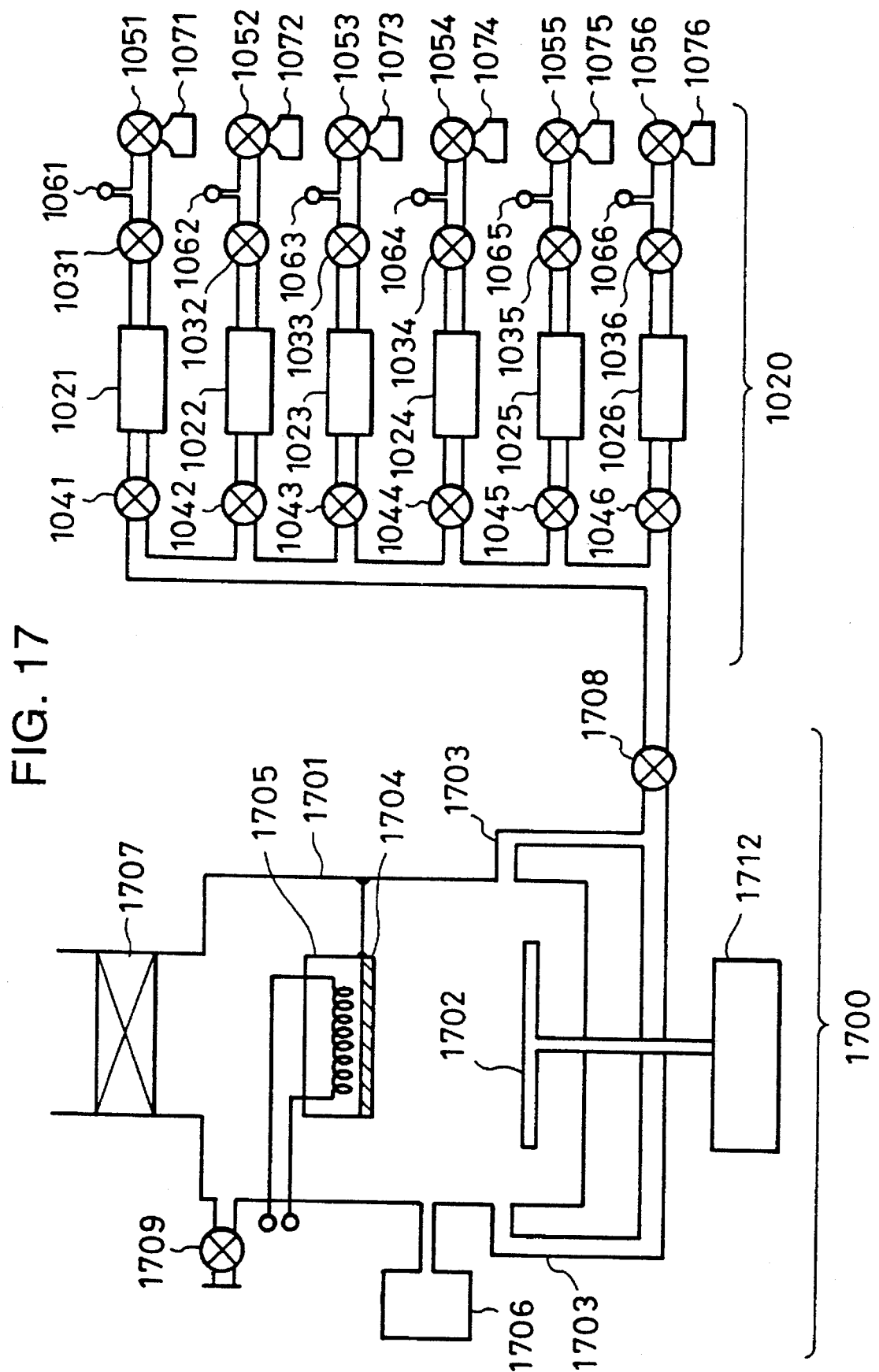
FIG. 17 is a schematic view which illustrates an example of the structure of a deposited film forming apparatus adapted to perform a RF plasma CVD method.

FIG. 17 illustrates an apparatus for manufacturing such a photovoltaic device and comprising raw material gas supply apparatus 1020 and deposition apparatus 1700 adapted to perform the RF plasma CVD method.

The gas cylinders 1071 to 1076 shown in FIG. 17 were filled with raw material gases for manufacturing the non-single crystal silicon semiconductor layer according to the present invention. Reference numeral 1071 represents a $SiH_4$ gas (purity 99.999%) cylinder, 1072 represents a $H_2$ gas (purity 99.9999%) cylinder, 1073 represents a cylinder with $B_2H_6$ gas (purity 99.999%, $B_2H_6/H_2$) cylinder diluted with $H_2$ gas to 10%, 1074 represents a cylinder with $PH_3$ gas (purity 99.99%, $PH_3/H_2$ gas) diluted with $H_2$ gas to 10%, 1075 represents a $CH_4$ gas (purity 99.9999%) cylinder, and 1076 represents a $GeH_4$ gas (purity 99.99%) cylinder. When the gas cylinders 1071 to 1076 were installed, the foregoing gases were previously introduced into the gas pipes arranged from the valves 1051 to 1056 to the introduction valves 1031 and 1036.

Referring to FIG. 17, reference numeral 1704 represents a conductive substrate made of 50 mm×50 mm stainless steel (SUS430BA) having a thickness of 1 mm and having a mirror polished surface, the conductive substrate 1704 having a reflecting layer made of a silver thin film formed by a sputtering method to have a thickness of 100 nm, followed by evaporating a ZnO thin film serving as the transparent conductive layer on the conductive substrate to have a thickness of 1 μm.

First, the $SiH_4$ gas was introduced from the gas cylinder 1071, the $H_2$ gas was introduced from the gas cylinder 1072, the $B_2H_6/H_2$ gas was introduced from the gas cylinder 1073, the $PH_3H_2$ gas was introduced from the gas cylinder 1704, the $CH_4$ gas was introduced from the gas cylinder 1705 and the $GeH_4$ gas was introduced from the gas cylinder 1076 by opening the corresponding valves 1051 to 1056. The pressure adjusters 1061 to 1066 were used to adjust the pressure of each gas to about 2 $kg/cm^2$.

Then, confirmation was made that the leak valve 1709 of the deposition chamber 1701 was closed, and another confirmation was made that the discharge valves 1041 to 1046 and the sub-valve 1708 were opened. Then, the conductance (butterfly type) valve 1707 was fully opened to exhaust the gas in the deposition chamber 1701 and the gas pipes by means of a vacuum pump (omitted from illustration). When the vacuum gauge 1706 showed a pressure level of about $1×10^{-4}$ Torr, the sub-valve 1708 and the discharge valves 1041 to 1046 were closed.

Then, the introduction valves 1031 to 1036 were gradually opened to introduce the gases into the mass flow controllers 1021 to 1026.

After the preparation for forming the films was completed, the n-type layer serving as the first conductive layer was formed.

The n-type layer was formed in such a manner that the heater 1705 was actuated to raise the temperature of the substrate 1704 to 350° C. Then, the discharge valves 1041, 1042, and 1044 were gradually opened to introduce the $SiH_4$ gas, $H_2$ gas, and the $PH_3/H_2$ gas into the deposition chamber 1701 through the gas introduction pipe 1703. At this time, the flow rate of the $SiH_4$ gas was set at 2 sccm, the $H_2$ gas at 40 sccm, and the $PH_3/H_2$ gas at 1 sccm by adjusting the corresponding mass flow controllers 1021, 1022, and 1024. The pressure in the deposition chamber 1701 was set at 1 Torr by adjusting the degree of opening of the conductance valve 1707 while observing the vacuum gauge 1706. Then, the output power of the RF power source (omitted from illustration) was set at 5 $mW/cm^3$, followed by supply the RF power to the cathode 1702 via the RF matching box 1712 to generate the RF glow discharge. Thus, forming of the n-type layer on the transparent electrode was commenced. When the n-type layer having a thickness of 10 nm had been formed, the RF glow discharge was stopped, the discharge valves 1041, 1042, and 1044 and the sub-valve 1708 were closed to stop the gas introduction into the deposition chamber 1701. Thus, the n-type layer was formed.

Then, the deposition film forming apparatus used for forming the n-type layer, composed of the raw material gas supply system 1020 and the deposition apparatus 100 for forming the i-type layer, shown in FIG. 1A and adapted to the mW plasma CVD method was used, so that the i-type layer was formed on the n-type layer.

Referring to the drawing, reference numeral 104 represents a conductive substrate on which the n-type layer was formed by the RF plasma CVD method.

Each of the gas cylinders 1071 to 1076 was filled with raw material gas similar to that used for forming the n-type layer. Each gas was introduced into the mass flow controllers 1021 to 1026 by the same procedure employed during forming of the n-type layer.

After the preparation for forming the film had been completed, the i-type layer was formed on the substrate 104.

The i-type layer was formed in such a manner that the heater 105 was actuated to raise the temperature of the substrate 104 to 350° C. Then, the discharge valve 1041 and the sub-valve 108 were gradually opened to introduce the $SiH_4$ gas and the $H_2$ gas into the deposition chamber 101 through the gas introduction pipe 103. At this time, the flow rate of the $SiH_4$ gas was set at 200 sccm and the $H_2$ gas at 200 sccm by adjusting the corresponding mass flow controllers 1021 and 1022. The pressure in the deposition chamber 101 was set at 5 mTorr by adjusting the degree of opening of the conductance valve 107 while observing the vacuum gauge 106. Then, the RF bias was set at 100 $mW/cm^3$, and the DC bias power source was set to 70 V with respect to the substrate 104, followed by supplying them to the bias rod 112. Then, the output power of a μW power source (omitted from illustration) was set at 100$mW/cm^3$, followed by introducing the μW power into the deposition chamber 101 through the waveguide pipe (omitted from illustration), the waveguide portion 110, and the dielectric window 102 to generate the microwave glow discharge. As a result, forming of the i-type layer on the n-type layer was commenced. When an i-type layer having a thickness of 400 nm was formed, the μW glow discharge was stopped and the output from the bias power source 111 was turned off. Thus, forming of the i-type layer was completed.

Then, a p-type layer was formed on the i-type layer by the RF plasma CVD method. The manufacturing apparatus used at the time of forming the n-type layer, shown in FIG. 17, composed of the raw material gas supply apparatus 1020 and the deposition apparatus 1700 adapted to the RF plasma CVD method was used, so that a p-type layer was formed on the i-type layer.

Referring to the drawing, reference numeral 1704 represents a conductive substrate on which the n-type layer was formed by the RF plasma CVD method and the i-type layer was formed by the μW plasma CVD method, the layers being sequentially formed.

Each of the gas cylinders 1071 to 1076 was filled with raw material gas similar to that used at the time of forming the n-type layer. Each gas introduced into the mass flow controllers 1021 to 1026 by the same procedure employed at the time of forming the n-type layer.

After the preparation for forming the films had been completed, the p-type layer was formed on the substrate 1704.

The p-type layer was formed in such a manner that the heater 1705 was actuated to raise the temperature of the substrate 1704 to 250° C. Then, the discharge valves 1041 to 1043 and the sub-valve 1708 were gradually opened to introduce the $SiH_4$ gas, the $H_2$ gas, and the $B_2H_6/H_2$ gas into the deposition chamber 1701 through the gas introduction pipe 1703. At this time, the flow rate of the $SiH_4$ gas was set at 1 sccm, the $H_2$ gas at 100 sccm, and the $B_2H_6/H_2$ gas at 1 sccm by adjusting the corresponding mass flow controllers 1021 to 1023. The pressure in the deposition chamber 1701 was set at 1 mTorr by adjusting the degree of opening of the conductance valve 1707 while observing the vacuum gauge 1706. Then, the output power of the RF power source (omitted from illustration) was set to 200 mW/cm$^3$, followed by supplying the RF power to the cathode 1702 via the RF matching box 1712 to generate the RF glow discharge. As a result, forming of the p-type layer on the i-type layer was commenced. When a p-type layer having a thickness of 5 nm was formed, the RF glow discharge was stopped, and the discharge valves 1041 to 1043 and the sub-valve 1708 were closed to stop the gas introduction into the deposition chamber 1701. Thus, forming of the p-type layer was completed.

The discharge valves 1041 to 1046 except for those for the required gases, of course, were completely closed at the time of forming the foregoing layers. Further, retention of the gas in the deposition chamber 1701 and the pipes arranged from the discharge valves 1041 to 1046 to the deposition chamber 1701 was prevented by, if necessary, closing the discharge valves 1041 to 1046, by opening the sub-valve 1708, and by completely opening the conductance valve 1707 to temporarily exhaust the gas in the system.

When the conductive substrate is introduced into the deposition chamber for forming the i-type layer after the n-type layer has been formed, and when the same is introduced into the deposition chamber for forming the p-type layer after the i-type layer has been formed, it can be introduced into the foregoing deposition chambers while preventing exposure, by means of a structure (omitted from illustration) provided therein.

Then, the transparent electrode was formed on the p-type layer by the apparatus shown in FIG. 4 and adapted to the vacuum evaporation method. Referring to FIG. 4, reference numeral 402 represents a conductive substrate on which the n, i, and p-type layers have been formed. Reference numeral 404 represents an evaporation source composed of indium (In) and tin (Sn) at a molar ratio 1:1. Reference numeral 410 represents a gas introduction valve connected to an $O_2$ gas cylinder (omitted from illustration).

First, the substrate 402 was heated to 180° C. by the heater 403, followed by exhausting gas in the deposition chamber 401 by a vacuum pump (omitted from illustration). When the vacuum gauge 408 showed a level of about $1\times10^{-5}$ Torr, the gas introduction valve 410 was gradually opened to introduce the $O_2$ gas into the deposition chamber 401. The flow rate of the $O_2$ gas was set at 10 sccm at this time by using the mass flow controller 411. The pressure in the deposition chamber 401 was set at about 0.3 mTorr by adjusting the opening of the conductance (butterfly) 409 while observing the vacuum gauge 408. Then, the AC power source 406 was turned on to heat the evaporation source 404.

Then, the shutter 407 was opened to start forming of the transparent electrode on the substrate 402, so that a transparent electrode having a thickness of 70 nm was formed. At this time, the shutter 407 was closed, the output from AC power source 406 was turned off, and the gas introduction valve 410 was closed to stop the gas introduction into the deposition chamber 401. Thus, the transparent electrode was formed.

Then, silver paste (5007 manufactured by Dupont) to serve as the collecting electrode was screen-printed (FS-4040-ALL manufactured by Fujioka) on the transparent electrode to have a thickness of 20 μm, so that a photovoltaic device was manufactured (Example 12). The conditions for manufacturing the photovoltaic device are shown in Table 9.

Comparative Example 12-1

All of the photoelectric conversion layers, i.e., the n-type layer, the i-type layer, and the p-type layer were formed by the RF plasma CVD method to manufacture a photovoltaic device.

By employing the same manufacturing conditions as those according to Example 12, the conductive substrate was manufactured with a reflecting layer and a transparent conductive layer formed on the substrate thereof.

As shown in FIG. 17, a manufacturing apparatus similar to that used to form the n and the p-type layers in Example 12, composed of the raw material gas supply apparatus 1020 and the deposition apparatus 1700 and adapted to the RF plasma CVD method was used, so that the n-type layer, the i-type layer, and the p-type layer were sequentially formed on the foregoing conductive substrate. Referring to FIG. 17, reference numeral 1704 represents the foregoing conductive substrate. The gas cylinders 1071 to 1076 were filled with raw material gases which were the same as those according to Example 12. By the same operational procedure as that according to Example 12, the gases were introduced into the mass flow controllers 1021 to 1026.

After the preparation for forming the films had been completed, the n-type layer, the i-type layer and the p-type layer were formed on the substrate 1704.

The n-type layer was formed by the same method as that employed in Example 12.

The i-type layer was formed in such a manner that the heater 1705 was actuated to raise the temperature of the substrate 1704 to 300° C. Then, the discharge valves 1041 and 1042 and the sub-valve 1708 were gradually opened to introduce the $SiH_4$ gas and the $H_2$ gas into the deposition chamber 1701 through the gas introduction pipe 1703. At this time, the flow rate of the $SiH_4$ gas was set at 2 sccm and the $H_2$ gas at 40 sccm by adjusting the corresponding mass flow controllers 1021 and 1022. The pressure in the deposition chamber 1701 was set at 1 Torr by adjusting the degree of opening of the conductance valve 1707 while observing the vacuum gauge 1706. Then, the RF power source (omitted from illustration) was set at 40 mW/cm$^3$ to supply RF power to the cathode 1702 via the RF matching box 1712, so that RF glow discharge was generated. Thus, forming of the i-type layer on the n-type layer was commenced. When an i-type layer having a thickness of 400 nm was formed, the RF glow discharge was stopped. Thus, forming of the i-type layer was completed.

Then, the p-type layer was manufactured by the same method as that according to Example 1.

The discharge valves 1041 to 1046, except those for the required gases, were completely closed at the time of forming the foregoing layers. Further, retention of the gas in the deposition chamber 1701 and the pipes arranged from the discharge valves 1041 to 1046 to the deposition chamber 1701 was prevented by, if necessary, closing the discharge valves 1041 to 1046, opening the sub-valve 1708, and completely opening the conductance valve 1707 to exhaust temporarily the gas in the system.

Then, the transparent electrode and the collecting electrode were formed on the p-type layer similarly to Example 12, so that the photovoltaic device (Comparative Example 12-1) was manufactured. The conditions for manufacturing the photovoltaic device are shown in Table 10.

The initial characteristics of the photovoltaic device respectively according to Example 12 and Comparative Example 12-1 were measured. The initial characteristics were measured by evaluating the photoelectric conversion efficiency by irradiating the photovoltaic devices according to Example 12 and Comparative Example 12-1 with AM-1.5 (100 mW/cm$^2$) light to measure the V-I characteristics.

As a result of the measurement, the photovoltaic device according to Example 12 exhibited a superior photoelectric conversion efficiency of 1.42 times that of the photovoltaic device according to Comparative Example 12-1.

Further, the photovoltaic devices respectively according to Example 12 and Comparative Example 12-1 were irradiated with short-wave length light created by fastening a 400 nm interference filter to an AM-1.5 (100 mW/cm$^2$) source to measure the V-I characteristics. The fill factor thus obtained was used to measure the degree of application of the electric field on the p-type layer side of the i-type layer. As a result of the measurement, the photovoltaic device according to Example 12 exhibited a superior fill factor that is 1.27 times that of the photovoltaic device according to Comparative Example 12-1.

As a result of the measurements thus performed, the photovoltaic device according to Example 12 was determined to have excellent characteristics with respect to the conventional photovoltaic device according to Comparative Example 12-1, resulting in a confirmation of the superiority of the present invention.

Comparative Example 12-2

The n, i, and p-type layers were formed on the conductive substrate, on which the reflecting layer and the transparent conductive layer similar to those according to Example 12 were formed, by a method similar to that according to Example 12 except for the conditions shown in Table 11. Further, the transparent electrode and the collecting electrode were formed similarly to Example 1, so that a photovoltaic device was manufactured (Comparative Example 12-2).

The initial characteristics of the photovoltaic devices respectively according to Example 12 and Comparative Example 12-2 were measured. The initial characteristics were measured by evaluating the photoelectric conversion efficiency by irradiating the photovoltaic devices according to Example 12 and Comparative 12-2 with AM-1.5 (100 mW/cm$^2$) light to measure the V-I characteristics. As a result of the measurement, the photovoltaic devices according to Example 12 exhibited superior photoelectric conversion efficiency of 1.16 times to that of the photovoltaic devices according to Comparative Example 12-2.

Further, the photovoltaic devices respectively according to Example 12 and Comparative Example 12-2 were irradiated with short-wave length light created by fastening a 400 nm interference filter to an AM-1.5 (100 mW/cm$^2$) source to measure the V-I characteristics. The fill factor thus obtained was used to measure the degree of application of the electric field on the p-type side of the i-type layer. As a result of the measurement, the photovoltaic device according to Example 12 exhibited a superior fill factor that is 1.09 times that of the photovoltaic device according to Comparative Example 12-2.

Comparative Example 12-3

By employing the same conditions as those according to Example 12, the n, i, and p-type layers were formed, and the i-type layer was formed under the same conditions as those according to Comparative Example 12-1, the foregoing layers being formed on a high-resistance single crystal silicon substrate (specific resistance 100 Ωcm) to each have a thickness of 1 μm. The content of hydrogen in the film was measured so as to be subjected to comparisons.

The content of hydrogen in the film was determined by using a Fourier transform infrared ray absorption spectrometer FT-IRI720-X manufactured by Perkin Elmer) from the sum of the integrated intensities of the infrared ray absorption coefficient in SiH stretching mode adjacent to 2000 cm$^{-1}$ or a SiH$_2$ stretching mode adjacent to 2100 cm$^{-1}$.

As a result, it was found that the i-type layer formed by the μW plasma CVD method according to Example 12 contains hydrogen in a quantity that is about 1.6 times that contained in the n-type layer formed by the RF plasma CVD method according to Example 12 and is about 1.8 times the quantity in the p-type layer. The i-type layer formed by the μW plasma CVD method according to Comparative Example 12-1 contains hydrogen in a quantity that is about 0.86 times that in the n-type layer formed by the RF plasma CVD method according to Example 12. The quantity is about 0.89 times the quantity in the p-type layer.

As a result of the measurements, it was found that the photovoltaic device exhibits excellent characteristics only when the content of hydrogen in the film formed by the μW plasma CVD method is larger than that in the film formed by the RF plasma CVD method. Thus, the superiority of the present invention was confirmed.

EXAMPLE 13

By changing the speed at which the i-type layer was formed, the dependency of the photoelectric conversion efficiency upon the deposition speed was evaluated.

The n-type layer was formed under the same conditions as those according to Example 12, on a conductive substrate having a reflecting layer and a transparent conductive layer similarly to those according to Example 12. Then, the i-type layer was formed on the n-type layer by changing the high frequency power to be supplied as shown in Table 12 and by employing the other conditions that are the same as those according to the μW plasma CVD method according to Example 12 and those according to the RF plasma CVD method according to Comparative Example 12-1. Then, the transparent electrode and the collecting electrode were formed on the i-type layer by a method similar to that according to Example 12. Thus, a plurality of photovoltaic devices were manufactured (Examples 13-1 to 13-10).

Figure 18:
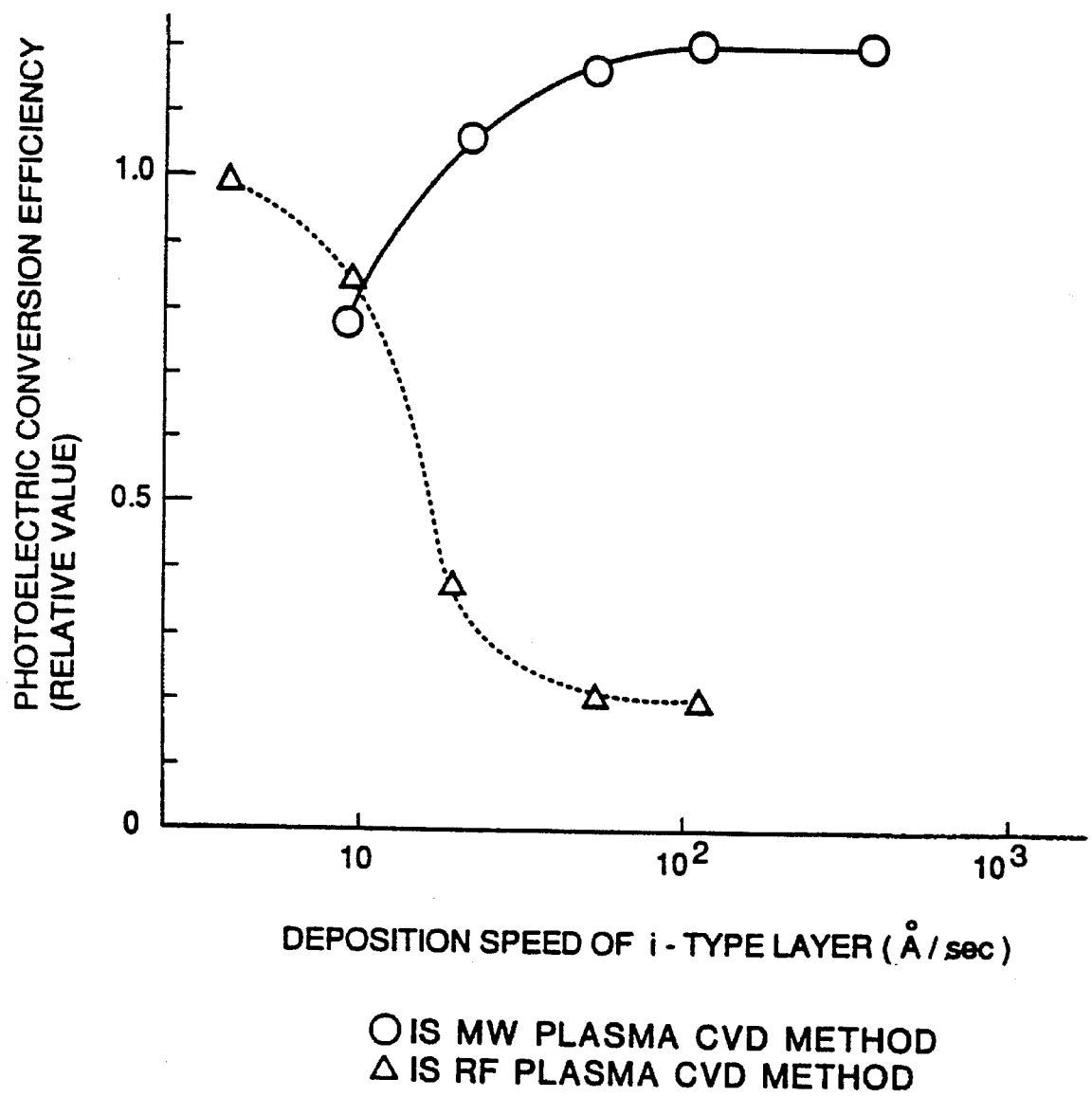
FIG. 18 is a graph which illustrates the relationship between the deposition speed of an i-type layer and the photoelectric conversion efficiency.

The samples thus formed were measured similarly to Example 12, resulting in the values shown in Table 12 and FIG. 18. As shown in Table 12 and FIG. 18, in the range in which the deposition speed is 2 nm/sec or higher, the photovoltaic devices (Examples 13-2 to 13-5) having the i-type layer formed by the μW plasma CVD method exhibit excellent photovoltaic conversion efficiency in comparison to the photovoltaic devices (Examples 13-8 to 13-10) having the i-type layer formed by the RF plasma CVD method.

EXAMPLE 14

A photovoltaic device shown in FIG. 16A was manufactured in such a manner that the n-type layer and the p-type layer formed by the RF plasma CVD method, the i-type layer formed by the mW plasma CVD method, and i-type interfacial layers formed by the RF plasma CVD method were respectively inserted into the interfaces between the i-type layer and the n-type layer and the i-type layer and the p-type layer.

FIG. 17 illustrates an apparatus for manufacturing a photovoltaic device composed of the raw material gas supply apparatus 1020 and the deposition apparatus 1700 adapted to the RF plasma CVD method.

The gas cylinders 1071 to 1076 shown in FIG. 17 were previously filled with the gases similarly to Example 12. Further, the gases were introduced into the gas pipes arranged between the valves 1051 to 1056 and the introduction valves 1031 to 1036 at the time of fastening the gas cylinders 1071 to 1076.

Referring to FIG. 17, reference numeral 1704 represents a conductive substrate made of a 50 mm×50 mm stainless steel (SUS430BA) plate having a thickness of 1 mm and having a mirror surface. The conductive substrate 1704 had a reflecting layer made of a silver thin film formed by a sputtering method to a thickness of 100 nm, followed by formation of a ZnO thin film serving as a light reflection enhancing layer on the conductive substrate to a thickness of 1 μm by sputtering.

First, the SiH$_4$ gas was introduced form the gas cylinder 1071, the H$_2$ gas was introduced from the gas cylinder 1072, the B$_2$H$_6$ / H$_2$ gas was introduced from the gas cylinder 1073, the PH$_3$/H$_2$ gas was introduced from the gas cylinder 1074, the CH$_4$ gas was introduced from the gas cylinder 1075, and the GeH$_4$ gas was introduced from the gas cylinder 1076 by opening the corresponding valves 1051 to 1056. The pressure adjusters 1061 to 1066 were used to adjust the pressure of each gas to about 2 kg/cm$^2$.

Then, a confirmation was made that the introduction valves 1031 to 1036 and the leak valve 1709 of the deposition chamber 1701 were closed, and another confirmation was made that the discharge valves 1041 to 1046 and the sub-valve 1708 were opened. Then, the conductance (butterfly type) valve 1707 was fully opened to exhaust the gas in the deposition chamber 1701 and the gas pipes by means of a vacuum pump (omitted from illustration). When the vacuum gauge 1706 showed a level about 1×10$^{-4}$ Torr, the sub-valve 1708 and the discharge valves 1041 to 1046 were closed.

Then, the introduction valves 1031 to 1036 were gradually opened to introduce the gases into the mass flow controllers 1021 to 1026.

After the preparation for forming the films has been completed, the n-type layer was formed on the substrate 1704.

The n-type layer was formed in such a manner that the heater 1705 was actuated to raise the temperature of the substrate 1704 to 350° C. Then, the discharge valves 1041, 1042, and 1044 were gradually opened to introduce the SiH$_4$ gas, H$_2$ gas, and the PH$_3$/H$_2$ into the deposition chamber 1701 through the gas introduction pipe 1703. At this time, the flow rate of the SiH$_4$ gas was set at 2 sccm, the H$_2$ gas at 40 sccm, and the PH$_3$/H$_2$ gas at 1 sccm by adjusting the corresponding mass flow controllers 1021, 1022, and 1024. The pressure in the deposition chamber 1701 was set at 1 Torr by adjusting the degree of opening of the conductance valve 1707 while observing the vacuum gauge 1706. Then, the output power of the RF power source (omitted from illustration) was set at 5 mW/cm$^3$, followed by supplying the RF power to the cathode 1702 via the RF matching box 1712 to generate the RF glow discharge. Thus, forming of the n-type layer on the transparent electrode was commenced. When an n-type layer having a thickness of 10 nm had been formed, the RF glow discharge was stopped, and discharge valves 1041, 1042, and 1044 and the sub-valve 1708 were closed to stop the gas introduction into the deposition chamber 1701. Thus, the n-type layer was formed.

Then, the i-type interfacial layer was formed on the n-type layer by the RF plasma CVD method.

The i-type interfacial layer was formed in such a manner that the heater 1705 was actuated to raise the temperature of the substrate 1704 to 300° C. Then, the discharge valves 1041 and 1042 and the sub-valve 1708 were gradually opened to introduce the SiH$_4$ gas and the H$_2$ gas into the deposition chamber 1701 through the gas introduction pipe 1703. At this time, the flow rate of the SiH$_4$ gas was set at 2 sccm and the H$_2$ gas at 20 sccm by adjusting the corresponding mass flow controllers 1021 and 1022. The pressure in the deposition chamber 1701 was set at 1 Torr by adjusting the degree of opening of the conductance valve 1707 while observing the vacuum gauge 1706. Then, the power of the RF power source (omitted from illustration) was set at 5 mW/cm$^3$, followed by supplying the RF power to the cathode 1702 via the RF matching box 1712 to generate the RF glow discharge. Thus, forming of the i-type interfacial layer on the n-type layer was commenced. When an i-type interfacial layer having a thickness of 20 nm had been formed, the RF glow discharge was stopped. Thus, forming of the i-type interfacial layer was completed.

Then, the deposition film forming apparatus shown in FIG. 1A and used for forming the n-type layer, composed of the raw material gas supply system 1020 and the deposition apparatus 100 for forming the i-type layer, was used, so that an i-type layer was formed on the i-type interfacial layer.

Referring to the drawing, reference numeral 104 represents a conductive substrate on which the n-type layer and the i-type interfacial layer were formed by the RF plasma CVD method. Each of the gas cylinders 1071 to 1076 was filled with the raw materials gas similar to that used during forming of the n-type layer. Each gas was introduced into the mass flow controllers 1021 to 1026 by the same procedure employed during forming of the n-type layer.

After the preparation for forming the films had been complete, the i-type layer was formed on the substrate 104.

The i-type layer was formed in such a manner that the heater 105 was actuated to raise the temperature of the substrate 104 to 300° C. Then, the discharge valves 1041 and 1042 and the sub-valve 108 were gradually opened to introduce the SiH$_4$ gas and the SiH$_4$ gas and the H$_2$ gas into the deposition chamber 101 through the gas introduction pipe 103. At this time, the flow rate of the SiH$_4$ gas was set at 200 sccm and the H$_2$ gas at 200 sccm by adjusting the corresponding mass flow controllers 1021 and 1022. The pressure in the deposition chamber 101 was set at 5 mTorr by adjusting the degree of opening of the conductance valve 107 while observing the vacuum gauge 106. Then, the RF bias of the bias power source was set at 100 mW/cm$^3$, and the DC bias was set at 70 V with respect to the substrate 1043, followed by supplying them to the bias rod 112. Then, the output power of a μW power source (omitted from illustration) was set at 100 mW/cm$^3$, followed by introducing the μW power into the deposition chamber 101 through the waveguide pipe (omitted from illustration), the waveguide portion 110, and the dielectric window 102 to generate the microwave glow discharge. As a result, forming of the i-type layer on the i-type interfacial layer was commenced. When an i-type layer having a thickness of 400 nm was formed, the μW glow discharge was stopped and the output from the bias power source ill was turned off. Thus, forming of the i-type layer was completed.

Then, the i-type interfacial layer was formed on the i-type layer by the RF plasma CVD method. The i-type interfacial layer was formed by a method similar to that employed to form the i-type interfacial layer between the n-type layer and the i-type layer. The heater 1705 was actuated to raise the temperature of the substrate 1704 to 250° C. Then, the discharge valves 1041 and 1042 and the sub-valve 1708 were gradually opened to introduce the SiH$_4$ gas and the H$_2$ gas into the deposition chamber 1701 through the gas introduction pipe 1703.

At this time, the flow rate of the SiH$_4$ gas was set at 2 sccm and the H$_2$ gas at 20 sccm by adjusting the corresponding mass flow controllers 1021 and 1022. The pressure in the deposition chamber 1701 was set at 1 Torr by adjusting the degree of opening of the conductance valve 1707 while observing the vacuum gauge 1706. Then, the power of the RF power source (omitted from illustration) was set at 5 mW/cm$^3$, followed by supplying the RF power to the cathode 1702 via the RF matching box 1712 to generate the RF glow discharge. Thus, forming of the i-type interfacial layer on the i-type layer was commenced. When an i-type interfacial layer having a thickness of 20 nm had been formed, the RF glow discharge was stopped. Thus, forming of the i-type interfacial layer was completed.

Then, the p-type layer was formed on the i-type interfacial layer by the RF plasma CVD method. The deposition film forming apparatus shown in FIG. 17 and used at the time of forming the n-type layer, composed of the raw material gas supply system 1020 and the deposition apparatus 100, was used, so that the p-type layer was formed on the i-type interfacial layer. Referring to the drawing, reference numeral 1704 represents a conductive substrate having the n-type layer and the i-type interfacial layer formed by the RF plasma CVD method, the i-type layer formed by the μW plasma CVD method, and the i-type interfacial layer formed by the RF plasma CVD method, the foregoing layers being formed sequentially. Each of the gas cylinders 1071 to 1076 was filled with the raw material gas similar to that used during forming of the n-type layer. Each gas was introduced into the mass flow controllers 1021 to 1026 by the same procedure employed at the time of forming the n-type layer.

After the preparation for forming the films had been completed, the p-type layer was formed on the substrate 1704. The p-type layer was formed in such a manner that the heater 1705 was actuated to raise the temperature of the substrate 1704 to 250° C. Then, the discharge valves 1041 to 1043 and the sub-valve 1708 were gradually opened to introduce the SiH$_4$ gas, the H$_2$ gas, and the B$_2$H$_6$/H$_2$ gas into the deposition chamber 1701 through the gas introduction pipe 1703. At this time, the flow rate of the SiH$_4$ gas was set at 1 sccm, the H$_2$ gas at 100 sccm, and the B$_2$H$_6$/H$_2$ gas at 1 sccm by adjusting the corresponding mass flow controllers 1021 to 1023. The pressure in the deposition chamber 1701 was set at 1 Torr by adjusting the degree of opening of the conductance valve 1707 while observing the vacuum gauge 1706. Then, the output power of the RF power source (omitted from illustration) was set at 200 mW/cm$^3$, followed by supplying the RF power to the cathode 1702 via the RF matching box 1712 to generate the RF glow discharge. As a result, forming of the p-type layer on the i-type interfacial layer was commenced. When a p-type layer having a thickness of 5 nm was formed, the RF glow discharge was stopped, and the discharge valves 1041 to 1043 and the sub-valve 1708 were closed to stop the gas introduction into the deposition chamber 1701. Thus, forming of the p-type layer was completed.

The discharge valves 1041 to 1046, except for those for the required gases, were completely closed at the time of forming the foregoing layers. Further, retention of the gas in the deposition chamber 1701 and the pipes arranged from the discharge valves 1041 to 1046 to the deposition chamber 1701 was prevented by, if necessary, closing the discharge valves 1041 to 1046, by opening the sub-valve 1708 and by completely opening the conductance valve 1707 to temporarily exhaust the gas in the system.

When the conductive substrate is introduced into the deposition chamber for forming the i-type layer after the i-type interfacial layer has been formed, and when the same is introduced into the deposition chamber for forming the i-type interfacial layer after the i-type layer has been formed, it can be introduced into the foregoing deposition chambers while preventing exposure, by means of a structure (omitted from illustration) provided therein.

Then, a transparent electrode was formed on the p-type layer by the apparatus shown in FIG. 4 and adapted to the vacuum evaporation method. Referring to FIG. 4, reference numeral 402 represents a conductive substrate on which the n, i, and p-type layers have been formed. Reference numeral 404 represents an evaporation source composed of indium (In) and tin (Sn) at a molar ratio 1:1. Reference numeral 410 represents a gas introduction valve connected to an O$_2$ gas cylinder (omitted from illustration).

First, the substrate 402 was heated to 180° C. by the heater 403, followed by exhausting the gas in the deposition chamber 401 by means of a vacuum pump (omitted from illustration). When the vacuum gauge 408 showed a level of about 1×10$^{-5}$ Torr, the gas introduction valve 410 was gradually opened to introduce the O$_2$ gas into the deposition chamber 401. The flow rate of the O$_2$ gas was set at 10 sccm at this time by using the mass flow controller 411. The pressure in the deposition chamber 401 was set at about 0.3 mTorr by adjusting the opening of the conductance (butterfly) 409 while observing the vacuum gauge 408. Then, the AC power source 406 was turned on to supply electric power to the heater 405 to heat the evaporation source 404. Then, the shutter 407 was opened to start forming of the transparent electrode on the substrate 402, so that a transparent electrode having a thickness of 70 nm was formed. At this time, the shutter 407 was closed, the output from AC power source 406 was turned off, and the gas introduction valve 410 was closed to stop the gas introduction into the deposition chamber 401. Thus, the transparent electrode was formed.

Then, silver paste (5007 manufactured by DuPont) to serve as the collecting electrode was screen-printed (FS-4040-ALL manufactured by Fujioka) on the transparent electrode to have a thickness of 20 μm, so that a photovoltaic device was manufactured (Example 14). The conditions for manufacturing the photovoltaic device are shown in Table 13.

The initial characteristics of the photovoltaic devices respectively according to Example 14 and Comparative Example 12-1 were measured, in which all of the photoelectric conversion layers (n, i and p-type layers) were formed by the RF plasma CVD method.

The initial characteristics were measured by evaluating the photoelectric conversion efficiency by irradiating the photovoltaic devices according to Example 14 and Comparative Example 12-1 with AM-1.5 (100 mW/cm$^2$) light to measure the V-I characteristics. As a results of the measurement, the photovoltaic device according to Example 14 was found to exhibit a superior photoelectric conversion efficiency of 1.44 times that of the photovoltaic device according to Comparative Example 12-1.

Further, the photovoltaic devices respectively according to Example 14 and Comparative Example 12-1 were irradiated with short-wave length light created by fastening a 400 nm interference filter to an AM-1.5 (100 mW/cm$^2$) source to measure the V-I characteristics. The fill factor thus obtained was used to measure the degree of application of the electric field on the p-type layer side (light incident side) of the i-type layer. As a result of the measurement, the photovoltaic device according to Example 14 exhibited a superior fill factor that is 1.30 times that of the photovoltaic device according to Comparative Example 12-1.

As a result of the measurements thus performed, it was determined that the photovoltaic device according to Example 14 has excellent characteristics with respect to the conventional photovoltaic device according to Comparative Example 12-1, resulting in a confirmation of the superiority if the present invention Comparative Example 14-1

The n-type layer, the i-type interfacial layer, the i-type layer, the i-type interfacial layer, and the p-type layer were stacked upon the conductive substrate except for the conditions shown in Table 14, the conductive substrate having a light reflecting layer and a light reflecting enhancing layer similar to those according to Example 14. Further, the transparent electrode and the collecting electrode were formed similarly to Example 14. As a result, a photovoltaic device was manufactured (Comparative Example 14-1).

The initial characteristics of the photovoltaic devices respectively according to Example 14 and Comparative Example 14-1 were measured.

The initial characteristics were measured by evaluating the photoelectric conversion efficiency by irradiating the photovoltaic deices according to Example 14 and Comparative Example 14-1 with AM-1.5 (100 mW/cm$^2$) light to measure the V-I characteristics.

As a result of the measurement, the photovoltaic device according to Example 14 exhibited a superior photoelectric conversion efficiency of 1.18 times that of the photovoltaic device according to Comparative Example 14-1.

Further, the photovoltaic devices respectively according to Example 14 and Comparative Example 14-1 were irradiated with short-wave length light created by fastening a 400 nm interference filter to an AM-1.5 (100 mW/cm$^2$) source to measure the V-I characteristics. The fill factor thus obtained was used to measure the degree of application of the electric field on the p-type layer side (light incident side) of the i-type layer. As a result of the measurement, the photovoltaic device according to Example 14 exhibited a superior fill factor that is 1.12 times that of the photovoltaic device according to Comparative Example 14-1.

Comparative Example 14-2

By employing the same conditions as those according to Example 14, the n-type layer, the i-type interfacial layer, the i-type layer, and the p-type layer were formed, and the i-type layer was formed under the same conditions as those according to Comparative Example 14-1, the foregoing layers being formed on a high-resistance single-crystal silicon substrate (specific resistance 100 Ωcm) to each have a thickness of 1 μm. The content of hydrogen in the films was measured so as to be subjected to comparisons.

The content of hydrogen in the films was determined by using a Fourier transform infrared ray absorption spectrometer (FT-IR1720-X manufactured by Perkin Elmer) from the sum of the integrated intensities of the infrared absorption coefficient in a SiH stretching mode adjacent to 2000 cm$^{-1}$ or a SiH$_2$ stretching mode adjacent to 2100 cm$^{-1}$.

As a result, it was found that the i-type layer formed by the μW plasma CVD method according to Example 14 contains hydrogen in a quantity that is about 1.21 that of hydrogen contained in the i-type interfacial layer formed by the RF plasma CVD method according to Example 14 and that is about 1.64 times that in the n-type layer. The i-type layer formed by the μW plasma CVD method according to Comparative Example 14-1 contains hydrogen in a quantity that is about 0.81 times that in the i-type interfacial layer formed by the RF plasma CVD method according to Example 14. The quantity is about 0.87 times the quantity in the n-type layer, and 0.92 times the quantity in the p-type layer.

As a result of the measurements, it was found that the photovoltaic device exhibits excellent characteristics only when the content of hydrogen in the film formed by the μW plasma CVD method is larger than that in the film formed by the RF plasma CVD method.

EXAMPLE 15

By changing the speed at which the i-type layer was formed, the dependency of the photoelectric conversion efficiency upon the deposition speed was evaluated.

The n-type layer and the i-type interfacial layer were formed under the same conditions as those according to Example 14 on a conductive substrate having a reflecting layer and a light reflection enhancing layer similarly to those according to Example 14. Then, the i-type layer was formed on the foregoing layers by changing the high frequency power to be supplied as shown in Table 15 and by employing the other conditions that are the same as those according to the μW plasma CVD method according to Example 14 and those according to the RF plasma CVD method according to Comparative Example 12-1. Then, the i-type interfacial layer, the p-type layer, the transparent electrode, and the collecting electrode were formed in this sequential order on the i-type layer by a method similar to that according to Example 14. Thus, a plurality of photovoltaic devices were manufactured (Examples 15-1 to 15-10). Each of the i-type interfacial layers has a thickness of 10 nm.

The samples thus formed were measured similarly to Example 14, resulting in values shown in Table 15. As a result, in the range in which the deposition speed is 2 nm/sec or higher, the photovoltaic devices (Examples 15-2 to 15-5) having the i-type layer formed by the μW plasma CVD method exhibit excellent photoelectric conversion efficiency in comparison to the photovoltaic devices (Examples 15-8 to 15-10) having the i-type layer formed by the RF plasma CVD method.

EXAMPLE 16

Change in the photoelectric conversion efficiency was examined by changing the thickness of the i-type interfacial layer.

Under similar conditions to those according to Example 14, the n-type layer, the i-type interfacial layer, the i-type layer, the i-type interfacial layer, and the p-type layer were, in this sequential order, formed on a conductive substrate on which the reflecting layer and the transparent conductive layer similar to Example 14 were formed. Further, transparent and collecting electrodes were formed on the foregoing layers, so that a plurality of photovoltaic devices were manufactured (Examples 16-1 to 16-7). The thickness of the i-type layer is as shown in Table 16.

Figure 19:
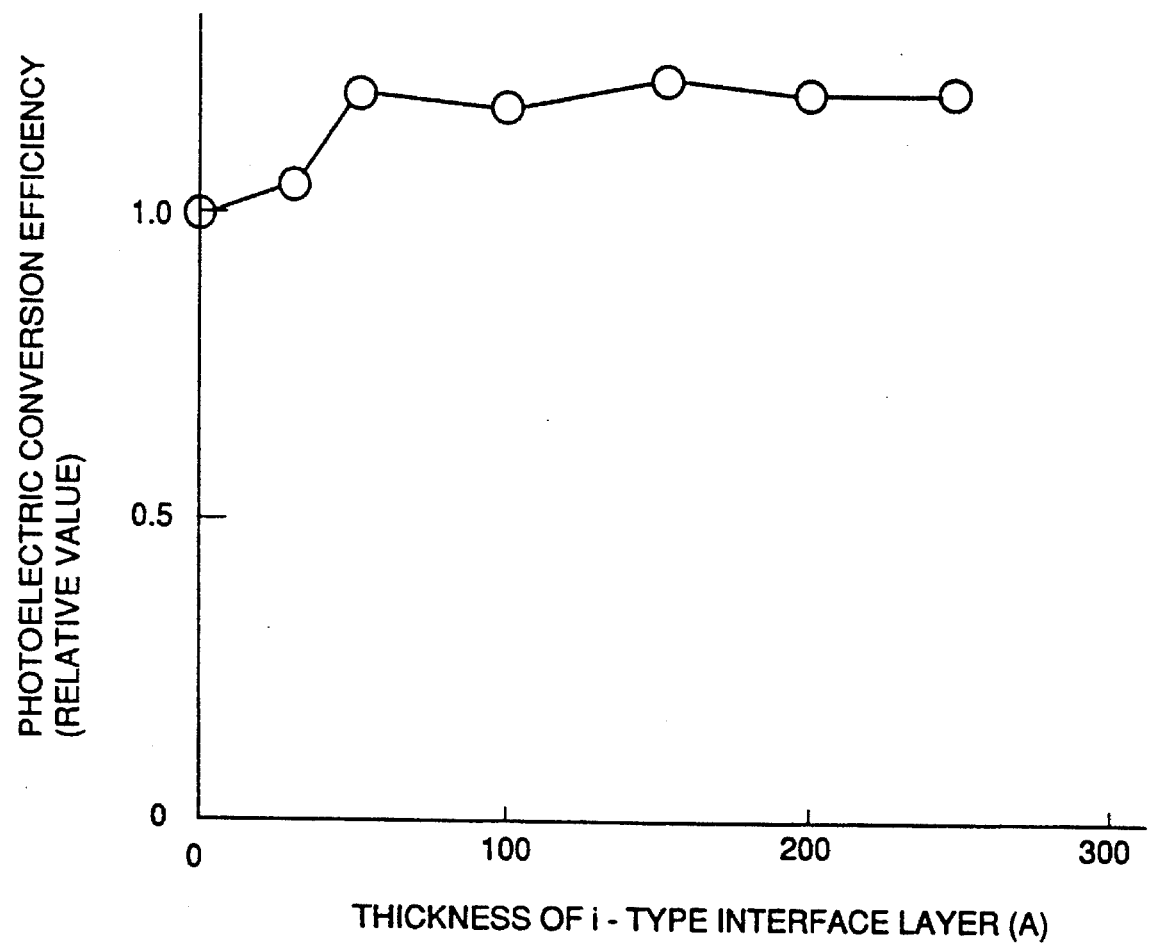
FIG. 19 is a graph which illustrates the relationship between the thickness of an i-type interfacial layer and the photoelectric conversion efficiency.

The results of measurements performed similarly to Example 14 are shown in Table 16 and FIG. 19. As a result, the photoelectric conversion efficiency can be improved if the thickness of the i-type interfacial layer is larger than 5 nm. Thus, the excellent characteristics were confirmed.

EXAMPLE 17

An apparatus shown in FIG. 20 was used to continuously manufacture the photovoltaic devices by the continuous manufacturing method according to the present invention.

First, a bobbin 2004 was installed in a vacuum chamber 2002 having a mechanism for feeding a substrate, the bobbin 2004 having an elongated substrate member 2001 (120 mm wide, 200 m long and 0.13 mm thick) wound therearound. The elongated member 2001, which had been degreased and cleaned, was made of SUS430BA and had a silver thin film having a thickness of 100 nm and a ZnO thin film having a thickness of 1 µm formed thereon by a sputtering method to serve as a lower electrode. The elongated member 2001 was transported to a vacuum chamber 2003 having a mechanism for winding up the elongated member 2001, via a vacuum chamber for manufacturing the non-single-crystal layer.

The pressure in each of the vacuum chambers 2002, 2003, 2031, 2051, and 2071 was lowered to $1 \times 10^{-4}$ Torr by means of a vacuum pump (omitted from illustration).

Then, $H_2$ gas serving as a gate gas was supplied to each of the gas gates from the gate gas introduction pipes 2014 to 2021 in a quantity of 700 sccm. The heaters 2034, 2054, and 2074 were turned on to heat the elongated substrate member 2001 to 350° C., 350° C., and 300° C.

5 sccm $SiH_4$ gas, 0.05 sccm $PH_3$ gas, and 100 sccm $H_2$ gas were introduced from the gas introduction pipe 2032, 200 sccm $SiH_4$ gas, and 500 sccm $H_2$ gas were introduced from the gas introduction pipe 2052, and 0.5 sccm $SiH_4$ gas, 0.05 sccm of $B_2H_6$ gas, and 500 sccm $H_2$ gas were introduced from the gas introduction pipe 2072.

The pressure in the vacuum chamber 2031 was set at 1 Torr by adjusting the opening of the conductance valve 2035 while observing the pressure gauge 2033, the pressure in the vacuum chamber 2051 was set at 3 mTorr by adjusting the opening of the conductance valve 2055 while observing the pressure gauge 2053, and the pressure in the vacuum chamber 2071 was set at 1 Torr by adjusting the opening of the conductance valve 2075 while observing the pressure gauge 2073.

RF power of 15 mW/cm³ was introduced to the cathode electrode 2037 and microwave power of 200 mW/cm³ was introduced via the microwave-guide portion 2057 and the dielectric window 2058. RF bias was supplied to the bias electrode 2059 at 350 mW/cm³, and RF power was supplied to the cathode electrode 2077 at 500 mW/cm³.

Then, the elongated substrate member 2001 was moved in a direction designated by the arrow shown in the drawing, followed by deposition of the first conductivity type layer, the i-type layer, and the second conductivity type layer on the elongated member. ITO ($In_2O_3+SnO_2$) serving as the transparent electrode was vacuum evaporated on the second conductivity type layer to a thickness of 70 nm. Then, Al was vacuum evaporated thereon to a thickness of 2 µm, so that a photovoltaic device was manufactured (Example 17). The conditions for manufacturing the photovoltaic device are shown in Table 17.

EXAMPLE 18 and Comparative Example 18

By employing the same manufacturing conditions as those according to Example 17 except that the pressure in the vacuum chamber 2051 was changed to the value shown in Table 18 at the time of forming the i-type layer, the lower electrode, the first conductivity type layer, the i-type layer, the second conductivity type layer, the transparent electrode, and the collecting electrode formed on the elongated member, so that a plurality of photovoltaic devices were manufactured (Examples 18-1 to 18-4 and Comparative Example 18).

Evaluations were made of the uniformity of the characteristics and the density of defects occurring in the photovoltaic device according to Examples 17, 18, and Comparative Example 18. The uniformity of the characteristics was evaluated in a manner such that 5 cm×5 cm samples were cut at intervals of 10 m from the photovoltaic devices formed on the elongated members according to Examples 17, 18, and Comparative Example 18. The samples were irradiated with AM-1.5 (100 mW/cm²) light to measure the photoelectric conversion efficiency, whereby scattering of the photoelectric conversion efficiency was evaluated. Table 18 shows the results of the evaluations of the characteristics by obtaining the inverse of the degree of scattering with respect to the photovoltaic devices according to Comparative Example 18.

The density of defects was evaluated in such a manner that 100 samples each of size 5 cm×5 cm were cut from the central portion in a range of 5 m in the central portion of the photovoltaic devices formed on the elongated members according to Examples 17, 18, and Comparative Example 18 to measure the reverse current. As a result, the presence of defects in each of the photovoltaic devices was detected to evaluate the density of defects. Table 18 shows the result of the evaluation of the characteristics performed by obtaining the inverse of the number of defects of the photovoltaic device according to Comparative Example 18.

As shown in Table 18, the photovoltaic devices of Examples 17 and 18-1 to 18-4 exhibited excellent uniformity of the characteristics and the density of defects in comparison to the photovoltaic device according to Comparative Example 18. Thus, it was found that the photovoltaic device manufactured by the manufacturing method according to the present invention has excellent characteristics. Hence, the superiority of the present invention was confirmed.

EXAMPLE 19 and Comparative Example 19

By employing the same manufacturing conditions as those according to Example 17 except for the pressure in the vacuum chambers 2031 and 2071 being changed to the value shown in Table 19 at the time of forming the first and second conductivity type layers, the lower electrode, the first conductivity type layer, the i-type layer, the second conductivity type layer, the transparent electrode, and the collecting electrode were formed on the elongated member, so that a plurality of photovoltaic devices were manufactured (Examples 19-1 to 19-6 and Comparative Examples 19-1 and 19-2). By employing the same method as that according to Example 17, evaluations were made about the uniformity of the characteristics and the density of defects occurring in the photovoltaic devices according to Examples 19-1to 19-6 and Comparative Examples 19-1 and 19-2. The results are shown in Table 19 with respect to the photovoltaic device according to Comparative Example 19-1.

As shown in Table 19, the photovoltaic devices according to Examples 19-1 to 19-6 exhibited excellent uniformity of the characteristics and the density of defects in comparison to the photovoltaic device according to Comparative Examples 19-1 and 19-2. Thus, it was found that the photovoltaic device manufactured by the manufacturing method according to the present invention has excellent characteristics. Hence, the superiority of the present invention was confirmed.

EXAMPLE 20 and Comparative Example 20

By employing the same manufacturing conditions as those according to Example 17 except for the change in the bias voltage applied to the bias electrode 2059 to the values shown in Table 20 at the time of forming the i-type layer, the lower electrode, the first conductivity type layer, the i-type layer, the second conductivity type layer, the transparent electrode, and the collecting electrode were formed on the elongated substrate member, so that a plurality of photovoltaic devices were manufactured (Examples 20-1 to 20-3 and Comparative Example 20).

By employing the same method as that according to Example 17, evaluations were made of the uniformity of the characteristics and the density of defects occurring in the photovoltaic devices according to Examples 20-1 to 20-3 and Comparative Example 20. The results with respect to the photovoltaic device according to Comparative Example 20 are shown in Table 20.

As shown in Table 20, the photovoltaic devices according to Examples 20-1 to 20-3 exhibited excellent uniformity of the characteristics and density of defects in comparison to the photovoltaic device according to Comparative Example 20. Thus, it was found that the photovoltaic device manufactured by the manufacturing method according to the present invention has excellent characteristics. Hence, the superiority of the present invention was confirmed.

EXAMPLE 21

By employing the same manufacturing conditions as those according to Example 17 except for a change in the arrangement of the first conductivity type layer, the i-type layer, and the second conductivity type layer formed on the lower (substrate) electrode, a photovoltaic device was manufactured (Example 21).

Comparative Example 21-1

By employing the same manufacturing conditions as those according to Example 21 except the pressure in the vacuum chamber 2051 was set at 100 mTorr when the i-type layer was formed, a photovoltaic device was manufactured (Comparative Example 21-1).

Comparative Example 21-2

By employing the same manufacturing conditions as those according to Example 21 except that the bias is not applied at the time when the i-type layer was formed, a photovoltaic device was manufactured (Comparative Example 21-2).

By employing the same method as that according to Example 17, evaluations were made of the uniformity of the characteristics and the density of defects occurring in the photovoltaic devices according to Example 21 and Comparative Examples 21-1 and 21-2. As a result of the measurements, the photovoltaic device according to Example 21 exhibited excellent characteristic uniformity of 1.17 times and defect density of 1.38 times those of the photovoltaic device according to Comparative Example 21-1. The photovoltaic device according to Comparative Example 21-2 exhibited characteristic uniformity of 0.97 times and defect density of 0.95 times those of Comparative Example 21-1. It was found that the photovoltaic device manufactured by the manufacturing method according to the present invention had excellent characteristics. Hence, the superiority of the present invention was confirmed.

EXAMPLE 22

Figure 25:
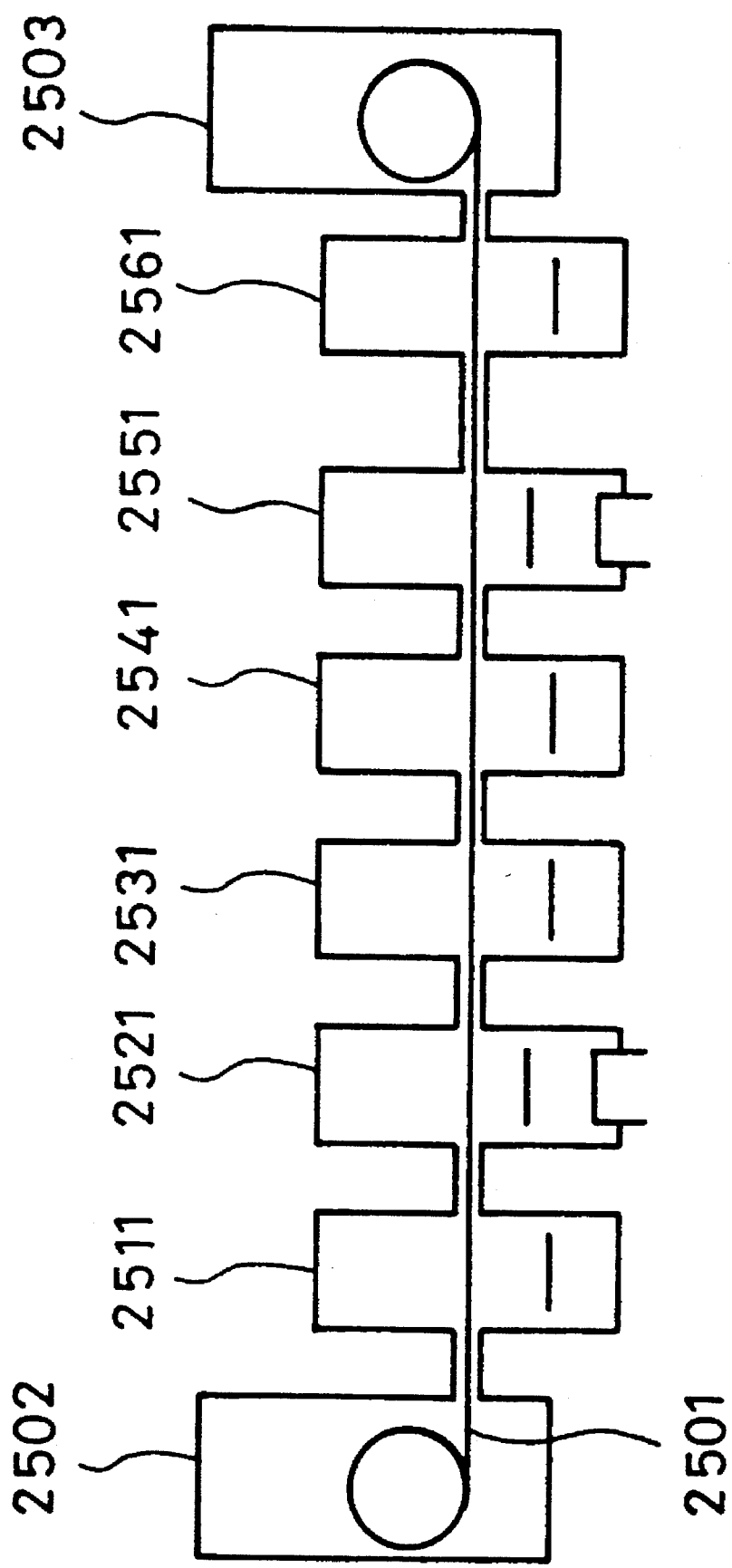
FIG. 25 is a schematic view which illustrates an example of an apparatus for manufacturing tandem-type photovoltaic devices adapted to the continuous manufacturing method according to the present invention.

FIG. 25 is a schematic view which illustrates an example of a manufacturing apparatus for manufacturing a tandem type photovoltaic device according to the method of the present invention. The apparatus comprises vacuum chambers 2502 and 2503 for feeding and winding up the elongated substrate member 2501, a vacuum chamber 2511 for depositing the first conductivity type layer, a vacuum chamber 2521 for manufacturing the i-type layer, a vacuum chamber 2531 for depositing the second conductivity type layer, a vacuum chamber 2541 for depositing the first conductivity type layer, a vacuum chamber 2551 for depositing the i-type layer and a vacuum chamber 2561 for depositing the second conductivity type layer. The foregoing chambers are connected by gas gates.

By using the manufacturing apparatus shown in FIG. 25, a tandem-type photovoltaic device (Example 22) was manufactured under the conditions shown in Table 22 that were the same as those according to Example 17 except that the first conductivity type layer, the i-type layer, the second conductivity type layer, the first conductivity type layer, the i-type layer, and the second conductivity type layer were formed on the lower electrode.

Comparative Example 22-1

By employing the same deposition conditions as those according to Example 22 except that the pressure in the vacuum chambers 2521 and 2551 during deposition of the i-type layer was set an 100 mTorr, a photovoltaic device was manufactured (Comparative Example 22-1).

Comparative Example 22-2

By employing the same manufacturing conditions as those according to Example 22 except that no bias is applied at the time of forming the i-type layer, a photovoltaic device was manufactured (Comparative Example 22-2).

By employing the same method as that according to Example 17, evaluations were made of the uniformity of the characteristics and the density of defects occurring in the photovoltaic devices according to Example 22 and Comparative Examples 22-1 and 22-2. As a result of the measurements, the photovoltaic device according to Example 22 was found to exhibit excellent characteristic uniformity of 1.21 times and defect density of 1.42 times those of the photovoltaic device according to Comparative Example 22-1. The photovoltaic device according to Comparative Example 22-2 exhibited a characteristic uniformity of 0.96 times and defect density of 0.97 times that of Comparative Example 22-1. It was found that the photovoltaic device manufactured by the manufacturing method according to the present invention had excellent characteristics. Hence, the superiority of the present invention was confirmed.

EXAMPLE 23

Figure 26:
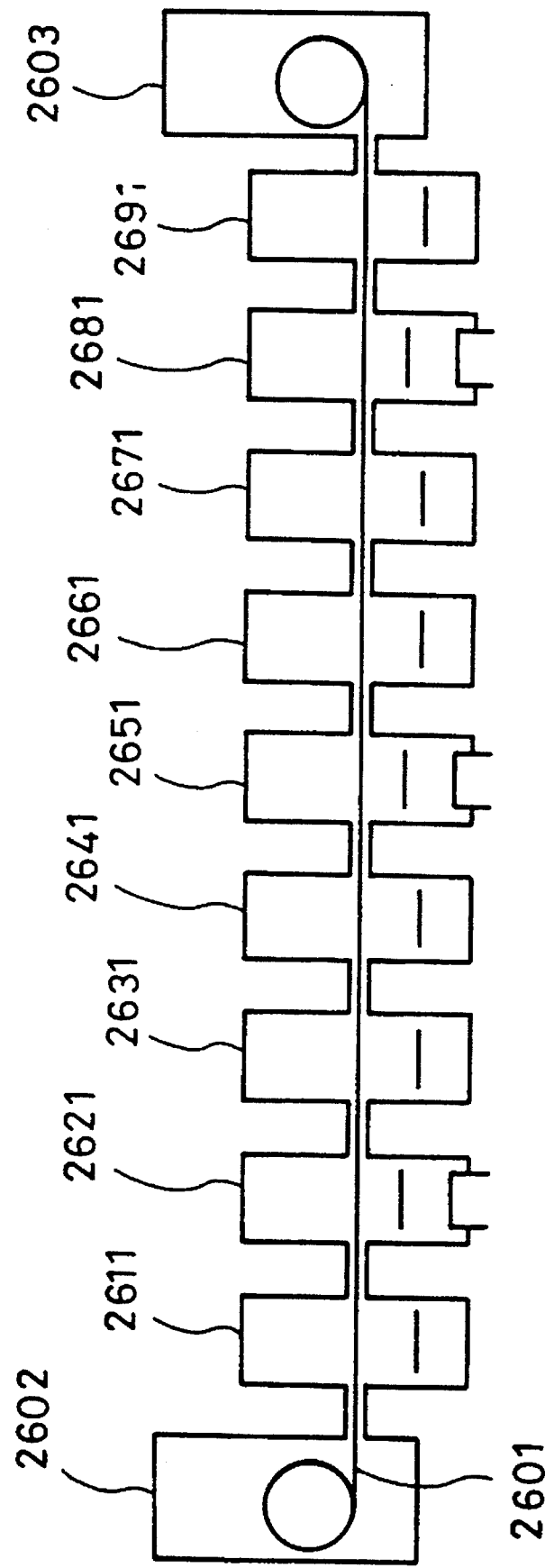
FIG. 26 is a schematic view which illustrates an example of an apparatus for manufacturing triple cell tandem-type photovoltaic devices adapted to the continuous manufacturing method according to the present invention.

FIG. 26 is a schematic view which illustrates an example of an apparatus for manufacturing a triple type photovoltaic device adapted to the method according to the present invention. The apparatus comprises vacuum chamber 2602 and 2603 for feeding and winding up the elongated substrate member 2601, a vacuum chamber 2611 for manufacturing the first conductivity type layer, a vacuum chamber 2621 for manufacturing the i-type layer, a vacuum chamber 2631 for manufacturing the second conductivity type layer, a vacuum chamber 2641 for manufacturing the first conductivity type layer, a vacuum chamber 2651 for manufacturing the i-type layer, a vacuum chamber 2661 for manufacturing the second conductivity type layer, a vacuum chamber 2671 for manufacturing the first conductivity type layer, a vacuum chamber 2681 for manufacturing the i-type layer, and a vacuum chamber 2691 for manufacturing the second conductivity type layer. The foregoing chambers are connected by gas gates.

By using the manufacturing apparatus shown in FIG. 26, a triple-type photovoltaic device (Example 23) was manufactured under manufacturing conditions that were the same as those according to Example 17 shown in Table 23 except that the first conductivity type layer, the i-type layer, the second conductivity type layer, the first conductivity type layer, the i-layer, the second conductivity type layer, the first conductivity type layer, the i-type layer and the second conductivity type layer were formed on the lower electrode.

Comparative Example 23-1

By employing the same manufacturing conditions as those according to Example 17 except that the pressure in the vacuum chambers 2621 and 2651 was set at 100 mTorr during forming of the i-type layer, so that a triple-type photovoltaic device was manufactured (Comparative Example 23-1). Comparative Example 23-2

By employing the same manufacturing conditions as those according to Example 23 except that no bias is applied at the time of forming the i-type layer, a triple-type photovoltaic device was manufactured (Comparative Example 23-2).

By employing the same method as that according to Example 17, evaluations were made of the uniformity of the characteristics and the density of defects occurring in the photovoltaic devices according to Example 23 and Comparative Examples 23-1 and 23-2. As a result of the measurements, the photovoltaic device according to Example 23 exhibited excellent characteristic uniformity of 1.19 times and defect density of 1.43 times those of the photovoltaic device according to Comparative Example 23-1. The photovoltaic device according to Comparative Example 23-2 exhibited characteristic uniformity of 0.98 times and defect density of 0.96 times that of Comparative Example 23-1. It was found that the photovoltaic device manufactured by the method according to the present invention had excellent characteristics. Hence, the superiority of the present invention was confirmed.

EXAMPLE 24

The apparatus shown in FIG. 21 was used to continuously manufacture the photovoltaic devices according to the present invention.

First, a bobbin 2104 was installed in a vacuum chamber 2102 having a mechanism for delivering a substrate, the bobbin 2104 having an elongated substrate member 2101 (120 mm wide, 200 m long and 0.13 mm thick) wound therearound. The elongated member 2101, which was degreased and cleaned, was made of SUS430BA and had a silver thin film having a thickness of 100 nm and a ZnO thin film having a thickness of 1 µm formed thereon by a sputtering method to serve as a lower electrode. The elongated member 2101 was transported to a vacuum chamber 2103 having a mechanism for winding up the elongated member 2101 via a plurality of vacuum chambers for manufacturing the non-single-crystal layer.

The pressure in each of the vacuum chambers 2102, 2103, 2131, 2151, 2171, and 2191 was lowered to $1 \times 10^4$ Torr by means of a vacuum pump (omitted from illustration).

Then, $H_2$ gas serving as a gate gas was supplied to each of the gas gates from the gate gas introduction pipes 2114 to 2123 in a quantity of 700 sccm. The heaters 2134, 2154, 2174, and 2194 were turned on to heat the elongated members 2101 to 350° C., 350° C., 300° C., and 300° C., respectively.

5 sccm $SiH_4$ gas, 0.05 sccm $PH_3$ gas, and 100 sccm $H_2$ gas were introduced from the gas introduction pipe 2132, 200 sccm $SiH_4$ gas, and 500 sccm $H_2$ gas were introduced from the gas introduction pipe 2152, 4 sccm $SiH_4$ gas and 100 sccm $H_2$ gas were introduced from the gas introduction pipe 2172, and 0.5 sccm $SiH_4$ gas, 0.05 sccm $B_2H_6$ gas, and 500 sccm $H_2$ gas were introduced from the gas introduction pipe 2192.

The pressure in the vacuum chamber 2131 was set at 1 Torr by adjusting the opening of the conductance valve 2035 while observing the pressure gauge 2133, the pressure in the vacuum chamber 2151 was set at 3 mTorr by adjusting the opening of the conductance valve 2155 while observing the pressure gauge 2153, and the pressure in the vacuum chambers 2171 and 2191 was set at 1 Torr by adjusting the opening of each of the conductance valves 2175 and 2195 while observing the pressure gauges 2173 and 2193.

RF power of 15 mW/cm³ was introduced to the cathode electrode 2137 and microwave power of 200 mW/cm³ was introduced via the microwave-guide portion 2057 and the dielectric window 2158. RF bias was supplied to the bias electrode 2159 at 350 mW/cm³, RF power was supplied to the cathode electrode 2177 at 10 mW/cm³, and RF power was supplied to the cathode electrode 2197 at 500 mW/cm³.

Then, the elongated member 2101 was moved in the direction designated by the arrow shown in the drawing, followed by deposition of the first conductivity type layer, the i-type layer, the i-type interfacial layer, and the second conductivity type layer on the elongated member.

ITO ($In_2O_3 + SnO_2$) serving as the transparent electrode was vacuum evaporated on the second conductivity type layer to a thickness of 70 nm. Then, Al was vacuum evaporated to a thickness of 2 µm, so that a photovoltaic device was manufactured (Example 24). The conditions for manufacturing the photovoltaic device are shown in Table 24.

EXAMPLE 25 and Comparative Example 25

By employing the same manufacturing conditions as those according to Example 24 except for the pressure in the vacuum chamber 2151 being changed to the values shown in Table 25 during forming of the i-type layer, the lower electrode, the first conductivity type layer, the i-type layer, the i-type interfacial layer, the second conductivity type layer, the transparent electrode and the collecting electrode were formed on the elongated substrate member, photovoltaic devices were manufactured (Examples 25-1 to 25-4 and Comparative Example 25).

Evaluations were made of the uniformity of the characteristics and the density of defects occurring in the photovoltaic devices according to Example 24, Examples 25-1 to 25-4 and Comparative Example 25. The uniformity of the characteristics were evaluated by cutting 5 cm×5 cm samples at intervals of 10 m from the photovoltaic devices on the elongated substrate members. The samples were irradiated with AM-1.5 (100 mW/cm$^2$) light to measure the photoelectric conversion efficiency, whereby scattering of the photoelectric conversion efficiency was evaluated. Table 25 shows the results of the evaluations of the characteristics performed by obtaining the inverse number of the degree of scattering with respect to the photovoltaic device according to Comparative Example 25.

The density of defects was evaluated by cutting 100 samples each having size 5 cm×5 cm from the central portion in a range of 5 m in the central portion of the photovoltaic device on the elongated substrate members according to Example 24, Examples 25-1 to 25-4 and Comparative Example 25 to measure the inverse directional current. As a result, the presence of defects in each of the photovoltaic devices was detected to evaluate the density of defects. Table 25 shows the results of the evaluation of the characteristics performed by obtaining the inverse of the number of defects with respect to the photovoltaic device according to Comparative Example 25.

As shown in Table 25, the photovoltaic devices according to Example 24 and Examples 25-1 to 25-4 exhibited excellent uniformity of the characteristics and the density of defects in comparison to the photovoltaic device according to Comparative Example 25. Thus, it was found that the photovoltaic device manufactured by the manufacturing method according to the present invention has excellent characteristics. Hence, the superiority of the present invention was confirmed.

EXAMPLE 26 and Comparative Example 26

By employing the same manufacturing conditions as those according to Example 24 except for the pressure in the vacuum chamber 2131, 2171, and 219i being changed to the values shown in Table 26 during forming of first conductivity type layer, the i-type interfacial layer, the second conductivity type layer, the lower electrode, the first conductivity type layer, the i-type layer, the i-type interfacial layer, the second conductivity type layer, a transparent electrode, and a collecting electrode were formed on the elongated member, a plurality of photovoltaic devices were manufactured (Examples 26-1 to 26-8 and Comparative Examples 26-1 to 26-3).

By employing the same method as that according to Example 24, evaluations were made of the uniformity of the characteristics and the density of defects occurring in the photovoltaic devices according to Examples 26-1 to 26-8 and Comparative Examples 26-1 to 26-3. The results with respect to the photovoltaic device according to Comparative Example 26-1 are shown in Table 26.

As shown in Table 26, the photovoltaic devices according to Examples 26-1 to 26-8 exhibited excellent uniformity of the characteristics and density of defects in comparison to the photovoltaic devices according to Comparative Examples 26-1 to 26-3. Thus, it was found that the photovoltaic device manufactured by the manufacturing method according to the present invention has excellent characteristics. Hence, the superiority of the present invention was confirmed.

EXAMPLE 27 and Comparative Example 27

By employing the same manufacturing conditions as those according to Example 24 except for the bias applied to the bias electrode 2159 during the time of forming the i-type layer being the values shown in Table 27, the lower electrode, the first conductivity type layer, the i-type layer, the i-type interfacial layer, the second conductivity type layer, transparent electrode, and collecting electrode were formed on the elongated substrate member, a plurality of photovoltaic devices were manufactured (Examples 27-1 to 27-3 and Comparative Example 27).

By employing the same method as that according to Example 24, evaluations were made of the uniformity of the characteristics and density of defects occurring in the photovoltaic devices according to Examples 27-1 to 27-3 and Comparative Example 27. The results with respect to the photovoltaic device according to Comparative Example 27 are shown in Table 27.

As shown in Table 27, the photovoltaic devices according to Examples 27-1 to 27-3 exhibited excellent uniformity of the characteristics and density of defects in comparison to the photovoltaic device according to Comparative Example 27. Thus, it was found that the photovoltaic device manufactured by the method according to the present invention has excellent characteristics. Hence, the superiority of the present invention was confirmed.

EXAMPLE 28

By employing the same manufacturing conditions as those according to Example 24 except for the arrangement of the first conductivity type layer, the i-type layer, the i-type interfacial layer, and the second conductivity type layer being formed on the lower electrode under the conditions shown in Table 28, a photovoltaic device was manufactured (Example 28).

Comparative Example 28-1

By employing the same manufacturing conditions as those according to Example 28 except that the pressure in the vacuum chamber 2151 for depositing the i-type layer was set at 100 mTorr when the i-type layer was formed, a photovoltaic device was manufactured (Comparative Example 28-1).

Comparative Example 28-2

By employing the same manufacturing conditions as those according to Example 28 except that the bias was not applied when the i-type layer was formed, a photovoltaic device was manufactured (Comparative Example 28-2).

By employing the same method as the according to Example 14, evaluations were made of the uniformity of the characteristics and the density of defects occurring in the photovoltaic devices according to Example 28 and Comparative Examples 28-1 and 28-2. As a result of the measurements, the photovoltaic device according to Example 28 exhibited excellent characteristic uniformity of 1.17 times and defect density of 1.38 times those of the photovoltaic device according to Comparative Example 28-1. The photovoltaic device according to Comparative Example 28-2 exhibited a characteristic uniformity of 0.97 times and defect density of 0.95 times that of Comparative Example 28-1. It was found that the photovoltaic device manufactured by the manufacturing method according to the present invention had excellent characteristics. Hence, the superiority of the present invention was confirmed.

EXAMPLE 29

By employing the same manufacturing conditions as those according to Example 24 except that the first conductivity type layer, the i-type interfacial layer, the i-type layer, and the second conductivity type layer were formed on the lower electrode under the manufacturing conditions shown in Table 29, a photovoltaic device was manufactured (Example 29).

The characteristic uniformity and the defect density of the photovoltaic device (Example 29) according to Example 29 were measured by a method similar to that according to Example 24, showing similar characteristic uniformity and defect density to those of Example 24. Hence, the superiority of the present invention was confirmed.

EXAMPLE 30

By employing the same manufacturing conditions as those according to Example 24 except that the first conductivity type layer, the i-type interfacial layer, the i-type layer, the i-type interfacial, and the second conductivity type layer were formed on the lower electrode under the manufacturing conditions shown in Table 30, a photovoltaic device was manufactured (Example 30).

The characteristic uniformity and defect density of the photovoltaic device according to Example 30 were measured by a method similar to that according to Example 24, resulting in similar characteristic uniformity and defect density to those of Example 24. Hence, the effect of the present invention was confirmed.

EXAMPLE 31

Figure 27:
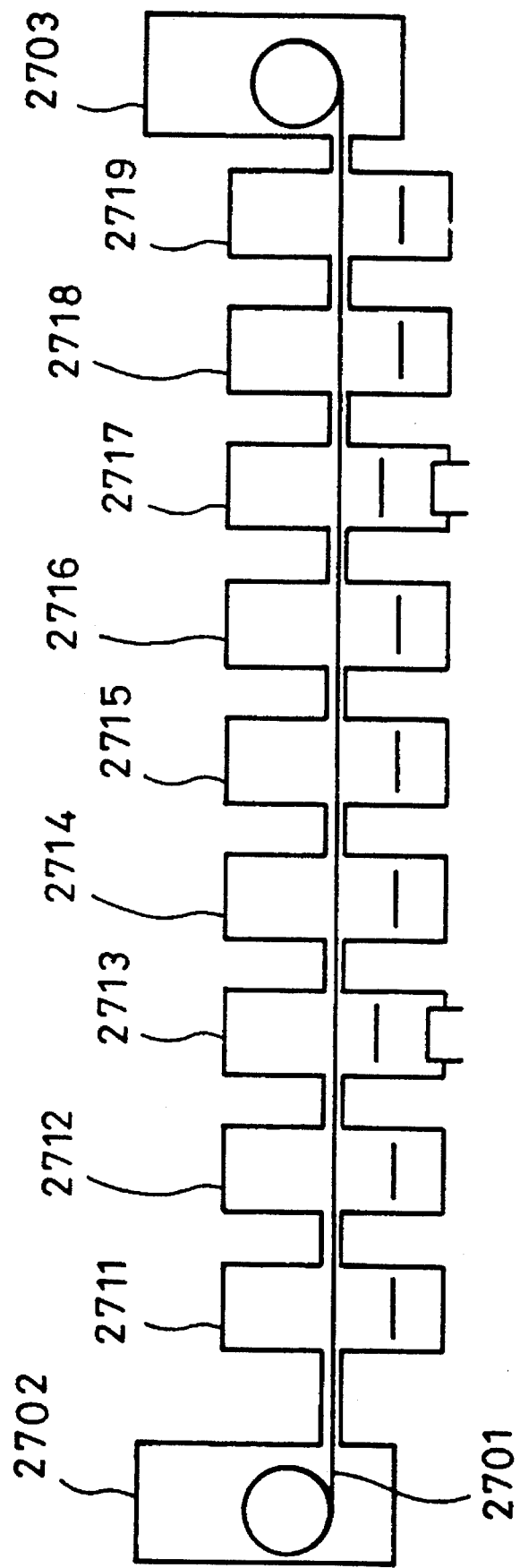
FIG. 27 is a schematic view which illustrates another example of an apparatus for manufacturing tandem-type photovoltaic devices adapted to the continuous manufacturing method according to the present invention.

FIG. 27 is a schematic view which illustrates an example of a manufacturing apparatus for manufacturing a tandem type photovoltaic device according to the manufacturing method of the present invention. The apparatus comprises vacuum chambers 2702 and 2703 for feeding and winding up the elongated substrate member 2701, a vacuum chamber 2711 for depositing the first conductivity type layer, a vacuum chamber 2712 for depositing the i-type interfacial layer, a vacuum chamber 2713 for depositing the i-type layer, a vacuum chamber 2714 for depositing the i-type interfacial layer, a vacuum chamber 2715 for depositing the second conductivity type layer, a vacuum chamber 2716 for depositing the first conductivity type layer, a vacuum chamber 2717 for depositing the i-type layer, a vacuum chamber 2718 for depositing the i-type interfacial layer, and a vacuum chamber 2719 for depositing the second conductivity type layer The foregoing chambers are connected by gates.

By using the manufacturing apparatus shown in FIG. 27, a tandem-type photovoltaic device (Example 31) was manufactured under conditions that were the same as those according to Example 24 except that the first conductivity type layer, the i-type interfacial layer, the i-type layer, the i-type interfacial layer, the second conductivity type layer, the first conductivity type layer, the i-type layer, and the second conductivity type layer were formed on the lower electrode under the manufacturing conditions shown in Table 31, so that a tandem-type photovoltaic device was manufactured (Example 31).

Comparative Example 31-1

By employing the same manufacturing conditions as those according to Example 31 except that the pressure in the vacuum chambers 2713 and 2717 for depositing the i-type layers was set at 100 mTorr when the i-type layer was formed, a tandem-type photovoltaic device was manufactured (Comparative Example 31-1).

Comparative Example 31-2

By employing the same manufacturing conditions as those according to Example 31 except that the bias voltage was not applied at the time when the i-type layer was formed, a tandem-type photovoltaic device was manufactured (Comparative Example 31-2).

By employing the same method as that according to Example 24, evaluations were made of the uniformity of the characteristics and the density of defects occurring in the photovoltaic devices according to Example 31 and Comparative Examples 31-1 and 31-2. As a result of the measurements, the photovoltaic device according to Example 31 exhibited excellent characteristic uniformity of 1.23 times and defect density of 1.40 times those of the photovoltaic device according to Comparative Example 31-1. The photovoltaic device according to Comparative Example 31-2 exhibited characteristic uniformity of 0.95 times and defect density of 0.97 times that of Comparative Example 31-1. It was found that the photovoltaic device manufactured by the manufacturing method according to the present invention had excellent characteristics. Hence, the superiority of the present invention was confirmed.

EXAMPLE 32

Figure 28:
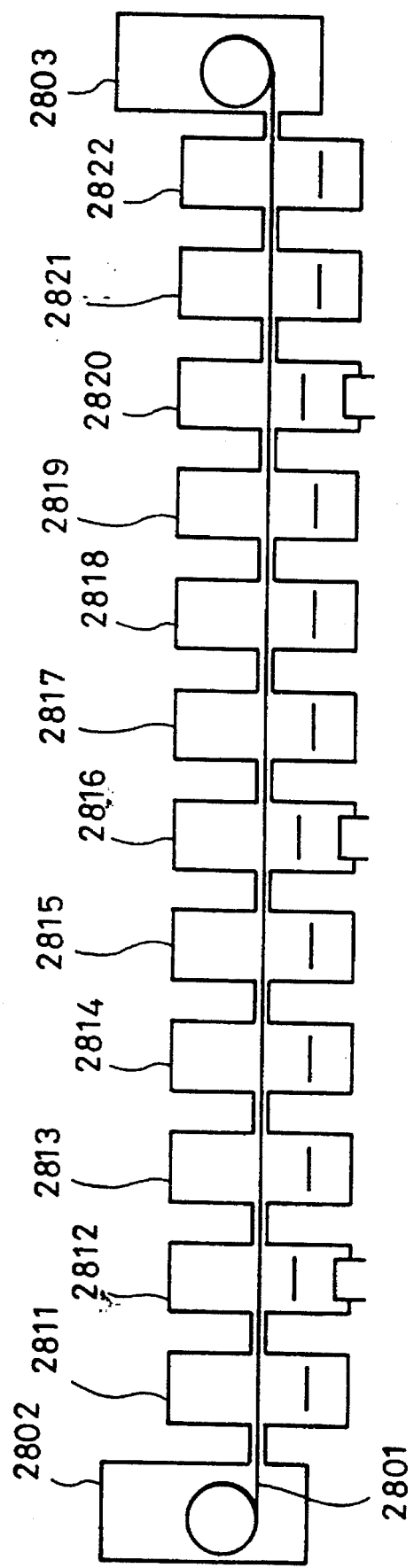
FIG. 28 is a schematic view which illustrates another example of an apparatus for manufacturing triple cell tandem-type photovoltaic devices adapted to the continuous manufacturing method according to the present invention.

FIG. 28 is a schematic view which illustrates an example of an apparatus for manufacturing a triple-type photovoltaic device according to the present invention. The apparatus comprises vacuum chambers 2802 and 2803 for feeding and winding up the elongated substrate member 2801, a vacuum chamber 2811 for depositing the first conductivity type layer, a vacuum chamber 2812 for depositing the i-type layer, a vacuum chamber 2813 for depositing the i-type interfacial layer, a vacuum chamber 2814 for depositing the second conductivity type layer, a vacuum chamber 2815 for depositing the first conductivity type layer, a vacuum chamber 2816 for depositing the i-type layer, a vacuum chamber 2817 for depositing the i-type interfacial layer, a vacuum chamber 2818 for depositing the second conductivity type layer, a vacuum chamber 2819 for depositing the first conductivity type layer, a vacuum chamber 2820 for depositing the i-type layer, a vacuum chamber 2821 for depositing the i-type interfacial layer, and a vacuum chamber 2822 for depositing the second conductivity type layer. The foregoing chambers are connected by gas gates.

By using the manufacturing apparatus shown in FIG. 28, a triple-type photovoltaic device (Example 32) was manufactured under conditions that were the same as those according to Example 24 except that the first conductivity type layer, the i-type layer, the second conductivity type layer, the first conductivity type layer, the i-type layer, the second conductivity type layer, the first conductivity type layer, the i-type layer and the second conductivity type layer were formed on the lower electrode under the depositing conditions shown in Table 32, so that a triple-type photovoltaic device was manufactured (Example 32).

Comparative Example 32-1

By employing the same conditions as those according to Example 32 except that the pressure in the vacuum chambers 2812, 2816, and 2820 for forming the i-type layers was set at 100 mTorr when the i-type layer was formed, a triple-type photovoltaic device was manufactured (Comparative Example 32-1).

Comparative Example 32-2

By employing the same manufacturing conditions as those according to Example 32 except that the bias voltage was not applied when the i-type layer was formed, a triple-type photovoltaic device was manufactured (Comparative Example 32-2).

By employing the same method as that according to Example 24, evaluations were made of the uniformity of the characteristics and the density of defects occurring in the photovoltaic devices according to Example 32 and Comparative Examples 32-1 and 32-2. As a result of the measurements, the photovoltaic device according to Example 32 exhibited excellent characteristic uniformity of 1.21 times and defect density of 1.39 times those of the photovoltaic device according to Comparative Example 32-1. The photovoltaic device according to Comparative Example 32-2 exhibited characteristic uniformity of 0.98 times and defect density of 0.96 times that of Comparative Example 32-1. It was found that the photovoltaic device manufactured by the manufacturing method according to the present invention had excellent characteristics. Hence, the superiority of the present invention was confirmed.

Effect of the Invention

The method for forming a deposited film according to the present invention enables a semiconductor film to be formed at high speed that exhibits excellent electric characteristics, contact with the substrate, and light deterioration resistance. As a result, photovoltaic devices, thin film transistors, and image forming members for electrophotography exhibiting excellent characteristics can be provided with a satisfactory manufacturing yield.

The method of forming a deposited film according to the present invention improves the uniformity and stability of the plasma. Therefore, irregular film thickness and the non-uniformity of the characteristics of the formed deposited film can further be reduced. As a result, the characteristics and yield of the photovoltaic devices, thin film transistors, and image forming members for electrophotography can be further improved. Therefore, the manufacturing cost of the foregoing electronic devices can be reduced.

The photovoltaic device according to the present invention has an i-type layer made of a-Si:H film deposited by the µW plasma CVD method, resulting in significant rise in the deposition speed of the i-type layer. This enables the manufacturing through put to be increased, and, accordingly, the manufacturing cost for the photovoltaic device can be reduced significantly.

The present invention has an arrangement such that an i-type interfacial layer formed by the RF plasma CVD method is inserted at least between the n-type layer and the i-type layer. Therefore, the characteristics of the photovoltaic device can further be improved.

Therefore, a photovoltaic device exhibiting excellent performance can be provided.

The method for continuously manufacturing the photovoltaic devices according to the present invention enables photovoltaic devices exhibiting high quality and excellent uniformity over a large area and reduced defects to be mass-produced.

Although the invention has been described in its preferred form with a certain degree of particularity, it is understood that the present disclosure of the preferred form has been changed in the details of construction and the combination and arrangement of parts may be resorted to without departing from the spirit and the scope of the invention as hereinafter claimed.

TABLE 1

| Samples | Layer | Flow Rate $SiH_4$ | Flow Rate $H_2$ | Flow Rate $PH_3/H_2$ | Flow Rate $B_2H_6/H_2$ | Flow Rate $CH_4$ | Flow Rate $GeH_4$ | Pressure mTorr | Temperature of Substrate °C. | µW power W/cm³ | RF power W/cm³ | Thickness of layer µm |
|---|---|---|---|---|---|---|---|---|---|---|---|---|
| E-1 | n | 100 | 100 | 300 | — | — | — | 30 | 380 | 0.10 | — | 0.04 |
|  | i | 200 | 100 | — | — | — | — | 5 | 350 | 0.20 | 0.40 | 0.32 |
|  | p | 10 | 500 | — | 5 | — | — | 20 | 250 | 0.40 | — | 0.01 |
| C-1-1 | n | 100 | 100 | 300 | — | — | — | 30 | 380 | 0.10 | — | 0.04 |
|  | i | 200 | 100 | — | — | — | — | 5 | 350 | x | y | 0.32 |
|  | p | 10 | 500 | — | 5 | — | — | 20 | 250 | 0.40 | — | 0.01 |
| C-1-2 | n | 100 | 100 | 300 | — | — | — | 30 | 380 | 0.10 | — | 0.04 |
|  | i | 100 | — | — | — | — | — | 5 | 350 | x | y | 0.32 |
|  | p | 10 | 500 | — | 5 | — | — | 20 | 250 | 0.40 | — | 0.01 |
| C-1-3 | n | 100 | 100 | 300 | — | — | — | 30 | 380 | 0.10 | — | 0.04 |
|  | i | 300 | 500 | — | — | — | — | 5 | 300 | x | y | 0.32 |
|  | p | 10 | 500 | — | 5 | — | — | 20 | 250 | 0.40 | — | 0.01 |
| C-1-4 | n | 100 | 100 | 300 | — | — | — | 30 | 380 | 0.10 | — | 0.04 |
|  | i | 200 | — | — | — | — | — | 10 | 350 | x | y | 0.32 |
|  | p | 10 | 500 | — | 5 | — | — | 20 | 250 | 0.40 | — | 0.01 |
| C-1-5 | n | 100 | 100 | 300 | — | — | — | 30 | 380 | 0.10 | — | 0.04 |
|  | i | 200 | 100 | — | — | — | — | x | 350 | 0.20 | 0.40 | 0.32 |

TABLE 1-continued

| Samples | Layer | Flow Rate SiH$_4$ | Flow Rate H$_2$ | Flow Rate PH$_3$/H$_2$ | Flow Rate B$_2$H$_6$/H$_2$ | Flow Rate CH$_4$ | Flow Rate GeH$_4$ | Pressure mTorr | Temperature of Substrate °C. | µW power W/cm$^3$ | RF power W/cm$^3$ | Thickness of layer µm |
|---|---|---|---|---|---|---|---|---|---|---|---|---|
| | p | 10 | 500 | — | 5 | — | — | 20 | 250 | 0.40 | — | 0.01 |

Note:
E-1 ... Example 1, C-1-1 ... Comparative Example 1-1, C-1-2 ... Comparative Example 1-2, C-1-3 ... Comparative Example 1-3, C-1-4 ... Comparative Example 1-4, C-1-5 ... Comparative Example 1-5

TABLE 2

| Samples | Layer | Flow Rate SiH$_4$ | Flow Rate H$_2$ | Flow Rate PH$_3$/H$_2$ | Flow Rate B$_2$H$_6$/H$_2$ | Flow Rate CH$_4$ | Flow Rate GeH$_4$ | Pressure mTorr | Temperature of Substrate °C. | µW power W/cm$^3$ | RF power W/cm$^3$ | Thickness of layer µm | Photoelectric conversion efficiency |
|---|---|---|---|---|---|---|---|---|---|---|---|---|---|
| E-2 | n | 100 | 100 | 300 | — | — | — | 30 | 380 | 0.10 | — | 0.04 | 1 |
| | i | 100 | 300 | — | — | — | 50 | 8 | 360 | 0.16 | 0.32 | 0.22 | |
| | p | 10 | 500 | — | 5 | — | — | 20 | 250 | 0.40 | — | 0.01 | |
| C-2-1 | n | 100 | 100 | 300 | — | — | — | 30 | 380 | 0.10 | — | 0.04 | 0.77 |
| | i | 100 | 300 | — | — | — | 50 | 8 | 360 | 0.16 | 0.10 | 0.22 | |
| | p | 10 | 500 | — | 5 | — | — | 20 | 250 | 0.40 | — | 0.01 | |
| C-2-2 | n | 100 | 100 | 300 | — | — | — | 30 | 380 | 0.10 | — | 0.04 | 0.59 |
| | i | 100 | 300 | — | — | — | 50 | 8 | 360 | 0.40 | 0.10 | 0.22 | |
| | p | 10 | 500 | — | 5 | — | — | 20 | 250 | 0.40 | — | 0.10 | |
| C-2-3 | n | 100 | 100 | 300 | — | — | — | 30 | 380 | 0.10 | — | 0.04 | 0.78 |
| | i | 100 | 300 | — | — | — | 50 | 8 | 360 | 0.40 | 0.50 | 0.22 | |
| | p | 10 | 500 | — | 5 | — | — | 20 | 250 | 0.40 | — | 0.10 | |

Note:
E-2 ... Example 2, C-2-1 ... Comparative Example 2-1, C-2-2 ... Comparative Example 2-2, C-2-3 ... Comparative Example 2-3

TABLE 3

| Samples | Layer | Flow Rate SiH$_4$ | Flow Rate H$_2$ | Flow Rate PH$_3$/H$_2$ | Flow Rate B$_2$H$_6$/H$_2$ | Flow Rate CH$_4$ | Flow Rate GeH$_4$ | Pressure mTorr | Temperature of Substrate °C. | µW power W/cm$^3$ | RF power W/cm$^3$ | Thickness of layer µm | Photoelectric conversion efficiency |
|---|---|---|---|---|---|---|---|---|---|---|---|---|---|
| E-3 | n | 100 | 300 | 100 | — | 20 | — | 10 | 360 | 0.25 | 0.32 | 0.02 | 1 |
| | i | 200 | 100 | — | — | — | — | 5 | 350 | 0.20 | 0.40 | 0.32 | |
| | p | 10 | 500 | — | 5 | — | — | 20 | 250 | 0.40 | — | 0.01 | |
| C-3-1 | n | 100 | 300 | 100 | — | 20 | — | 10 | 360 | 0.25 | 0.10 | 0.02 | 0.83 |
| | i | 200 | 100 | — | — | — | — | 5 | 350 | 0.20 | 0.40 | 0.32 | |
| | p | 10 | 500 | — | 5 | — | — | 20 | 250 | 0.40 | — | 0.01 | |
| C-3-2 | n | 100 | 300 | 100 | — | 20 | — | 10 | 360 | 0.40 | 0.10 | 0.02 | 0.63 |
| | i | 200 | 100 | — | — | — | — | 5 | 350 | 0.20 | 0.40 | 0.32 | |
| | p | 10 | 500 | — | 5 | — | — | 20 | 250 | 0.40 | — | 0.01 | |
| C-3-3 | n | 100 | 300 | 100 | — | 20 | — | 10 | 360 | 0.40 | 0.50 | 0.02 | 0.80 |
| | i | 200 | 100 | — | — | — | — | 5 | 350 | 0.20 | 0.40 | 0.32 | |
| | p | 10 | 500 | — | 5 | — | — | 20 | 250 | 0.40 | — | 0.01 | |

Note:
E-3 ... Example 3, C-3-1 ... Comparative Example 3-1, C-3-2 ... Comparative Example 3-2, C-3-3 ... Comparative Example 3-3

TABLE 4

| Samples | Layer | Flow Rate SiH$_4$ | Flow Rate H$_2$ | Flow Rate PH$_3$/H$_2$ | Flow Rate B$_2$H$_6$/H$_2$ | Flow Rate CH$_4$ | Flow Rate GeH$_4$ | Pressure mTorr | Temperature of Substrate °C. | µW power W/cm$^3$ | RF power W/cm$^3$ | Thickness of layer µm |
|---|---|---|---|---|---|---|---|---|---|---|---|---|
| E-4 | n | 100 | 300 | 100 | — | — | — | 10 | 380 | 0.25 | 0.32 | 0.02 |
| First | i | 100 | 300 | — | — | — | 50 | 8 | 380 | 0.16 | 0.32 | 0.25 |
| | p | 10 | 500 | — | 5 | 1 | — | 20 | 300 | 0.30 | 0.40 | 0.01 |
| E-4 | n | 100 | 300 | 300 | — | — | — | 15 | 300 | 0.25 | 0.32 | 0.02 |

TABLE 4-continued

| Samples | Layer | Flow Rate SiH$_4$ | Flow Rate H$_2$ | Flow Rate PH$_3$/H$_2$ | Flow Rate B$_2$H$_6$/H$_2$ | Flow Rate CH$_4$ | Flow Rate GeH$_4$ | Pressure mTorr | Temperature of Substrate °C. | μW power W/cm$^3$ | RF power W/cm$^3$ | Thickness of layer μm |
|---|---|---|---|---|---|---|---|---|---|---|---|---|
| Second | i | 200 | 100 | — | — | — | — | 5 | 300 | 0.20 | 0.40 | 0.28 |
|  | p | 10 | 500 | — | 10 | 1 | — | 20 | 250 | 0.30 | 0.40 | 0.01 |

Note:
E-4 ... Example 4

TABLE 5

| Samples | Layer | Flow Rate SiH$_4$ | Flow Rate H$_2$ | Flow Rate PH$_3$/H$_2$ | Flow Rate B$_2$H$_6$/H$_2$ | Flow Rate CH$_4$ | Flow Rate GeH$_4$ | Pressure mTorr | Temperature of Substrate °C. | μW power W/cm$^3$ | RF power W/cm$^3$ | Thickness of layer μm |
|---|---|---|---|---|---|---|---|---|---|---|---|---|
| E-5 First | n | 100 | 300 | 100 | — | — | — | 10 | 380 | 0.25 | 0.32 | 0.02 |
|  | i | 100 | 300 | — | — | — | 50 | 8 | 380 | 0.18 | 0.32 | 0.28 |
|  | p | 10 | 500 | — | 5 | 1 | — | 20 | 350 | 0.25 | 0.40 | 0.01 |
| E-5 Second | n | 100 | 300 | 200 | — | — | — | 10 | 350 | 0.25 | 0.32 | 0.02 |
|  | i | 100 | 300 | — | — | — | 50 | 8 | 350 | 0.16 | 0.32 | 0.20 |
|  | p | 10 | 500 | — | 5 | 1 | — | 20 | 300 | 0.30 | 0.40 | 0.01 |
| E-5 Third | n | 100 | 300 | 300 | — | — | — | 10 | 300 | 0.25 | 0.32 | 0.02 |
|  | i | 200 | — | — | — | — | — | 5 | 300 | 0.20 | 0.40 | 0.10 |
|  | p | 10 | 500 | — | 10 | 1 | — | 20 | 250 | 0.30 | 0.40 | 0.01 |

Note:
E-5 ... Example 5

TABLE 6

| Samples | Layer | Flow Rate SiH$_4$ | Flow Rate H$_2$ | Flow Rate PH$_3$/H$_2$ | Flow Rate B$_2$H$_6$/H$_2$ | Flow Rate CH$_4$ | Flow Rate GeH$_4$ | Pressure mTorr | Temperature of Substrate °C. | μW power W/cm$^3$ | RF power W/cm$^3$ | Thickness of layer μm |
|---|---|---|---|---|---|---|---|---|---|---|---|---|
| E-6 | n | 50 | 100 | 300 | — | — | — | 10 | 350 | 0.25 | — | 0.10 |
|  | i | 200 | — | — | — | — | — | 5 | 300 | 0.25 | 0.40 | 0.60 |
|  | p | 50 | 100 | — | 50 | — | — | 20 | 250 | 0.40 | — | 0.02 |

Note:
E6 ... Example 6

TABLE 7

| Samples Layer | Flow Rate SiH$_4$ | Flow Rate H$_2$ | Flow Rate PH$_3$H$_2$ | Flow Rate B$_2$H$_6$/H$_2$ | Flow Rate CH$_4$ | Flow Rate NH$_4$ | Pressure mTorr | Temperature of substrate °C. | μW power W/cm$^3$ | RF power W/cm$^3$ | Thickness of layer μm |
|---|---|---|---|---|---|---|---|---|---|---|---|
| E-7 Insulating Layer | 100 | 200 | — | — | — | 130 | 10 | 350 | 0.20 | 0.30 | 0.30 |
| Semi-conductor layer | 150 | — | — | — | — | — | 5 | 300 | 0.20 | 0.40 | 0.50 |
| Protection Layer | 100 | — | — | — | — | 130 | 10 | 250 | 0.20 | 0.30 | 0.30 |

Note:
E-7 ... Example 7

TABLE 8

| Samples Layer | Flow Rate SiH$_4$ | Flow Rate H$_2$ | Flow Rate PH$_3$H$_2$ | Flow Rate B$_2$H$_6$/H$_2$ | Flow Rate CH$_4$ | Flow Rate GeH$_4$ | Pressure mTorr | Temperature of substrate °C. | μW power W/cm$^3$ | RF power W/cm$^3$ | Thickness of layer μm |
|---|---|---|---|---|---|---|---|---|---|---|---|
| Charge Injection Inhibition Layer | 100 | 500 | — | 20 | — | 10 | 10 | 350 | 0.20 | 0.40 | 3.0 |
| Photo- | 250 | 250 | — | 1 | — | — | 6 | 350 | 0.20 | 0.40 | 20.0 |

TABLE 8-continued

| Samples Layer | Flow Rate SiH$_4$ | Flow Rate H$_2$ | Flow Rate PH$_3$H$_2$ | Flow Rate B$_2$H$_6$/H$_2$ | Flow Rate CH$_4$ | Flow Rate GeH$_4$ | Pressure mTorr | Temperature of substrate °C. | μW power W/cm$^3$ | RF power W/cm$^3$ | Thickness of layer μm |
|---|---|---|---|---|---|---|---|---|---|---|---|
| conductive Layer Protection Layer | 50 | — | — | — | 500 | — | 20 | 350 | 0.20 | 0.40 | 0.5 |

TABLE 9

Conditions for Manufacturing Layers

| Substrate | Stainless SUS430BA 50 mm × 50 mm, 1 mm thick and mirror surface |
|---|---|
| Reflection Layer | Ag 100 nm |
| Conductive Layer | ZnO 1 μm |

| Name of Layers | Gas and flow rate | Type of RF | RF power (mW/cm3) | Internal Pressure (torr) | Temperature of substrate (°C.) | Applied bias | Thickness layer of (nm) |
|---|---|---|---|---|---|---|---|
| n-type layer | SiH$_4$ 2<br>H$_2$ 40<br>PH$_3$/H$_2$ 1<br>(diluted to 10%) | RF | 5 | 1 | 350 | Not applied | 10 |
| i-type layer | Si$_4$ 200<br>H$_2$ 200 | μW | 100 | 0.005 | 350 | RF 100 mW/cm3<br>DC 70 V | 400 |
| p-type layer | SiH$_4$ 1<br>H$_2$ 100<br>B$_2$H$_6$/H$_2$ 1<br>(diluted to 10%) | RF | 200 | 1 | 250 | Not applied | 5 |
| Transparent Electrode | ITO 70 nm | | | | | | |
| Collecting Electrode | Silver paste 20 μm | | | | | | |

TABLE 10

Conditions for Manufacturing Layers

| Substrate | Stainless SUS430BA 50 mm × 50 mm, 1 mm thick and mirror surface |
|---|---|
| Reflection Layer | Ag 100 nm |
| Conductive Layer | ZnO 1 μm |

| Name of Layers | Gas and flow rate | Type of RF | RF power (mW/cm3) | Internal Pressure (torr) | Temperature of substrate (°C.) | Applied bias | Thickness layer of (nm) |
|---|---|---|---|---|---|---|---|
| n-type layer | SiH$_4$ 2<br>H$_2$ 40<br>PH$_3$/H$_2$ 1<br>(diluted to 10%) | RF | 5 | 1 | 350 | Not applied | 10 |
| i-type layer | SiH$_4$ 2<br>H$_2$ 40 | RF | 40 | 1 | 300 | Not applied | 400 |
| p-type layer | SiH$_4$ 1<br>H$_2$ 100<br>B$_2$H$_6$/H$_2$ 1<br>(diluted to | RF | 200 | 1 | 250 | Not applied | 5 |

TABLE 10-continued

| Conditions for Manufacturing Layers | |
|---|---|
| | 10%) |
| Transparent Electrode | ITO 70 nm |
| Collecting Electrode | Silver paste 20 μm |

TABLE 11

| Conditions for Manufacturing Layers | |
|---|---|
| Substrate | Stainless SUS430BA 50 mm × 50 mm, 1 mm thick and mirror surface |
| Reflection Layer | Ag 100 nm |
| Conductive Layer | ZnO 1 μm |

| Name of Layers | Gas and flow rate | Type of RF | RF power (mW/cm3) | Internal Pressure (torr) | Temperature of substrate (°C.) | Applied bias | Thickness layer of (nm) |
|---|---|---|---|---|---|---|---|
| n-type layer | $SiH_4$ 2<br>$H_2$ 40<br>$PH_3/H_2$ 1<br>(diluted to 10%) | RF | 5 | 1 | 350 | Not applied | 10 |
| i-type layer | $Si_4$ 100<br>$H_2$ 100 | μW | 300 | 0.005 | 350 | Not applied | 400 |
| p-type layer | $SiH_4$ 1<br>$H_2$ 100<br>$B_2H_6/H_2$ 1<br>(diluted to 10%) | RF | 200 | 1 | 250 | Not applied | 5 |

| Transparent Electrode | ITO 70 nm |
|---|---|
| Collecting Electrode | Silver paste 20 μm |

TABLE 12

| | Method of Depositing i-type layer | RF power (mW/cm³) | Deposition speed (A/sec) | Photoelectric conversion efficiency |
|---|---|---|---|---|
| Example 13-1 | μw plasma CVD method | 15 | 10 | 0.80 |
| Example 13-2 | μw plasma CVD method | 30 | 20 | 1.03 |
| Example 13-3 | μw plasma CVD method | 60 | 50 | 1.10 |
| Example 13-4 | μw plasma CVD method | 110 | 100 | 1.13 |
| Example 13-5 | μw plasma CVD method | 305 | 300 | 1.09 |
| Example 13-6 | RF plasma CVD method | 25 | 5 | 1.00 |
| Example 13-7 | RF plasma CVD method | 45 | 10 | 0.86 |
| Example 13-8 | RF plasma CVD method | 95 | 20 | 0.42 |
| Example 13-9 | RF plasma CVD method | 230 | 50 | 0.22 |
| Example 13-10 | RF plasma CVD method | 450 | 100 | 0.16 |

Note:
Photoelectric conversion efficiency is a relative value assuming that Example 13-8 is 1.

TABLE 13

Conditions for Manufacturing Layers

| Substrate | Stainless SUS430BA 50 mm × 50 mm, 1 mm thick and mirror surface |
| --- | --- |
| Reflection Layer | Ag 100 nm |
| Conductive Layer | ZnO 1 μm |

| Name of Layers | Gas and flow rate (sccm) | Type of RF | RF power (mW/cm3) | Internal Pressure (torr) | Temperature of substrate (°C.) | Applied bias | Thickness layer of (nm) |
| --- | --- | --- | --- | --- | --- | --- | --- |
| n-type layer | SiH₄ 2<br>H₂ 40<br>PH₃/H₂ 1<br>(diluted to 10%) | RF | 5 | 1 | 350 | Not applied | 10 |
| i-type layer interfacial layer | SiH₄ 2<br>H₂ 20 | RF | 5 | 1 | 300 | Not applied | 20 |
| i-type layer | SiH₄ 200<br>H₂ 200 | μW | 100 | 0.005 | 300 | RF 100 mW/cm³ DC 70 V | 400 |
| i-type interfacial layer | SiH₄ 2<br>H₂ 200 | RF | 5 | 1 | 250 | Not applied | 20 |
| p-type layer | SiH₄ 1<br>H₂ 100<br>B₂H₆/H₂ 1<br>(diluted to 10%) | RF | 200 | 1 | 250 | Not applied | 5 |

| Transparent Electrode | ITO 70 nm |
| --- | --- |
| Collecting Electrode | Silver paste 20 μm |

TABLE 14

Conditions for Manufacturing Layers

| Substrate | Stainless SUS430BA 50 mm × 50 mm, 1 mm thick and mirror surface |
| --- | --- |
| Reflection Layer | Ag 100 nm |
| Conductive Layer | ZnO 1 μm |

| Name of Layers | Gas and flow rate (sccm) | Type of RF | RF power (mW/cm3) | Internal Pressure (torr) | Temperature of substrate (°C.) | Applied bias | Thickness layer of (nm) |
| --- | --- | --- | --- | --- | --- | --- | --- |
| n-type layer | SiH₄ 2<br>H₂ 40<br>PH₃/H₂ 1<br>(diluted to 10%) | RF | 5 | 1 | 350 | Not applied | 10 |
| i-type interfacial layer | SiH₄ 2<br>H₂ 20 | RF | 5 | 1 | 300 | Not applied | 20 |
| i-type layer | SiH₄ 100<br>H₂ 100 | μW | 200 | 0.005 | 300 | Not applied | 400 |
| i-type interfacial layer | SiH₄ 2<br>H₂ 20 | RF | 5 | 1 | 250 | Not applied | 20 |
| p-type layer | SiH₄ 1<br>H₂ 100<br>B₂H₆/H₂ 1<br>(diluted to 10%) | RF | 200 | 1 | 250 | Not applied | 5 |

| Transparent Electrode | ITO 70 nm |
| --- | --- |
| Collecting Electrode | Silver paste 20 μm |

TABLE 15

| | Method of Depositing i-type layer | RF Power (mW/cm³) | Deposition speed (A/sec) | Photoelectric conversion efficiency |
|---|---|---|---|---|
| Example 15-1 | μw plasma CVD method | 15 | 10 | 0.79 |
| Example 15-2 | μw plasma CVD method | 30 | 20 | 1.05 |
| Example 15-3 | μw plasma CVD method | 60 | 50 | 1.13 |
| Example 15-4 | μw plasma CVD method | 110 | 100 | 1.15 |
| Example 15-5 | μw Plasma CVD method | 305 | 300 | 1.11 |
| Example 15-6 | RF plasma CVD method | 25 | 5 | 1.00 |
| Example 15-7 | RF plasma CVD method | 45 | 10 | 0.33 |
| Example 15-8 | RF Plasma CVD method | 95 | 20 | 0.41 |
| Example 15-9 | RF plasma CVD method | 230 | 50 | 0.19 |
| Example 15-10 | RF plasma CVD method | 450 | 100 | 0.18 |

Note:
Photoelectric conversion efficiency is a relative value assuming that Example 15-6 is 1.

TABLE 16

| | Thickness (A) of i-type interfacial layer | Photoelectric conversion efficiency | Fill factor |
|---|---|---|---|
| Example 16-1 | 0 | 1.00 | 1.00 |
| Example 16-2 | 30 | 1.04 | 1.01 |
| Example 16-3 | 50 | 1.20 | 1.07 |
| Example 16-4 | 100 | 1.19 | 1.06 |
| Example 16-5 | 150 | 1.23 | 1.08 |
| Example 16-6 | 200 | 1.21 | 1.06 |
| Example 16-7 | 250 | 1.20 | 1.06 |

Note:
Photoelectric conversion efficiency is a relative value assuming that Example 16-1 is 1.

TABLE 17

| Substrate | SUS430BA, 120 mm wide, 200 m long, 0.13 mm thick |
|---|---|
| Lower Electrode | Silver thin film 100 nm, ZnO thin film 1 μm |
| Gate gas | $H_2$ 700 sccm from each gate |

Manufacturing conditions for layers

| Name of layers | Gas and flow rate (sccm) | Discharging (mW/cm³) | Bias | Pressure (mTorr) | Temperature (° C.) |
|---|---|---|---|---|---|
| first conductive type layer | $SiH_4$ 5<br>$PH_3$ 0.05<br>$H_2$ 100 | RF 15 | Not applied | 1000 | 350 |
| i-type layer | $SiH_4$ 200<br>$H_2$ 500 | μW 200 | RF 360 mw/cm³ | 3 | 350 |
| second conductive type layer | $SiH_4$ 0.5<br>$B_2H_6$ 0.05<br>$H_2$ 500 | RF 500 | Not applied | 1000 | 300 |

Transparent Electrode ITO ($In_2O_3$ + $SnO_2$) 700 nm
Collecting Electrode Al 2 μm

TABLE 18

| Device No. | Pressure, i-type layer (mTorr) | Uniformity characteristics | Density of defects |
|---|---|---|---|
| Example 17 | 3 | 1.18 | 1.41 |
| Example 18-1 | 5 | 1.19 | 1.37 |
| Example 18-2 | 10 | 1.18 | 1.33 |
| Example 18-3 | 30 | 1.15 | 1.31 |
| Example 18-4 | 50 | 1.13 | 1.25 |

TABLE 18-continued

| Device No. | Pressure, i-type layer (mTorr) | Uniformity characteristics | Density of defects |
|---|---|---|---|
| Comparative Example 18 | 100 | 1.00 | 1.00 |

Note:
Uniformity of characteristics and density of defects is a relative value with respect to Comparative Example 18.

TABLE 19

| Device No. | Pressure, first conductivity-type layer | Pressure, second conductivity-type layer | Uniformity of characteristics | Density of defects |
|---|---|---|---|---|
| Example 19-1 | 2000 | 1000 | 1.18 | 1.38 |
| Example 19-2 | 300 | 1000 | 1.16 | 1.34 |
| Example 19-3 | 100 | 1000 | 1.14 | 1.26 |
| Example 19-4 | 1000 | 2000 | 1.17 | 1.36 |
| Example 19-5 | 1000 | 100 | 1.13 | 1.27 |
| Example 19-6 | 100 | 100 | 1.12 | 1.24 |
| Comparative Example 19-1 | 30 | 1000 | 1.00 | 1.00 |
| Comparative Example 19-2 | 1000 | 30 | 0.99 | 1.01 |

Note:
Uniformity of characteristics and density of defects is a relative value with respect to Comparative Example 19-1.

TABLE 20

| Device No. | Bias, i-type layer | Uniformity of characteristics | Density of defects |
|---|---|---|---|
| Example 17 | RF 350 mW/cm$^3$ | 1.24 | 1.45 |
| Example 20-1 | RF 100 mW/cm$^3$ DC 150 V | 1.26 | 1.49 |
| Example 20-2 | DC 250 V | 1.22 | 1.38 |
| Example 20-3 | AC(60 Hz) 100 V | 1.18 | 1.33 |
| Comparative Example 20 | Not applied | 1.00 | 1.00 |

Note:
Uniformity of characteristics and density of defects is a relative value with respect to Comparative Example 20.

TABLE 21

| | Manufacturing conditions of layers | | | | |
|---|---|---|---|---|---|
| Name of layers | Gas and flow rate (sccm) | Discharging power (mW/cm$^3$) | Bias | Pressure (mTorr) | Temperature of substrate (°C.) |
| first conductivity type layer | SiH$_4$ 5 B$_2$H$_6$ 0.03 H$_2$ 100 | RF 15 | Not applied | 1000 | 350 |
| i-type layer | SiH$_4$ 200 H$_2$ 500 | microwave 200 | RF 350 mW/cm$^3$ | 3 | 350 |
| second conductivity type layer | SiH$_4$ 0.5 PH$_3$ 0.07 H$_2$ 500 | RF 500 | Not applied | 1000 | 300 |

TABLE 22

| | Manufacturing conditions of layers | | | | |
|---|---|---|---|---|---|
| Name of layers | Gas and flow rate (sccm) | Discharging power (mW/cm³) | Bias | Pressure (mTorr) | Temperature of substrate (°C.) |
| first conductivity type layer | SiH$_4$ 5<br>B$_2$H$_6$ 0.05<br>H$_2$ 100 | RF 15 | Not applied | 1000 | 350 |
| i-type layer | SiH$_4$ 50<br>GeH$_2$ 40<br>H$_2$ 500 | microwave 150 | RF 250 mW/cm³ | 3 | 350 |
| second conductivity type layer | SiH$_4$ 0.5<br>B$_2$H$_6$ 0.05<br>H$_2$ 500 | RF 500 | Not applied | 1000 | 300 |
| first conductivity type layer | SiH$_4$ 3<br>PH$_3$ 0.05<br>H$_2$ 100 | RF 10 | Not applied | 1000 | 300 |
| i-type layer | SiH$_4$ 120<br>H$_2$ 500 | microwave 150 | RF 300 mW/cm³ | 3 | 350 |
| second conductivity type layer | SiH$_4$ 0.5<br>B$_2$H$_6$ 0.05<br>H$_2$ 500 | RF 500 | Not applied | 1000 | 300 |

TABLE 23

| | Manufacturing conditions of layers | | | | |
|---|---|---|---|---|---|
| Name of layers | Gas and flow rate (sccm) | Discharging power (mW/cm³) | Bias | Pressure (mTorr) | Temperature of substrate (°C.) |
| first conductivity type layer | SiH$_4$ 5<br>PH$_3$ 0.05<br>H$_2$ 100 | RF 15 | Not applied | 1000 | 350 |
| i-type layer | SiH$_4$ 60<br>GeH$_2$ 30<br>H$_2$ 500 | microwave 100 | RF 200 mW/cm³ | 3 | 350 |
| second conductivity type layer | SiH$_4$ 0.3<br>B$_2$H$_6$ 0.03<br>H$_2$ 500 | RF 700 | Not applied | 1000 | 300 |
| first conductivity type layer | SiH$_4$ 4<br>PH$_3$ 0.04<br>H$_2$ 100 | RF 12 | Not applied | 1000 | 300 |
| i-type layer | SiH$_4$ 90<br>H$_2$ 500 | microwave 100 | RF 200 mW/cm³ | 3 | 350 |
| second conductivity type layer | SiH$_4$ 0.5<br>B$_2$H$_6$ 0.05<br>H$_2$ 400 | RF 500 | Not applied | 1000 | 300 |
| first conductivity type layer | SiH$_4$ 3<br>PH$_3$ 0.05<br>H$_2$ 100 | RF 10 | Not applied | 1000 | 300 |
| i-type layer | SiH$_4$ 80<br>H$_2$ 500 | microwave 100 | RF 200 mW/cm³ | 3 | 350 |
| second conductivity type layer | SiH$_4$ 0.5<br>CH$_4$ 0.05<br>B$_2$H$_6$ 0.01<br>H$_2$ 300 | RF 300 | Not applied | 1000 | 300 |

TABLE 24

| Substrate | SUS430BA, 120 mm wide, 200 m long, 0.13 mm thick |
| --- | --- |
| Lower Electrode | Silver thin film 100 nm, ZnO thin film 1 μm |
| Gate gas | $H_2$ 700 sccm from each gate |

| | Manufacturing conditions of layers | | | | |
| --- | --- | --- | --- | --- | --- |
| Name of layers | Gas and flow rate (sccm) | Discharging ($mW/cm^3$) | Bias | Pressure (mTorr) | Temperature (°C.) |
| first conductivity type layer | $SiH_4$ 5<br>$PH_3$ 0.05<br>$H_2$ 100 | RF 15 | Not applied | 1000 | 350 |
| i-type layer | $SiH_4$ 200<br>$H_2$ 500 | μW 200 | RF 350 $mw/cm^3$ | 3 | 350 |
| interfacial layer | $SiH_4$ 4<br>$H_2$ 100 | RF 10 | Not applied | 1000 | 300 |
| second conductivity type layer | $SiH_4$ 0.5<br>$B_2H_6$ 0.05<br>$H_2$ 500 | RF 500 | Not applied | 1000 | 300 |

Transparent Electrode ITO ($In_2O_3$ + $SnO_2$) 70 nm
Collecting Electrode Al 2 μm

TABLE 25

| Device No. | Pressure, i-type layer (mTorr) | Uniformity characteristics | Density of defects |
| --- | --- | --- | --- |
| Example 24 | 3 | 1.19 | 1.39 |
| Example 25-1 | 5 | 1.18 | 1.38 |
| Example 25-2 | 10 | 1.19 | 1.35 |
| Example 25-3 | 30 | 1.15 | 1.29 |
| Example 25-4 | 50 | 1.12 | 1.24 |
| Comparative Example 25 | 100 | 1.00 | 1.00 |

Note: Uniformity of characteristics and density of defects is a relative value with respect to Comparative Example 25.

TABLE 27

| Device No. | Bias, i-type layer | Uniformity of characteristics | Density of defects |
| --- | --- | --- | --- |
| Example 24 | RF 350 $mW/cm^3$ | 1.25 | 1.46 |
| Example 27-1 | RF 100 $mW/cm^3$ DC 150V | 1.27 | 1.47 |
| Example 27-2 | DC 250V | 1.20 | 1.36 |
| Example 27-3 | AC (60 Hz) 100V | 1.17 | 1.31 |
| Comparative Example 27 | Not applied | 1.00 | 1.00 |

Note: Uniformity of characteristics and density of defects is a relative value with respect to Comparative Example 27.

TABLE 26

| Device No. | Pressure, first conductivity-type layer | Interfacial (mTorr) | Pressure, second conductivity-type layer | Uniformity of characteristics | Density of defects |
| --- | --- | --- | --- | --- | --- |
| Example 28-1 | 2000 | 1000 | 1000 | 1.20 | 1.37 |
| Example 28-2 | 300 | 1000 | 1000 | 1.17 | 1.33 |
| Example 28-3 | 100 | 1000 | 1000 | 1.15 | 1.26 |
| Example 28-4 | 1000 | 1000 | 2000 | 1.19 | 1.37 |
| Example 28-5 | 1000 | 1000 | 100 | 1.12 | 1.25 |
| Example 28-6 | 1000 | 2000 | 1000 | 1.17 | 1.34 |
| Example 28-7 | 1000 | 100 | 1000 | 1.12 | 1.25 |
| Example 28-8 | 100 | 100 | 100 | 1.11 | 1.25 |
| Comparative Example 26-1 | 30 | 1000 | 1000 | 1.00 | 1.00 |
| Comparative Example 26-2 | 1000 | 1000 | 30 | 1.01 | 1.02 |
| Comparative Example 26-3 | 1000 | 30 | 1000 | 0.98 | 0.97 |

Note: Uniformity of characteristics and density of defects is a relative value with respect to Comparative Example 26-1.

TABLE 28

| Name of layers | Manufacturing conditions of layers | | | | |
|---|---|---|---|---|---|
| | Gas and flow rate (sccm) | Discharging power (mW/cm³) | Bias | Pressure (mTorr) | Temperature of substrate (°C.) |
| first conductivity type layer | $SiH_4$ 5<br>$B_2H_6$ 0.03<br>$H_2$ 100 | RF 15 | Not applied | 1000 | 350 |
| i-type layer | $SiH_4$ 200<br>$H_2$ 500 | microwave 200 | RF 350 mW/cm³ | 3 | 350 |
| interfacial layer | $SiH_4$ 4<br>$H_2$ 100 | RF 10 | Not applied | 1000 | 300 |
| second conductivity type layer | $SiH_4$ 0.5<br>$PH_3$ 0.07<br>$H_2$ 500 | RF 500 | Not applied | 1000 | 300 |

TABLE 29

| Name of layers | Manufacturing conditions of layers | | | | |
|---|---|---|---|---|---|
| | Gas and flow rate (sccm) | Discharging power (mW/cm³) | Bias | Pressure (mTorr) | Temperature of substrate (°C.) |
| first conductivity type layer | $SiH_4$ 5<br>$PH_3$ 0.05<br>$H_2$ 100 | RF 15 | Not applied | 1000 | 350 |
| interfacial layer | $SiH_4$ 5<br>$H_2$ 100 | RF 12 | Not applied | 1000 | 350 |
| i-type layer | $SiH_4$ 200<br>$H_2$ 500 | microwave 200 | RF 350 mW/cm³ | 3 | 350 |
| second conductivity type layer | $SiH_4$ 0.5<br>$B_2H_6$ 0.05<br>$H_2$ 500 | RF 500 | Not applied | 1000 | 300 |

TABLE 30

| Name of layers | Manufacturing conditions of layers | | | | |
|---|---|---|---|---|---|
| | Gas and flow rate (sccm) | Discharging power (mW/cm³) | Bias | Pressure (mTorr) | Temperature of substrate (°C.) |
| first conductivity type layer | $SiH_4$ 5<br>$PH_3$ 0.05<br>$H_2$ 100 | RF 15 | Not applied | 1000 | 350 |
| interfacial layer | $SiH_4$ 5<br>$H_2$ 100 | RF 12 | Not applied | 1000 | 350 |
| i-type layer | $SiH_4$ 200<br>$H_2$ 500 | microwave 200 | RF 350 mW/cm³ | 3 | 350 |
| second conductivity type layer | $SiH_4$ 0.5<br>$B_2H_6$ 0.05<br>$H_2$ 500 | RF 500 | Not applied | 1000 | 300 |

TABLE 31

Manufacturing conditions of layers

| Name of layers | Gas and flow rate (sccm) | Discharging power (mW/cm$^3$) | Bias | Pressure (mTorr) | Temperature of substrate (°C.) |
|---|---|---|---|---|---|
| first conductivity type layer | SiH$_4$ 5<br>PH$_3$ 0.05<br>H$_2$ 100 | RF 15 | Not applied | 1000 | 350 |
| interfacial layer | SiH$_4$ 5<br>H$_2$ 200 | RF 5 | Not applied | 1000 | 300 |
| i-type layer | SiH$_4$ 80<br>GeH$_4$ 40<br>H$_2$ 500 | microwave 150 | RF 250 mW/cm$^3$ | 3 | 350 |
| interfacial layer | SiH$_4$ 3<br>H$_2$ 200 | RF 10 | Not applied | 1000 | 300 |
| second conductivity type layer | SiH$_4$ 0.5<br>B$_2$H$_6$ 0.05<br>H$_2$ 500 | RF 500 | Not applied | 1000 | 300 |
| first conductivity type layer | SiH$_4$ 3<br>PH$_3$ 0.05<br>H$_2$ 100 | RF 10 | Not applied | 1000 | 300 |
| i-type layer | SiH$_4$ 120<br>H$_2$ 500 | microwave 150 | RF 300 mW/cm$^3$ | 3 | 350 |
| interfacial layer | SiH$_4$ 3<br>H$_2$ 200 | RF 10 | Not applied | 1000 | 300 |
| second conductivity type layer | SiH$_4$ 0.5<br>B$_2$H$_6$ 0.05<br>H$_2$ 500 | RF 500 | Not applied | 1000 | 300 |

TABLE 32

Manufacturing conditions of layers

| Name of layers | Gas and flow rate (sccm) | Discharging power (mW/cm$^3$) | Bias | Pressure (mTorr) | Temperature of substrate (°C.) |
|---|---|---|---|---|---|
| first conductivity type layer | SiH$_4$ 5<br>PH$_3$ 0.05<br>H$_2$ 100 | RF 15 | Not applied | 1000 | 350 |
| i-type layer | SiH$_4$ 60<br>GeH$_4$ 30<br>H$_2$ 500 | microwave 100 | RF 200 mW/cm$^3$ | 3 | 350 |
| interfacial layer | SiH$_4$ 3<br>H$_2$ 100 | RF 8 | Not applied | 1000 | 300 |
| second conductivity type layer | SiH$_4$ 0.8<br>B$_2$H$_6$ 0.08<br>H$_2$ 500 | RF 700 | Not applied | 1000 | 300 |
| first conductivity type layer | SiH$_4$ 4<br>PH$_3$ 0.04<br>H$_2$ 100 | RF 12 | Not applied | 1000 | 300 |
| i-type layer | SiH$_4$ 90<br>H$_2$ 500 | microwave 100 | RF 200 mW/cm$^3$ | 3 | 350 |
| interfacial layer | SiH$_4$ 3<br>H$_2$ 100 | RF 8 | Not applied | 1000 | 300 |
| second conductivity type layer | SiH$_4$ 0.5<br>B$_2$H$_6$ 0.05<br>H$_2$ 400 | RF 500 | Not applied | 1000 | 300 |
| first conductivity type layer | SiH$_4$ 3<br>PH$_3$ 0.05<br>H$_2$ 100 | RF 10 | Not applied | 1000 | 300 |
| i-type layer | SiH$_4$ 80<br>H$_2$ 500 | microwave 100 | RF 200 mW/cm$^3$ | 3 | 350 |
| interfacial layer | SiH$_4$ 3<br>H$_2$ 100 | RF 8 | Not applied | 1000 | 300 |
| second conductivity layer | SiH$_4$ 0.5<br>CH$_4$ 0.05<br>B$_2$H$_6$ 0.01<br>H$_2$ 800 | RF 800 | Not applied | 1000 | 300 |

What is claimed is:

1. A deposited film forming apparatus comprising;

raw material gas introducing means for introducing a raw material gas to a deposition chamber;

exhausting means for exhausting said deposition chamber to have a pressure of 50 m Torr or less during its film-forming;

microwave energy introducing means for inducing microwave energy on a substrate arranged in said deposition chamber so that said energy be equal to or less than the amount of energy for keeping deposition speed constant, even if said microwave energy is applied to said raw material gas and said applied energy is changed; and RF energy introducing means for introducing RF energy, which should be higher than said microwave energy, to said deposition chamber at the same time when said microwave energy is introduced.

2. A deposited film forming apparatus according to claim 1, wherein said substrate is an elongated substrate member.

3. A deposited film forming apparatus according to claim 1, further comprising DC voltage applying means for applying DC voltage to said RF energy introducing means.

4. A deposited film forming apparatus according to claim 1, further comprising;
   a conductive mesh interposed between a space where said raw material gas is decomposed by said microwave energy and said substrate; and
   potential adjusting means for adjusting said conductive mesh to have the same potential as that of said substrate.

* * * * *

UNITED STATES PATENT AND TRADEMARK OFFICE
CERTIFICATE OF CORRECTION

PATENT NO. : 5,527,396
DATED : June 18, 1996
INVENTOR(S) : KEISHI SAITOH ET AL.

Page 1 of 17

It is certified that error appears in the above-identified patent and that said Letters Patent is hereby corrected as shown below:

On the title page,

AT [56] REFERENCES CITED

U.S. Patent Documents,
"Carnella et al." should read --Cannella et al.--.

Attorney, Agent or Firm,
"Fitzpatrick Cella Harper & Scinto" should read
--Fitzpatrick, Cella, Harper & Scinto--.

COLUMN 1

Line 28, "silicone" should read --silicon--.
Line 36, "subpower" should read --sub-power--.

COLUMN 2

Line 3, "1215-218." should read --1215-1218.--.
Line 27, "substrate," should read --the substrate,--.

COLUMN 8

Line 13, "conductivity" should read --conductive--.
Line 22, "material," should read --material gas,--.
Line 47, "mm/sec" should read --nm/sec--.
Line 61, "within" should read --reaching--.

COLUMN 9

Line 47, "Material" should read --Materials--.

UNITED STATES PATENT AND TRADEMARK OFFICE
CERTIFICATE OF CORRECTION

PATENT NO. : 5,527,396
DATED : June 18, 1996
INVENTOR(S) : KEISHI SAITOH ET AL.

It is certified that error appears in the above-identified patent and that said Letters Patent is hereby corrected as shown below:

COLUMN 10

Line 9, "conductivity" should read --conductive--.
Line 14, "is" should be deleted.
Line 32, "chamber" should read --chamber 101--.
Line 44, "and" should be deleted and "(a-Si:HZX)," should read --(a-Si:HX),--.

COLUMN 12

Line 6, "as" should read --gas--.
Line 14, "$C_nH_{2n+2}$" should read --$C_nH_{2n}$--.
Line 67, "conductivity type" should read --conductivity-type--.

COLUMN 13

Line 9, "one the" should read --one of the--.
Line 53, "electrode" should read --electron--.
Line 54, "As a" should read --As an--.

COLUMN 14

Line 43, "a adding" should read --adding--.
Line 56, "0:1" should read --0.1--.

COLUMN 15

Line 7, "i-type" should read --i-type layers--.
Line 51, "$C_6H_2$," should read --$C_6H_6$,--.
Line 57, "$B_6H_{10},B_6H_{10}$," should read --$B_6H_{10}$,--.
Line 62, "material" should read --materials--.
Line 66, "$ASH_3$," should read --$AsH_3$,--.
Line 67, "$SbF_3$," (second occurrence) should read --$SbF_5$,--.

UNITED STATES PATENT AND TRADEMARK OFFICE
CERTIFICATE OF CORRECTION

PATENT NO.  : 5,527,396
DATED       : June 18, 1996
INVENTOR(S) : KEISHI SAITOH ET AL.

It is certified that error appears in the above-identified patent and that said Letters Patent is hereby corrected as shown below:

COLUMN 16

Line 58, "be of," should read --be made of,--.
Line 60, "a SiGeC:HX." should read --a-SiGeC:HX.--.

COLUMN 17

Line 3, "n-type" should read --p-type--.
Line 36, "between" should read --between the--.
Line 67, "a heater 303, heater 303," should read --a heater 303,--.

COLUMN 19

Line 2, "course" should read --coarse--.
Line 22, "stacking" should read --stacking a--.
Line 25, "Electrodes" should read --Electrode--.
Line 46, "or ETFE," should read --ETFE,--.

COLUMN 20

Line 15, "of" should be deleted.
Line 52, "supplied" should read --to be supplied--.
Line 54, "content" should read --contents--.

COLUMN 21

Line 12, "according the" should read --according to the--.

UNITED STATES PATENT AND TRADEMARK OFFICE
CERTIFICATE OF CORRECTION

PATENT NO. : 5,527,396
DATED : June 18, 1996
INVENTOR(S) : KEISHI SAITOH ET AL.

It is certified that error appears in the above-identified patent and that said Letters Patent is hereby corrected as shown below:

COLUMN 23

Line 32, "1609" should read --1609,--.

COLUMN 24

Line 2, "25 mn." should read --25 nm.--.
Line 22, "of-hundreds" should read --of hundreds--.
Line 29, "by-an" should read --by an--.

COLUMN 25

Line 11, "ray" should read --may--.
Line 24, "gauges," should read --pressure gauges,--.

COLUMN 26

Line 23, "given" should read --is given-- and "different-type" should read --different type--.
Line 26, "of" should read --or--.

COLUMN 27

Line 40, "Since" should read --¶ Since--.,

UNITED STATES PATENT AND TRADEMARK OFFICE
CERTIFICATE OF CORRECTION

PATENT NO. : 5,527,396
DATED : June 18, 1996
INVENTOR(S) : KEISHI SAITOH ET AL.

Page 5 of 17

It is certified that error appears in the above-identified patent and that said Letters Patent is hereby corrected as shown below:

COLUMN 29

Line 4, "406," should read --2406,--.
Line 5, "electrode 2407." should read --electrode 2407. The example shown in Fig. 24F is a so-called triple-type photovoltaic device having an arrangement wherein three photovoltaic devices 2420, 2421, and 2422 are stacked, each using as the i-type layers, three types of semiconductor layers having different band gap and/or thickness. The triple-type photovoltaic device comprises an elongated substrate member 2401, a lower electrode 2402, a first-conductivity-type layer 2403, an i-type layer 2404, an i-type interface layer 2408, a second-conductivity-type layer 2410, a first-conductivity-type layer 2411, an i-type layer 2412, an i-type interface layer 2413, a second-conductivity-type layer 2416, a first-conductivity-type layer 2417, an i-type layer 2418, an i-type interface layer 2419, a second-conductivity-type layer 2405, an upper electrode 2406, and a collecting electrode 2407.--.

Line 58, close up right margin.
Line 59, close up left margin.

COLUMN 30

Line 31, "t" should read --to--.
Line 32, "c" should be deleted.

UNITED STATES PATENT AND TRADEMARK OFFICE
CERTIFICATE OF CORRECTION

PATENT NO. : 5,527,396
DATED : June 18, 1996
INVENTOR(S) : KEISHI SAITOH ET AL.

It is certified that error appears in the above-identified patent and that said Letters Patent is hereby corrected as shown below:

COLUMN 32

Line 8, "contained" should read --containing--.
Line 35, "germanium" should read --or germanium--.
Line 36, "Ge$_3$F," should read --GeH$_3$F,--.

COLUMN 33

Line 1, "B $_6$H$_{14}$" should read --B$_6$H$_{14}$--.
Line 9, "BIH$_3$," should read --BiH$_3$,
Line 10, "F $_3$N," should read --F$_3$N,--.
Line 44, "80°" should read --80°C--.
Line 49, "999.9999%)" should read --99.9999%)--.
Line 50, "purity" should read --(purity--.

COLUMN 34

Line 11, "values" should read --valves--.
Line 13, "2 sccm" should read --25 sccm--.
Line 15, "value" should read --valve--.
Line 33, "106" should read --1076--.
Line 67, "and" should read --to--.

COLUMN 35

Line 66, "B$_2$H$_6$/H$_2$" should read --B$_2$H$_6$/H$_2$ gas--.

UNITED STATES PATENT AND TRADEMARK OFFICE
CERTIFICATE OF CORRECTION

PATENT NO. : 5,527,396
DATED : June 18, 1996
INVENTOR(S) : KEISHI SAITOH ET AL.

It is certified that error appears in the above-identified patent and that said Letters Patent is hereby corrected as shown below:

COLUMN 36

Line 24, "FIG.. 4," should read --FIG. 4,--.
    Line 35, "temperature" should read
    --temperature of the substrate 402--.
    Line 65, "99.99%" should read --99.99%.--.

COLUMN 37

Line 30, "AM 1.5" should read --AM1.5--.
    Line 36, "W/cm$^3$" should read --W/cm$^3$)--.

COLUMN 39

Line 37, "power" (second occurrence) should read
    --power was changed--.
    Line 63, "($\eta$0)" should read --($\eta$0).--.

COLUMN 40

Line 29, "their" should read --the--.
    Line 53, "22" should read --2-2--.
    Line 65, "semiconductor" should read
    --silicon semiconductor--.

COLUMN 43

Line 62, "type layer 907," should read --layer 907,--.
    Line 65, "third" should read --a third--.
    Line 67, "Table -5." should read --Table 5.--.

UNITED STATES PATENT AND TRADEMARK OFFICE
CERTIFICATE OF CORRECTION

PATENT NO. : 5,527,396
DATED : June 18, 1996
INVENTOR(S) : KEISHI SAITOH ET AL.

It is certified that error appears in the above-identified patent and that said Letters Patent is hereby corrected as shown below:

COLUMN 46

Line 39, "forming" should be deleted.
Line 63, "Then" should read --When--.

COLUMN 47

Line 20, "Si$_4$" should read --SiF$_4$--.
Line 22, "Si$_4$" should read --SiF$_4$--.
Line 35, "$\mu$W" should read --mW--.
Line 38, "cooled" should read --cooled down--.

COLUMN 48

Line 55, "99.999%)" should read --99.9999%)--.
Line 63, "SiH-$_4$" should read --SiH$_4$--.
Line 64, "GeH-$_4$" should read --GeH$_4$--.

COLUMN 50

Line 10, "BF$_3$/H$_2$" should read --BF$_3$/H$_2$ gas--.
Line 18, "a+00 V" should read --a +100 V--.
Line 39, "103" should read --104--.

COLUMN 51

Line 13, "for" should read --of--.
Line 30, "deposition" should read --deposited--.
Line 41, "Example 9)" should read --(Example 9)--.

UNITED STATES PATENT AND TRADEMARK OFFICE
CERTIFICATE OF CORRECTION

PATENT NO. : 5,527,396
DATED : June 18, 1996
INVENTOR(S) : KEISHI SAITOH ET AL.

It is certified that error appears in the above-identified patent and that said Letters Patent is hereby corrected as shown below:

COLUMN 52

Line 43, "1 $\mu$m" should read --1 $\mu$m and a vertical level difference of about 0.3 $\mu$m--.
Line 56, "GeH$_4$" should read --GeH$_4$ gas--.

COLUMN 53

Line 34, "example 10" should read --Example 10--.

COLUMN 55

Line 11, "99.999%," should read --99.99%,-- and "cylinder" should be deleted.
Line 19, "and" should read --to--.
Line 33, "1704," should read --1074,--.
Line 34, "1705" should read --1075,--.

COLUMN 56

Line 2, "supply" should read --supplying--.
Line 38, "bias" should read --bias of the bias power source--.
Line 39, "power source" should be deleted.
Line 67, "gas" should read --gas was--.

COLUMN 59

Line 13, "device" should read --devices--.
Line 58, "Comparative" should read --Comparative Example--.

UNITED STATES PATENT AND TRADEMARK OFFICE
CERTIFICATE OF CORRECTION

PATENT NO. : 5,527,396
DATED : June 18, 1996
INVENTOR(S) : KEISHI SAITOH ET AL.

Page 10 of 17

It is certified that error appears in the above-identified patent and that said Letters Patent is hereby corrected as shown below:

COLUMN 60

Line 4, "side" should read --layer side--.
Line 21, "FT-IRI720-X" should read --(FT-IRI720-X--.
Line 23, "SiH" should read --a SiH--.

COLUMN 61

Line 2, "photovoltaic" should read --photoelectric--.
Line 38, "$B_2 H_6 / H_2$" should read --$B_2H_6/H_2$--.

COLUMN 62

Line 49, "materials" should read --material--.
Line 60, "and the $SiH_4$ gas" should be deleted.

COLUMN 63

Line 3, "1043," should read --104,--.
Line 12, "ill" should read --III--.

COLUMN 65

Line 10, "results" should read --result--.
Line 37, "substrate" should read --substrate by the same method as that according to Example 14--.
Line 49, "deices" should read --devices--.

UNITED STATES PATENT AND TRADEMARK OFFICE
CERTIFICATE OF CORRECTION

PATENT NO. : 5,527,396
DATED : June 18, 1996
INVENTOR(S) : KEISHI SAITOH ET AL.

It is certified that error appears in the above-identified patent and that said Letters Patent is hereby corrected as shown below:

COLUMN 66

Line 20, "of" should be deleted.
Line 21, 'hydrogen" should be deleted.

COLUMN 68

Line 23, "were" should read --was--.
Line 29, "device" should read --devices--.

COLUMN 69

Line 7, "By" should be deleted.
Line 8, "employing" should read --By employing--.

COLUMN 70

Line 13, "characteristic" should read --characteristics--.
Line 17 "characteristic" should read --characteristics--.
Line 33, "manufacturing" should read --depositing--.
Line 54, "an" should read --at-- and
"a photovoltaic" should read
--so that a photovoltaic--.

COLUMN 71

Line 2, "characteristic" should read --characteristics--.
Line 6, "characteristic" should read --characteristics--.
Line 17, "chamber" should read --chambers--.
Line 49, "Comparative Example 23-2" should read
--¶ Comparative Example 23-2 (center title)--.
Line 61, "characteristic" should read --characteristics--.
Line 66, "characteristic" should read --characteristics--.

UNITED STATES PATENT AND TRADEMARK OFFICE
CERTIFICATE OF CORRECTION

PATENT NO. : 5,527,396
DATED : June 18, 1996
INVENTOR(S) : KEISHI SAITOH ET AL.

Page 12 of 17

It is certified that error appears in the above-identified patent and that said Letters Patent is hereby corrected as shown below:

COLUMN 73

Line 14, "member," should read --member, so that--.
Line 58, "219i" should read --2191--.
Line 65, "member," should read --member, so that--.

COLUMN 74

Line 7, "26-1" should read --26--.
Line 26, "member," should read --member, so that--.

COLUMN 75

Line 2, "as the" should read --as that--.
Line 8, "characteristic" should read --characteristics--.
Line 12, "characteristic" should read --characteristics--.
Line 31, "characteristic" should read --characteristics--.
Line 44, "characteristic" should read --characteristics--.
Line 47, "characteristic" should read --characteristics--.

COLUMN 76

Line 2, "layer" should read --layer.-- and
"gates" should read --gas gates.--..
Line 36, "characteristic" should read --characteristics--.
Line 40, "characteristic" should read --characteristics--.

COLUMN 77

Line 35, "characteristic" should read --characteristics--.

UNITED STATES PATENT AND TRADEMARK OFFICE
CERTIFICATE OF CORRECTION

PATENT NO. : 5,527,396
DATED : June 18, 1996
INVENTOR(S) : KEISHI SAITOH ET AL.

Page 13 of 17

It is certified that error appears in the above-identified patent and that said Letters Patent is hereby corrected as shown below:

COLUMN 78

Line 30, "layer." should read --layer or between the p-type layer and the i-type layer.--.

COLUMN 82

Table 5, "

| $\mu W$ power $W/cm^3$ |
|---|
| 0.25 |
| 0.18 |
| 0.25 |

" should read --

| $\mu W$ power $W/cm^3$ |
|---|
| 0.25 |
| 0.18 |
| 0.30 |

--.

Table 7, "$PH_3H_2$" should read --$PH_3/H_2$-- and "$NH_4$" should read --$NH_3$--.

COLUMN 83

Table 8, "$PH_3H_2$" should read --$PH_3/H_2$-- and "$GeH_4$" should read --$SiF_4$--.

Table 9, "$Si_4$" should read --$SiH_4$-- and "RF power (mW/cm3)" should read --RF power ($mW/cm^3$)--

Table 10, "RF power (mW/cm3)" should read --RF power ($mW/cm^3$)--

UNITED STATES PATENT AND TRADEMARK OFFICE
CERTIFICATE OF CORRECTION

PATENT NO. : 5,527,396
DATED : June 18, 1996
INVENTOR(S) : KEISHI SAITOH ET AL.

It is certified that error appears in the above-identified patent and that said Letters Patent is hereby corrected as shown below:

COLUMN 85

Table 11, "Si$_4$" should read --SiH$_4$-- and
"RF power" should read --RF power--.
(mW/cm3)                          (mW/cm$^3$)

COLUMN 87

Table 13, "i-type layer     " should read
  interfacial layer
--i-type             -- and
  interfacial layer
"RF power" should read --RF power--.
(mW/cm3)                   (mW/cm$^3$)

Table 14, "RF power" should read --RF power--.
(mW/cm3)                   (mW/cm$^3$)

COLUMN 89

Table 17, "RF 360" should read --RF 350--.

COLUMN 90

Table 18, "is a relative value" should read
--are relative values--.

UNITED STATES PATENT AND TRADEMARK OFFICE
CERTIFICATE OF CORRECTION

PATENT NO. : 5,527,396
DATED : June 18, 1996
INVENTOR(S) : KEISHI SAITOH ET AL.

It is certified that error appears in the above-identified patent and that said Letters Patent is hereby corrected as shown below:

COLUMN 91

Table 19, "layer" (both occurrences) should read --layer (m Torr)-- and "is a relative value" should read --are relative values--.

Table 20, "is a relative value" should read --are relative values--.

COLUMN 93

Table 22, "$GeH_2$" should read --$GeH_4$--.
Table 23, "$GeH_2$" should read --$GeH_4$--.

COLUMN 95

Table 25, "is a relative value" should read --are relative values--.
Table 26, "is a relative value" should read --are relative values--.
Table 27, "is a relative value" should read --are relative values--.

UNITED STATES PATENT AND TRADEMARK OFFICE
CERTIFICATE OF CORRECTION

PATENT NO. : 5,527,396
DATED : June 18, 1996
INVENTOR(S) : KEISHI SAITOH ET AL.

It is certified that error appears in the above-identified patent and that said Letters Patent is hereby corrected as shown below:

COLUMN 97

Table 28, "type layer" should read --type layer--.
                layer

Table 30,
"i-type layer    $SiH_4$ 200    microwave    RF 350    3    350"
               $H_2$  500    200             $mW/cm^3$ should read
--i-type     $SiH_4$ 200    microwave    RF        3    350
   layer      $H_2$  500     200         350
                                      $mW/cm^3$ Interfacial   $SiH_4$ 3      RF           Not      1000    300--.
   layer        $H_2$ 100       7            applied

UNITED STATES PATENT AND TRADEMARK OFFICE
CERTIFICATE OF CORRECTION

PATENT NO. : 5,527,396
DATED : June 18, 1996
INVENTOR(S) : KEISHI SAITOH ET AL.

It is certified that error appears in the above-identified patent and that said Letters Patent is hereby corrected as shown below:

<u>COLUMN 99</u>

Table 32, "Second          $SiH_4$ 0.5"
         conductivity      $CH_4$ 0.05
         layer             $B_2H_6$ 0.01
                           $H_2$ 800 should read --Second       $SiH_4$ 0.5--.
             conductivity  $CH_4$ 0.05
             type layer    $B_2H_6$ 0.01
                           $H_2$ 800

Line 64, "comprising;" should read --comprising:--.

Signed and Sealed this

Fifteenth Day of September, 1998

Attest:

BRUCE LEHMAN

Attesting Officer          Commissioner of Patents and Trademarks